(12) United States Patent
Veerasamy

(10) Patent No.: US 9,593,019 B2
(45) Date of Patent: Mar. 14, 2017

(54) METHODS FOR LOW-TEMPERATURE GRAPHENE PRECIPITATION ONTO GLASS, AND ASSOCIATED ARTICLES/DEVICES

(71) Applicant: Guardian Industries Corp., Auburn Hills, MI (US)

(72) Inventor: Vijayen S. Veerasamy, Ann Arbor, MI (US)

(73) Assignee: Guardian Industries Corp., Auburn Hills, MI (US)

(*) Notice: Subject to any disclaimer, the term of this patent is extended or adjusted under 35 U.S.C. 154(b) by 270 days.

(21) Appl. No.: 14/145,626

(22) Filed: Dec. 31, 2013

(65) Prior Publication Data

US 2014/0261998 A1    Sep. 18, 2014

Related U.S. Application Data

(60) Provisional application No. 61/801,742, filed on Mar. 15, 2013.

(51) Int. Cl.
*B29C 65/02* (2006.01)
*B32B 37/28* (2006.01)
(Continued)

(52) U.S. Cl.
CPC .......... *C01B 31/0453* (2013.01); *B82Y 30/00* (2013.01); *B82Y 40/00* (2013.01);
(Continued)

(58) Field of Classification Search
USPC ........................ 156/247, 701, 714
See application file for complete search history.

(56) References Cited

U.S. PATENT DOCUMENTS 5,227,038 A    7/1993    Smalley et al.
5,300,203 A    4/1994    Smalley
(Continued)

FOREIGN PATENT DOCUMENTS

CA    2283502    9/1998
CN    102549202 A    7/2012
(Continued)

OTHER PUBLICATIONS

Zhang et al., "Fabrication and Characterization of Few-Layer Graphene"; Carbon 48 (2010) pp. 359-364, vol. 48, No. 2, Feb. 1, 2010.
(Continued)

*Primary Examiner* — Sing P Chan
(74) *Attorney, Agent, or Firm* — Nixon & Vanderhye P.C.

(57) ABSTRACT

Certain example embodiments relate to methods for large area graphene precipitation onto glass, and associated articles/devices. For example, coated articles including graphene-inclusive films on substrates, and/or methods of making the same, are provided. A metal-inclusive catalyst layer (e.g., of or including Ni and/or the like) is disposed on the substrate. The substrate with the catalyst layer thereon is exposed to a precursor gas and a strain-inducing gas at a temperature of no more than 350-600 degrees C. for 10s or 100s of minutes. Graphene is formed and/or allowed to form both over and contacting the catalyst layer, and between the substrate and the catalyst layer, in making the coated article. The catalyst layer, together with graphene formed thereon, is removed, e.g., through excessive strain introduced into the catalyst layer as associated with the graphene formation. Products including such articles, and/or methods of making the same, also are contemplated.

31 Claims, 23 Drawing Sheets

(51) Int. Cl.
*B32B 38/10* (2006.01)
*B32B 43/00* (2006.01)
*C01B 31/04* (2006.01)
*H01B 13/00* (2006.01)
*B82Y 30/00* (2011.01)
*B82Y 40/00* (2011.01)
*C23C 16/02* (2006.01)
*C23C 16/26* (2006.01)
*C23C 26/00* (2006.01)

(52) U.S. Cl.
CPC .......... *C23C 16/0281* (2013.01); *C23C 16/26* (2013.01); *C23C 26/00* (2013.01); *H01B 13/0026* (2013.01); *Y10T 29/49002* (2015.01); *Y10T 156/10* (2015.01)

(56) References Cited

U.S. PATENT DOCUMENTS

| | | |
|---|---|---|
| 5,556,517 A | 9/1996 | Smalley |
| 5,591,312 A | 1/1997 | Smalley |
| 5,650,597 A | 7/1997 | Redmayne |
| 5,739,376 A | 4/1998 | Bingel |
| 6,123,824 A | 9/2000 | Sano et al. |
| 6,129,901 A | 10/2000 | Moskovits et al. |
| 6,162,926 A | 12/2000 | Murphy et al. |
| 6,177,918 B1 | 1/2001 | Colgan et al. |
| 6,183,714 B1 | 2/2001 | Smalley et al. |
| 6,204,897 B1 | 3/2001 | Colgan et al. |
| 6,288,325 B1 | 9/2001 | Jansen et al. |
| 6,399,785 B1 | 6/2002 | Murphy et al. |
| 6,448,412 B1 | 9/2002 | Murphy et al. |
| 6,538,153 B1 | 3/2003 | Hirsch et al. |
| 6,602,371 B2 | 8/2003 | Veerasamy |
| 6,613,603 B1 | 9/2003 | Sano |
| 6,645,455 B2 | 11/2003 | Margrave et al. |
| RE38,358 E | 12/2003 | Petrmichl |
| 6,683,783 B1 | 1/2004 | Smalley et al. |
| 6,692,717 B1 | 2/2004 | Smalley et al. |
| 6,749,827 B2 | 6/2004 | Smalley et al. |
| 6,752,977 B2 | 6/2004 | Smalley et al. |
| 6,756,025 B2 | 6/2004 | Colbert et al. |
| 6,756,026 B2 | 6/2004 | Colbert et al. |
| 6,761,870 B1 | 7/2004 | Smalley et al. |
| 6,784,361 B2 | 8/2004 | Carlson et al. |
| 6,790,425 B1 | 9/2004 | Smalley et al. |
| 6,808,606 B2 | 10/2004 | Thomsen et al. |
| 6,824,755 B2 | 11/2004 | Colbert et al. |
| 6,827,918 B2 | 12/2004 | Margrave et al. |
| 6,835,366 B1 | 12/2004 | Margrave et al. |
| 6,841,139 B2 | 1/2005 | Margrave et al. |
| 6,852,410 B2 | 2/2005 | Veedu et al. |
| 6,863,942 B2 | 3/2005 | Ren et al. |
| 6,875,412 B2 | 4/2005 | Margrave et al. |
| 6,890,506 B1 | 5/2005 | Harutyunyan et al. |
| 6,899,945 B2 | 5/2005 | Smalley et al. |
| 6,900,264 B2 | 5/2005 | Kumar et al. |
| 6,913,789 B2 | 7/2005 | Smalley et al. |
| 6,936,233 B2 | 8/2005 | Smalley et al. |
| 6,936,653 B2 | 8/2005 | McElrath et al. |
| 6,939,525 B2 | 9/2005 | Colbert et al. |
| 6,949,237 B2 | 9/2005 | Smalley et al. |
| 6,969,504 B2 | 11/2005 | Smalley et al. |
| 6,979,709 B2 | 12/2005 | Smalley et al. |
| 6,986,876 B2 | 1/2006 | Smalley et al. |
| 7,008,563 B2 | 3/2006 | Smalley et al. |
| 7,008,604 B2 | 3/2006 | Smalley et al. |
| 7,014,737 B2 | 3/2006 | Harutyunyan et al. |
| 7,029,646 B2 | 4/2006 | Margrave et al. |
| 7,041,620 B2 | 5/2006 | Smalley et al. |
| 7,048,903 B2 | 5/2006 | Colbert et al. |
| 7,048,999 B2 | 5/2006 | Smalley et al. |
| 7,052,666 B2 | 5/2006 | Colbert et al. |
| 7,052,668 B2 | 5/2006 | Smalley et al. |
| 7,061,749 B2 | 6/2006 | Liu et al. |
| 7,067,098 B2 | 6/2006 | Colbert et al. |
| 7,070,754 B2 | 7/2006 | Smalley et al. |
| 7,070,810 B2 | 7/2006 | Hirsch et al. |
| 7,071,406 B2 | 7/2006 | Smalley et al. |
| 7,074,310 B2 | 7/2006 | Smalley et al. |
| 7,087,207 B2 | 8/2006 | Smalley et al. |
| 7,090,819 B2 | 8/2006 | Smalley et al. |
| 7,097,820 B2 | 8/2006 | Colbert et al. |
| 7,105,596 B2 | 9/2006 | Smalley et al. |
| 7,108,841 B2 | 9/2006 | Smalley et al. |
| 7,109,581 B2 | 9/2006 | Dangelo et al. |
| 7,115,864 B2 | 10/2006 | Colbert et al. |
| 7,125,502 B2 | 10/2006 | Smalley et al. |
| 7,125,534 B1 | 10/2006 | Smalley et al. |
| 7,135,160 B2 | 11/2006 | Yang et al. |
| 7,138,100 B2 | 11/2006 | Smalley et al. |
| 7,150,864 B1 | 12/2006 | Smalley et al. |
| 7,163,956 B2 | 1/2007 | Wilson et al. |
| 7,192,642 B2 | 3/2007 | Veedu et al. |
| 7,195,780 B2 | 3/2007 | Dennis et al. |
| 7,201,887 B2 | 4/2007 | Smalley et al. |
| 7,204,970 B2 | 4/2007 | Smalley et al. |
| 7,205,069 B2 | 4/2007 | Smalley et al. |
| 7,211,795 B2 | 5/2007 | Collier et |
| 7,215,331 B2 | 5/2007 | Song et al. |
| 7,220,818 B2 | 5/2007 | Stoddart et al. |
| 7,250,148 B2 | 7/2007 | Yang et al. |
| 7,264,876 B2 | 9/2007 | Smalley et al. |
| 7,265,174 B2 | 9/2007 | Carroll et al. |
| 7,273,095 B2 | 9/2007 | Li et al. |
| 7,279,916 B2 | 10/2007 | Suhir |
| 7,338,648 B2 | 3/2008 | Harutyunyan et al. |
| 7,338,915 B1 | 3/2008 | Smalley et al. |
| 7,354,563 B2 | 4/2008 | Smalley et al. |
| 7,357,906 B2 | 4/2008 | Colbert et al. |
| 7,372,510 B2 | 5/2008 | Abileah |
| 7,390,477 B2 | 6/2008 | Smalley et al. |
| 7,390,767 B2 | 6/2008 | Smalley et al. |
| 7,436,393 B2 | 10/2008 | Hong et al. |
| 8,236,118 B2 | 8/2012 | Veerasamy |
| 8,501,531 B2 * | 8/2013 | Kub .................... C01B 31/0446 257/E21.295 |
| 8,507,797 B2 | 8/2013 | Veerasamy |
| 8,637,118 B2 * | 1/2014 | Zenasni ................ B82Y 30/00 427/249.1 |
| 8,647,918 B2 * | 2/2014 | Kub .................... C01B 31/0446 257/E21.295 |
| 8,685,843 B2 * | 4/2014 | Li ....................... H01L 21/0242 257/24 |
| 8,884,310 B2 * | 11/2014 | Seacrist ................ H01L 21/283 257/643 |
| 9,029,228 B2 * | 5/2015 | Seacrist ............ H01L 21/02458 257/643 |
| 2006/0258054 A1 | 11/2006 | Pan et al. |
| 2008/0169021 A1 | 7/2008 | Krasnov |
| 2008/0199702 A1 | 8/2008 | Murphy et al. |
| 2008/0308147 A1 | 12/2008 | Lu et al. |
| 2009/0020157 A1 | 1/2009 | Krasnov et al. |
| 2009/0032098 A1 | 2/2009 | Lu |
| 2009/0110627 A1 * | 4/2009 | Choi .................... B82Y 30/00 423/447.1 |
| 2009/0123654 A1 | 5/2009 | Petrmichl et al. |
| 2009/0155561 A1 | 6/2009 | Choi et al. |
| 2009/0183816 A1 | 7/2009 | Min et al. |
| 2009/0305055 A1 | 12/2009 | Shimizu |
| 2010/0127312 A1 * | 5/2010 | Grebel ................ H01L 21/0237 257/288 |
| 2011/0033688 A1 | 2/2011 | Veerasamy |
| 2011/0070146 A1 | 3/2011 | Song et al. |
| 2011/0198313 A1 | 8/2011 | Baraton et al. |
| 2011/0265918 A1 | 11/2011 | Fujita et al. |
| 2012/0258587 A1 * | 10/2012 | Kub .................... C01B 31/0446 438/610 |
| 2013/0001515 A1 * | 1/2013 | Li ....................... H01L 21/0242 257/24 |
| 2013/0099195 A1 * | 4/2013 | Seacrist ................ H01L 21/283 257/9 |

(56) References Cited

U.S. PATENT DOCUMENTS

| | | | | |
|---|---|---|---|---|
| 2013/0186860 | A1* | 7/2013 | Kub | C01B 31/0446 |
| | | | | 216/81 |
| 2013/0189444 | A1* | 7/2013 | Kub | C01B 31/0446 |
| | | | | 427/523 |
| 2013/0240830 | A1* | 9/2013 | Seacrist | H01L 21/02458 |
| | | | | 257/9 |
| 2014/0120270 | A1* | 5/2014 | Tour | C23C 16/26 |
| | | | | 427/596 |
| 2014/0261998 | A1* | 9/2014 | Veerasamy | B82Y 30/00 |
| | | | | 156/247 |
| 2014/0308523 | A1* | 10/2014 | Veerasamy | B82Y 30/00 |
| | | | | 428/408 |
| 2015/0121837 | A1* | 5/2015 | Kinloch | C23C 16/26 |
| | | | | 59/88 |
| 2015/0144881 | A1* | 5/2015 | Seacrist | H01L 21/02458 |
| | | | | 257/26 |
| 2015/0337458 | A1* | 11/2015 | Duan | C30B 25/186 |
| | | | | 428/220 |

FOREIGN PATENT DOCUMENTS

| | | |
|---|---|---|
| EP | 0 237 662 | 9/1987 |
| EP | 0854839 | 7/1998 |
| EP | 1015384 | 7/2000 |
| EP | 1115655 | 7/2001 |
| EP | 1404908 | 4/2004 |
| EP | 1623437 | 2/2006 |
| EP | 2 281 779 | 2/2011 |
| EP | 2 327 662 | 6/2011 |
| EP | 2 682 366 | 1/2014 |
| JP | 10-178195 | 6/1998 |
| JP | 2001-520615 | 10/2001 |
| JP | 2005-520021 | 7/2005 |
| JP | 2006-272491 | 10/2006 |
| JP | 2008-205272 | 9/2008 |
| JP | 2009-038064 | 2/2009 |
| JP | 2009-107921 | 5/2009 |
| JP | 2009-143799 | 7/2009 |
| KR | 1020010080933 | 8/2001 |
| KR | 10-2009-0065206 | 6/2009 |
| WO | WO 97/09272 | 3/1997 |
| WO | WO 98/39250 | 9/1998 |
| WO | WO 00/17102 | 3/2000 |
| WO | WO 03/004741 | 1/2003 |
| WO | WO 03/078317 | 9/2003 |
| WO | WO 2004/097853 | 11/2004 |
| WO | WO 2005/084172 | 9/2005 |
| WO | WO 2008/128726 | 10/2008 |
| WO | WO 2009/049375 | 4/2009 |
| WO | WO 2009/085224 | 7/2009 |
| WO | WO 2013/113706 | 8/2013 |

OTHER PUBLICATIONS

Zhang, Y., et al., "Review of Chemical Vapor Deposition of Graphene and Related Applications," Acc. Cem. Res. 46, pp. 2329-2339, (2013) (11 pp.).

Kang, J., et al., "Graphene Transfer: Key for Applications," Nanoscale 4, pp. 5527-5537, (2012) (11 pp.).

Regan, W., et al., "A Direct Transfer of Layer-Area Graphene," Appl. Phys. Lett. 96, 113102, (2010).

Pirkle, A., et al., "The Effect of Chemical Residues on the Physical and Electrical Properties of Chemical Vapor Deposited Graphene Transferred to $SiO_2$," Appl. Phys. Lett. 99, 122108 (2011) (3 pp.).

Bae, S., et al., "Roll-to-Roll Production of 30 Inch Graphene Films for Transparent Electrodes," Nat. Nanotechnol, 5, pp. 574-578, (2010) (5 pp.).

Allen, M. J., et al., "Soft Transfer Printing of Chemically Converted Graphene," Adv. Mater, 21, pp. 2098-2102, (2009) (5 pp.).

Suk, J.W., et al., "Transfer of CVD-Grown Monolayer Graphene onto Arbitrary Substrates," ACS Nano 5, pp. 6916-6924, (2011) (9 pp.).

Li, X.S., et al., Transfer of Large-Area Graphene Films for High-Performance Transparent Conductive Electrodes, Nano Lett. 9, pp. 4359-4363, (2009), (5 pp.).

Kim, C., et al., "Direct Transfer to Graphene without the Removal of a Metal Substrate Using a Liquid Polymer," Scripta Mater 66, pp. 535-537, (2012) (3 pp.).

Ko, P.J., et al., "Simple Method to Transfer Graphene from Metallic Catalytic Substrates to Flexible Surfaces without Chemical Etching," J. Phys. Conf. Ser. 433, 012002, (2013) (9 pp.).

Kim, J., et al., "Layer-Resolved Graphene Transfer Via Engineered Strain Layers," Science 342, pp. 833-836, (2013) (4 pp.).

Wang, D., et al., "Scalable and Direct Growth of Graphene Micro Ribbons on Dielectric Substrates," Sci. Rep. 3, pp. 1348 (2013) (1 pp.).

Ismach, A., et al., "Direct Chemical Vapor Deposition of Graphene on Dielectric Surfaces," Nano Lett. 10, pp. 1542-1548, (2010) (7 pp.).

Van Laake, L., et al., "Suspended Heated Silicon Platform for Rapid Thermal Control of Surface Reactions with Application to Carbon Nanotube Synthesis," Rev. Sci. Instrum. 78, 083901, (2007) (9 pp.).

Robinson, J.A., et al., "Correlating Raman Spectral Signatures with Carrier Mobility in Epitaxial Graphene: A Guide to Achieving High Mobility on the Wafer Scale," Nano Lett. 9, pp. 2873-2876, (2009) (4 pp.).

Rao, R., et al., "Effects of Layer Stacking on the Combination Raman Modes in Graphene," ACS Nano 5, pp. 1594-1599, (2011) (6 pp.).

Li, D.F., et al., "Thickness and Stacking Geometry Effects on High Frequency Overtone and Combination Raman Modes of Graphene," J. Raman Spectrosc. 44, pp. 86-91, (2013) (6 pp.).

Cong, C.X., et al., "Second-Order Overtone and Combination Raman Modes of Graphene Layers in the Range of 1690-2150 $cm^1$," ACS Nano 5, pp. 1600-1605 (2011) (6 pp.).

Mohiuddin, T.M.G., et al., "Uniaxial Strain in Graphene by Raman Spectroscopy: G Peak Splitting, Grüneisen Parameters, and Sample Orientation," Phys. Rev. B 79, 205433, (2009) (8 pp.).

Yang, R., et al., Observation of Raman G-Peak Split for Graphene Nanoribbons with Hydrogen-Terminated Zigzag Edges, Nano Left. 11, 4083-4088, (2011) (6 pp.).

Cardid, J.M., et al., "Effects of Particle Contamination and Substrate Interaction on the Raman Response of Unintentionally Doped Graphene," J. Appl. Phys. 108, 205433, (2010) (6 pp.).

Baskes, M.I., et al., "Trapping of Hydrogen and Helium at Grain-Boundaries in Nickel—an Atomistic Study," Metall. Trans. A 16, pp. 1625-1631, (1985) (7 pp.).

Trinkaus, H., "On the Modeling of the High-Temperature Embrittlement of Metals Contaning Helium," J. Nucl. Mater. 118, pp. 39-49, (1983) (11 pp.).

Freund, L.B., et al., "Thin Film Material: Stress, Defect Formation, and Surface Evolution," (Cambridge University Press, Cambridge, England; New York; 2003) (820 pp.).

Thompson, C. V., et al. "Stress and Grain Growth in Thin Films," J. Mech. Phys. Solids 44, 657-673 (1996).

Schroeder, H., et al., "Helium and Hydrogen Effects on the Embrittlement of Iron- and Nickel-Based Alloys," J. Nucl. Mater. 179-181, Part 1, 118-124 (1991) (7 pp.).

Ishizaki, T., et al., "The Effect of Hydrogen and Helium on Microvoid Formation in Iron and Nickel," J. Nucl. Mater. 307-311, Part 2, 961-965 (2002) (5 pp.).

Stamm, U., et al., "The Influence of Helium on the High Temperature Mechanical Properties of DIN 1.4914 Martensitic Steel," J. Nucl. Mater. 155-157, Part 2, 1059-1063 (1988) (5 pp.).

Bechtle, S., et al., "Grainboundary Engineering Markedly Reduces Susceptibility to Intergranular Hydrogen Embrittlement in Metallic Materials," Acta Mater. 57, 4148-4157 (2009) (10 pp.).

Mittendorfer, F. et al., "Graphene on Ni(111): Strong Interaction and Weak Adsorption," Phys. Rev. B 84, 201401 (2011) (4 pp.).

Vanin, M. et al, "Graphene on Metals: A Van Der Waals Density Functional Study," Phys. Rev. B 81, 081408 (2010) (4 pp.).

Zhiping, X., et al., "Interface Structure and Mechanics Between Graphene and Metal Substrates: A First-Principles Study," J. Phys.: Condens. Matter 22, 485301 (2010) (6 pp.).

(56) References Cited

OTHER PUBLICATIONS

Myers, A. K., et al., "Comparison of Benzene Adsorption on Nickel(111) and Nickel(100)," J. Phys. Chem. 91, 2230-2232 (1987) (3 pp.).
Jarvis, E. A. A., et al., "Exploiting Covalency to Enhance Metal-Oxide and Oxide-Oxide Adhesion at Heterogeneous Interfaces," J. Am. Ceram. Soc. 86, pp. 373-386 (2003) (14 pp.).
Nguyen, T. C., et al., "Semiconducting Electronic Property of Graphene Adsorbed on (0001) Surfaces of SiO2," Phys. Rev. Lett. 106, 106801 (2011) (4 pp.).
Koenig, S. P., et al., "Ultrastrong Adhesion of Graphene Membranes," Nat. Nanotechnol. 6, pp. 543-546 (2011) (4 pp.).
Zacharia, R., et al., "Interlayer Cohesive Energy of Graphite from Thermal Desorption of Polyaromatic Hydrocarbons," Phys. Rev. B 69, 155406, (2004) (7 pp.).
Rydberg, H. et al., "Van Der Waals Density Functional for Layered Structures," Phys. Rev. Left. 91, 126402, (2003) (4 pp.).
Lu, N. S., et al., "Failure by Simultaneous Grain Growth, Strain Localization, and Interface Debonding in Metal Films on Polymer Substrates," J. Mater. Res. 24, 379-385, (2009) (7 pp.).
Hutchinson, J.W., et al., "Mixed Mode Cracking in Layered Materials," Adv. Appl. Mech. 29, 191 (1992) (1 pp.).
Nessim, G. D. et al., "Synthesis of Tall Carpets of Vertically Aligned Carbon Nanotubes by In Situ Generation of Water Vapor Through Preheating of Added Oxygen," Carbon 50, 4002-4009, (2012) (8 pp.).
McNerny, D.Q., et al., "Direct Fabrication of Graphene on $SiO_2$ Enabled by Thin Film Stress Engineering," Scientific Reports, May 2014 (9 pp.).
Veerasamy et al., "Nitrogen Doping of Highly Tetrahedral Amorphous Carbon," Physical Review B, vol. 48, No. 24, Dec. 1993, pp. 17 954-17 959.
Veerasamy et al., "N-Type Doping of Highly Tetrahedral Diamond-Like Amorphous Carbon," Journal of Physical Condensation Matter, No. 5, 1993, pp. L169-L174.
Veerasamy et al., "Properties of n-Type Tetrahedral Amorphous Carbon (ta-C)/p-Type Crystalline Silicon Heterojunction Diodes," IEEE Transaction on Electron Devices, vol. 42, No. 4, Apr. 1995, pp. 577-585.
Novoselov, K.S., "Electrical Field Effect in Atomically Thin Carbon Films," Science, vol. 306, (2004), pp. 666-669.
U.S. Appl. No. 12/285,374, Krasnov et al., filed Nov. 18, 2008.
U.S. Appl. No. 12/285,890, Thomsen et al., filed Oct. 15, 2008.
U.S. Appl. No. 12/457,006, Broadway et al., filed May 28, 2009.
U.S. Appl. No. 11/049,292, Thomsen et al., filed Feb. 3, 2005.
U.S. Appl. No. 11/122,218, Thomsen et al., filed May 5, 2005.
U.S. Appl. No. 12/292,406, Krasnov, filed Nov. 18, 2008.
Obraztsiv et al., "Chemical Vapor Deposition of Thin Graphite Films of Nanometer Thickness," Carbon, vol. 45, 2007, pp. 2017-2021.
Erik Jonas Järvholm, "Mechanisms and Development of Etch Resistance for Highly Aromatic Monomolecular Etch Masks—Towards Molecular Lithography," Ph.D. Dissertation at the Georgia Institute of Technology, May 2007.
Lileta Gherghel et al., "Pyrolysis in the Mesophase: A Chemist's Approach toward Preparing Carbon Nano- and Microparticles," J. Am. Chem. Soc., vol. 124, pp. 13130-13138, Mar. 2002.
Yanyu Liang et al., "Transparent, Highly Conductive Graphene Electrodes from Acetylene-Assisted Thermolysis of Graphite Oxide Sheets and Nanograph Molecules," Nanotechnology, vol. 20: 434007, Received May 2009, Published Oct. 2009.
"The Role of Hydrogen in the Growth of Amorphous Hydrogenated Carbon", Revelle et al., Solid State Communications, vol. 86, No. 4, pp. 235-237.
"Graphane: A Two-Dimensional Hydrocarbon", Sofo et al., 2007 The American Physical Society, pp. 153401-1/153401-4.
"Control of Graphene's Properties by Reversible Hydrogenation: Evidence of Graphane", Elias et al., Science, vol. 323, Jan. 30, 2009, pp. 610-613 and Supplementary Online Material, pp. 1-S/12-S.

"Large Area, Few-Layer Graphene Films on Arbitrary Substrates by Chemical Vapor Deposition", Reina et al., 2009 American Chemical Society, Nano Letters 2009, vol. 9, No. 1, pp. 30-35.
"Large-Scale Pattern Growth of Graphene Films for Stretchable Transparent Electrodes", Kim et al., Nature Publishing Group, vol. 457, No. 7230, pp. 706-710.
"Large-Area Synthesis of High-Quality and Uniform Graphene Films on Copper Foils", Li et al., Science American Assoc. for the Advancement of Science, USA, vol. 324, No. 5932, pp. 1312-1314.
"Transferring and Identification of Single- and Few-Layer Graphene on Arbitrary Substrates", Reina et al., Journal of Physical Chemistry Part C: Nanomaterials and Interfaces, American Chemical Society, vol. 112, No. 46, pp. 17741-17744.
"Graphene Segregated on Ni Surfaces and Transferred to Insulators", Yu et al., Applied Physics Letters, American Institute of Physics, vol. 93, No. 11, pp. 113103-1-113103-3.
"Optimizing the Growth Conditions of Large-Scale Graphene Films", XP-002604905, www.nature.com/nature.
"Synthesis of Large-Area Graphene Layers on Poly-Nickel Substrate by Chemical Vapor Deposition: Wrinkle Formation", Chae et al., Advanced Materials, Wiley VCH Velag; vol. 21, No. 22, Jun. 12, 2009, pp. 2328-2333.
"Synthesis of Graphene on Silicon Carbide Substrates at Low Temperature", Juang et al., Carbon 47 (2009) pp. 2026-2031.
"Transparent and Flexible Carbon Nanotube/Polyaniline pH Sensors", Kaempgen et al., Journal of Electroanalytical Chemistry 586 (2006), pp. 72-76.
"High-Conductivity Polymer Nanocomposites Obtained by Tailoring the Characteristics of Carbon Nanotube Fillers", Grossiord et al., Advanced Functional Materials (2008), pp. 3226-3234.
Manuscript "Detection of Rain Using Capacitive Field Imaging", Veerasamy, Guardian Industries Corp., pp. 1-18.
"Applications of Carbon Nanotubes in the Twenty-First Century", Endo et al., The Royal Society (2004), pp. 2223-2238.
"How do Carbon Nanotubes Fit into the Semiconductor Roadmap", Graham et al., Applied Physics A (2005), pp. 1141-1151.
"A Method of Printing Carbon Nanotube Thin Films", Zhou et al., 2006 American Institute of Physics.
"Carbon Nanotube Films for Transparent and Plastic Electronics", Gruner, Journal of Materials Chemistry (2006), pp. 3533-3539.
"Transparent Carbon Films as Electrodes in Organic Solar Cells", Wang et al., Angew. Chem. Inst. Ed. Apr. 7, 2008, vol. 47, pp. 2990-2992.
Rondelez et al., "Two Dimensional Films of Discotic Molecules at an Air-Water Interface," J. Physique 43 (1982) pp. 1371-1377.
Rondelez et al., "Liquid Expanded-Liquid Condensed Phase Transition in Langmuir Films of Discotic Molecules," J. Physique 48 (1987) pp. 1225-1234.
J. Billard et al., "Miscibility Studies of Disc-Like Molecules," Pramana 13 (1979) pp. 309-318.
U.S. Appl. No. 12/461,346, Veerasamy, filed Aug. 7, 2009.
U.S. Appl. No. 12/654,269, Veerasamy, filed Dec. 15, 2009.
D. McNerny, et al., "In Situ Stress-Driven Transfer of CVD Grown Graphene from Ni Film to $SiO_2$/Si Substrate".
Z. Yan, et al., "Growth of Bilayer Graphene on Insulating Substrates," www.acsnano.org
Z. Peng, et al., "Direct Growth of Bilayer Graphene on $SiO_2$ Substrates by Carbon Diffusion through Nickel," vol. 5, No. 10, pp. 8241-8247, 2011 www.acsnano.org.
J. Kwak, et al., "Near Room-Temperatures Synthesis of Transfer-Free Graphene Films," Nature Communications, Jan. 24, 2012.
Oya, et al., Review Phenomena of Catalytic Graphitization, Journal of Materials Science 1982; 17: 309-322.
Definition of on, accessed online at < http://www.merriam-webster.com/dictionary/on> on Apr. 19, 2013.
Definition of determine, accessed online at < http://www.merriam-webster.com/dictionary/determining> on Apr. 20, 2013.
From Graphene to Graphane, Now the Possibilities are Endless, accessed online at < http://www.sciencedaily.com/releases/2009/07/090731090011.htm> on Apr. 21, 2013 pp. 1-4.
Fitzer et al., Recommended Terminology for the Description of Carbon as a Solid, Pure & Appl. Chem. 1995; 67(3): 473-506.

(56) References Cited

OTHER PUBLICATIONS

D.Q. McNerny et al., "Direct fabrication of graphene on SiO2 enabled by thin film stress engineering", Scientific Reports vol. 4, No. 5049m pp. 1-9 (2014).

Y.B. Zhang, Y.W. Tan, H.L. Stormer, and P. Kim, "Experimental observation of the quantum hall effect and Berry's phase in graphene", Nature, vol. 438, No. 7065, pp. 201-204 (2005).

T. Ohta, A. Bostwick, T. Seyller, K. Horn, and E. Rotenberg, "Controlling the electronic structure of bilayer graphene", Science, vol. 313, No. 5789, pp. 951-954 (2006).

H. Ueta, M. Saida, C. Nakai, Y. Yamada, M. Sasaki, and S. Yamamoto, "Highly oriented monolayer graphite formation on Pt(1 1 1) by a supersonic methane beam", Surf. Sci., vol. 560, pp. 183-190 (2004).

N. Gall', E. Rut'kov, and A. Tontegode, "Interaction of silver atoms with iridium and with a two-dimensional graphite film on iridium: Adsorption, desorption, and dissolution", Phys. Solid State, vol. 46, No. 2, pp. 371-377 (2004).

G. Kalita et al., "Low temperature growth of graphene film by microwave assisted surface wave plasma CVD for transparent electrode application", RSC Adv., vol. 2, pp. 2815-2820 (2012).

T. Yamada, M. Ishihara, and M. Hasegawa, "Large area coating of graphene at low temperature using a roll-to-roll microwave plasma chemical vapor deposition", Thin Solid Films vol. 532, pp. 89-93 (2013).

D.Y. Usachov et al., "Graphene Morphology on Ni Single-Crystal Surfaces: Experimental and Theoretical Investigation", Bulletin of the Russian Academy of Science: Physics 2009, May 2009, vol. 73, No. 5, pp. 679-682.

Abstract of K. Reichelt, "Heteroepitaxial Growth of High-Vacuum Evaporated Nickel Films", Journal of Crystal Growth, Nov. 1971, 11(2), 1 page.

Kim et al., Nature 2009, 457, 706-709, Supplemental Information, 11 pages.

Jhung et al., KR 904218 B1, Jun. 2009, English Abstract, 3 pages.

Excerpt from KR 904218 B1, Jun. 2009, Figure, 1 page.

"Large and Flat Graphene Flakes Produced by Epoxy Bonding and Reverse Exfoliation of Highly Oriented Pyrolytic Graphite", Huc et al., IOP Publishing, Nanotechnology 19 (2008), pp. 1-6.

Chen et al. "Oxidation Resistance of Graphene-Coated Cu and Cu/Ni Alloy", ACS Nano 2011, 5(2), 1321-1327.

\* cited by examiner

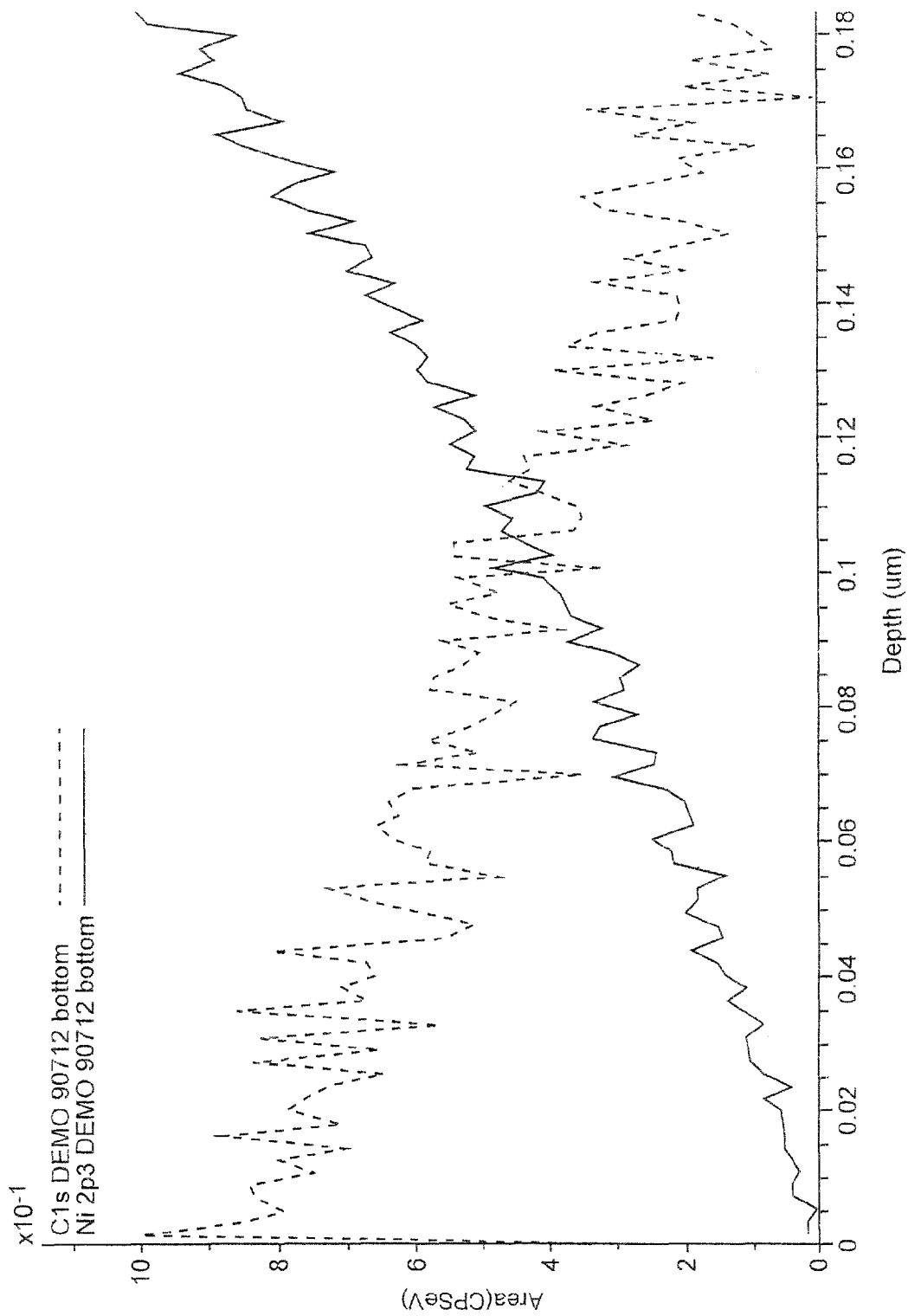

METHODS FOR LOW-TEMPERATURE GRAPHENE PRECIPITATION ONTO GLASS, AND ASSOCIATED ARTICLES/DEVICES

This application claims the benefit of U.S. Application Ser. No. 61/801,742, filed Mar. 15, 2013, the entire contents of which are hereby incorporated by reference herein.

This application incorporates by reference the entire contents of each of U.S. application Ser. No. 12/461,346, filed Aug. 7, 2009, and U.S. application Ser. No. 12/654,269, filed Dec. 15, 2009.

Certain example embodiments of this invention relate to thin films comprising graphene. More particularly, certain example embodiments of this invention relate to methods for large area graphene precipitation onto glass, and associated articles/devices.

BACKGROUND AND SUMMARY OF EXAMPLE EMBODIMENTS OF THE INVENTION

Indium tin oxide (ITO) and fluorine-doped tin oxide (FTO or SnO:F) coatings are widely used as window electrodes in opto-electronic devices. These transparent conductive oxides (TCOs) have been immensely successful in a variety of applications. Unfortunately, however, the use of ITO and FTO is becoming increasingly problematic for a number of reasons. Such problems include, for example, the fact that there is a limited amount of the element indium available on Earth, the instability of the TCOs in the presence of acids or bases, their susceptibility to ion diffusion from ion conducting layers, their limited transparency in the near infrared region (e.g., the power-rich spectrum that may benefit some photovoltaic devices), high leakage current of FTO devices caused by FTO structure defects, etc. The brittle nature of ITO and its high deposition and/or processing temperature(s) can also limit its applications. In addition, surface asperities in $SnO_2$:F may cause problematic arcing in some applications.

Thus, it will be appreciated that there is a need in the art for smooth and patternable electrode materials with good stability, high transparency, and excellent conductivity.

The search for novel electrode materials with good stability, high transparency, and excellent conductivity is ongoing. One aspect of this search involves identifying viable alternatives to such conventional TCOs. In this regard, the inventor of the instant invention has developed a viable transparent conductive coating (TCC) based on carbon and, more specifically, based on graphene.

The term graphene generally refers to one or more atomic layers of graphite, e.g., with a single graphene layer or SGL being extendible up to p-layers of graphite (e.g., where n can be as high as about 10, preferably about 5). Graphene's recent discovery and isolation (by cleaving crystalline graphite) at the University of Manchester comes at a time when the trend in electronics is to reduce the dimensions of the circuit elements to the nanometer scale. In this respect, graphene has unexpectedly led to a new world of unique opto-electronic properties, not encountered in standard electronic materials. This emerges from the linear dispersion relation (E vs. k), which gives rise to charge carriers in graphene having a zero rest mass and behaving like relativistic particles. The relativistic-like behavior of delocalized electrons moving around carbon atoms results from their interaction with the periodic potential of graphene's honeycomb lattice and gives rise to new quasi-particles that at low energies (E<1.2 eV) that are accurately described by the (2+1)-dimensional Dirac equation with an effective speed of light $v_F \approx c/300 = 10^6$ $ms^{-1}$. Therefore, the well established techniques of quantum electrodynamics (QED) (which deals with photons) can be brought to bear in the study of graphene—with a further advantageous aspect being that such effects are amplified in graphene by a factor of 300. For example, the universal coupling constant $\alpha$ is nearly 2 in graphene compared to 1/137 in vacuum. Moreover, it has been shown that graphene does not have any electronic band gap, which could open the door to novel opto-electronic applications.

Despite being only one-atom thick (at a minimum), graphene is chemically and thermally stable (although graphene may sometimes be surface-oxidized at 300 degrees C.), thereby allowing successfully fabricated graphene-based devices to withstand ambient and potentially harsh conditions. High quality graphene sheets were first made by micro-mechanical cleavage of bulk graphite. The same technique is being fine-tuned to currently provide high-quality graphene crystallites up to 100 $\mu m^2$ in size. This size is sufficient for most research purposes in the micro-electronics field. Consequently, most techniques developed so far, mainly at universities, have focused more on the microscopic sample, and similarly have focused generally on device preparation and characterization rather than scaling up.

Unlike many current research trends, to realize the full potential of graphene as a possible TCC, large-area deposition of high quality material on substrates (e.g., silicon, glass, or plastic substrates, including coated versions of the same) is essential. To date, chemical vapor deposition (CVD) is seen by some as being the most promising process for the industrially viable large area growth of graphene. The accepted mechanism involves three steps, namely: (i) dissociation of the carbon precursor at high temperature (e.g., greater than 850 degrees C.) onto a polycrystalline metallic catalyst; (ii) carbon dissolution into the catalyst sub-surface; and (iii) graphene precipitation at the surface of the catalyst as the sample cools down.

Unfortunately, however, these techniques involve several drawbacks. First, they involve very high temperatures (e.g., greater than 850 degrees C. and sometimes higher than 950 degrees C.), as graphene quality is generally poor at lower temperatures since an amorphous graphitic carbon phase is always present given that the duration of the process is at least 30 minutes. Second, these techniques currently involve chemical etching of the catalyst for lift-off and transfer of the graphene onto the intended substrate. This process usually creases as well as contaminates the graphene film and, in general, is not scalable. The polycrystalline nature of the thick Ni, as well as its finite surface roughness, produces non-contiguous graphene domains of varying thickness (e.g., varying integer values of single layer graphene). This non-isotropic growth can be problematic for successful transfer and the fabrication of field effect devices based on graphene. Another characteristic of the incumbent process is that the catalyst film is a blanket film. But lift-off of a patterned thin film oftentimes causes the graphene to float and twist, making the transfer impractical.

Thus, it will be appreciated that it would be desirable to provide improved graphene-forming techniques, in terms of both scale and quality.

Certain example embodiments relate to a thermal annealing alternative to the above-mentioned deposition process, whereby precipitation of pristine graphene takes place directly onto the glass substrate at lower temperatures via a thin Ni metal or Ni alloy catalyst film pre-coated onto the intended glass substrate. Although the technique works well with MSVD deposited Ni thin films, it was found that a thin layer of ultra-smooth a-Ni provides a yet higher quality graphene (based on Raman data to date). The amorphous layer of Ni with no grain boundaries advantageously allows the graphene to precipitate in a more isotropic manner. It also was found that c-Ni and other Ni morphologies where there are numerous grain boundaries helps in the formation of high quality graphene. And to date, the graphene has been found to be very uniform over several tens of microns in length and width.

As explained in greater detail below, asymmetric growth of carbon occurring on both the gas-exposed and supporting sides of the Ni film was studied by in situ Raman Spectroscopy and differential scanning calorimetry (DSC). It may in certain example embodiments be possible to further relate the process conditions to the graphene growth at both the supporting and gas-exposed sides of the catalyst interface. Concepts of surface thermodynamics show that one driving force for such a growth is the gradient in the concentration of dissolved carbon between the gas-exposed and supporting sides. This surprisingly and unexpectedly gives rise to carbon diffusion flux through the catalyst.

Certain example embodiments of this invention relate to a method of making a coated article including a graphene-inclusive film on a substrate. A metal-inclusive catalyst layer (e.g., of or including Ni and/or the like) is disposed on the substrate. The substrate with the metal-inclusive catalyst layer thereon is exposed to a precursor gas (e.g., of or including acetylene) and a strain-inducing gas (e.g., of or including He) at a temperature of no more than 900 degrees C. (preferably no more than 800 degrees C., and still more preferably no more than 700 degrees C.—and for example, from 700-900 degrees C.). The strain-inducing gas induces strain in the metal-inclusive catalyst layer. Graphene is formed and/or allowed to form both over and contacting the metal-inclusive catalyst layer, and between the substrate and the metal-inclusive catalyst layer, in making the coated article. The metal-inclusive catalyst layer, as well as with graphene formed thereon, is removed, e.g., through excessive strain introduced into the catalyst layer as associated with the graphene formation (e.g., from the He-inclusive gas environment).

Certain example embodiments of this invention relate to a method of making a coated article including a graphene-inclusive film on a substrate. A metal-inclusive catalyst layer is disposed on the substrate. The substrate with the metal-inclusive catalyst layer thereon is rapidly heated (e.g., preferably within 1 minute, more preferably within 30 seconds, and possibly within about 10 seconds) to 700-900 degrees C. The substrate with the metal-inclusive catalyst layer thereon is annealed in a He gas inclusive environment (e.g., preferably for no more than 10 minutes, more preferably for no more than 7 minutes, and possibly for about 5 minutes), and the He gas is provided at a pressure selected to engineer a desired stress in the metal-inclusive catalyst layer. The substrate with the catalyst layer thereon is exposed to a carbon-inclusive precursor gas (e.g., preferably for no more than 5 minutes, more preferably for no more than 3 minutes, and possibly for about 20 seconds to 2 minutes). Graphene is formed and/or allowed to form both over and contacting the metal-inclusive catalyst layer, and between the substrate and the metal-inclusive catalyst layer, in making the coated article. The He gas may induce strain in the metal-inclusive catalyst layer sufficient to cause at least partial separation between the substrate and the metal-inclusive catalyst layer during graphene formation, and/or the metal-inclusive catalyst layer and the graphene thereon may be delaminated through excessive strain provided by the He gas.

Certain example embodiments relate to a method of making a coated article comprising a graphene-inclusive film on a substrate is provided. A metal-inclusive catalyst layer is disposed on the substrate. The substrate with the metal-inclusive catalyst layer thereon is heated to 700-900 degrees C. The substrate with the catalyst layer thereon is exposed to a carbon-inclusive precursor gas. Graphene is formed and/or allowed to form both over and contacting the metal-inclusive catalyst layer, and between the substrate and the metal-inclusive catalyst layer. The metal-inclusive catalyst layer and the graphene on the metal-inclusive catalyst layer are mechanically delaminated from the substrate so that the graphene formed between the substrate and the metal-inclusive catalyst layer remains on the substrate following the mechanical delaminating, in making the coated article (e.g., using an adhesive such as tape or the like). The metal-inclusive catalyst layer is engineered to have a stress that facilitates the mechanical delaminating (e.g., using a gas such as He and/or the like, and/or through other means).

According to certain example embodiments, rapid heating may be performed such that growth temperatures of 800-900 degrees C. are reached at the surface of the Ni and/or the surface of the substrate within 10 seconds, although other temperature ranges (e.g., from above Tg and around 600-900 degrees C., for example) also are possible. The heating may be performed at atmospheric pressure, a pressure less than atmospheric (e.g., in the presence of inert gas—and possibly at 0.5-10 Torr, more preferably 1-5 Torr, and sometimes about 2 Torr), in some example instances. This annealing may be performed very quickly, e.g., such that carbon is supplied for less than 10 minutes, more preferably less than 5 minutes, and still more preferably from about 20 seconds to 2 minutes, in certain example embodiments. Cooling also may be rapid in some cases, e.g., with the substrate being cooled at a rate of 5-20 degrees C. per second, more preferably 10-15 degrees C. per second, and sometimes about 13 degrees C. per second.

According to certain example embodiments, the catalyst layer may comprise Ni metal, a-Ni, a-Ni:P, c-Ni, and/or the like.

According to certain example embodiments, the substrate with the catalyst layer thereon may be exposed to at least helium and/or acetylene gasses, in plural successive stages. For instance, a first stage may comprise providing at least helium gas at a first flow rate, and a second stage may comprise providing at least helium gas at a second flow rate and acetylene gas at a third flow rate, with the first and second stages being provided in that order. The first flow rate may be greater than the second and third flow rates, and the second flow rate may be lower than the third flow rate. No or virtually no acetylene may be provided in the first stage in some example instances. In an optional third stage that follows the second stage, no or virtually no helium and/or acetylene is provided. Although a statement is made that no or virtually no gas is provided in some cases, it will be appreciated that some gas(es) may be provided unintentionally, e.g., as a substrate moves through the successive stages, as a result of normal manufacturing processes. Oxygen preferably is not involved in this process. The temperature may be significantly reduced over the course of optional third stage in certain example embodiments.

According to certain example embodiments, the catalyst layer may be patterned to a desired pattern (e.g., via photolithography and masking with a photoresist or the like, laser ablation/etching, ion beam milling, and/or the like).

The graphene-inclusive film, once formed on the coated article may generally correspond to the desired pattern (e.g., by virtue of it being formed in connection with (i.e., on and/or under) the patterned catalyst layer). In other cases, the graphene-inclusive film may be blanket coated directly or indirectly on a substrate.

According to certain example embodiments, the metal-inclusive catalyst may have a smoothness that is at least as smooth of its underlying substrate. In some cases, the metal-inclusive catalyst may have a smoothness that is on the order of glass.

According to certain example embodiments, graphene may be formed directly or indirectly on a thin film layer such as, for example, a metal. In some instances, this arrangement may provide anticorrosion, mechanical durability, and/or the like.

It will be appreciated that certain example embodiments may use a lower-temperature annealing process to form the graphene. This may in some instances enable a broader spectrum of substrates (e.g., dielectric substrates such as glass substrates, plastics, etc.) to be used. In some cases, low-temperature embodiments may be annealed for a long period of time.

In certain example embodiments, a method of making a coated article comprising a graphene-inclusive film on a substrate is provided. A metal-inclusive catalyst layer is disposed on the substrate. The substrate with the metal-inclusive catalyst layer thereon is heated. The substrate with the catalyst layer thereon is exposed to a carbon-inclusive precursor gas. The substrate with the catalyst layer thereon is annealed at a temperature of 350-600 degrees C. for a time period of 10 minutes to 3 hours. Graphene is formed and/or allowed to form both over and contacting the metal-inclusive catalyst layer, and between the substrate and the metal-inclusive catalyst layer, in making the coated article.

In certain example embodiments, a method of making a coated article comprising a graphene-inclusive film on a substrate is provided. A metal-inclusive catalyst layer is disposed on the substrate, with the metal-inclusive catalyst layer being substantially metallic and comprising Ni. The substrate with the metal-inclusive catalyst layer thereon is heated. The substrate with the catalyst layer thereon is exposed to a carbon-inclusive precursor gas. The substrate with the catalyst layer thereon is annealed at a temperature of 350-600 degrees C. for a time period of 10s or 100s of minutes. Graphene is formed and/or allowed to form both over and contacting the metal-inclusive catalyst layer, and between the substrate and the metal-inclusive catalyst layer. The substrate with the graphene thereon is cooled and/or allowed to cool. After the substrate with the graphene thereon has cooled, (a) the metal-inclusive catalyst layer and the graphene formed thereon are separated from the underlying graphene and the substrate by inducing excess strain in the metal-inclusive catalyst layer, and/or (b) an adhesive-backed material is applied to the uppermost graphene.

In certain example embodiments, a method of making a coated article comprising a graphene-inclusive film on a substrate is provided. A metal-inclusive catalyst layer is disposed on the substrate. The substrate with the catalyst layer thereon is exposed to a carbon-inclusive precursor gas. The substrate with the catalyst layer thereon is annealed at a temperature of 350-600 degrees C. for a time period of 10s or 100s of minutes. Graphene is formed and/or allowed to form both over and contacting the catalyst layer, and between the substrate and the catalyst layer. The catalyst layer and the graphene on the catalyst layer are mechanically delaminated from the substrate, so that the graphene formed between the substrate and the catalyst layer remains on the substrate following the mechanical delaminating, in making the coated article. The catalyst layer is engineered to have a stress that facilitates the mechanical delaminating.

Articles made using these methods and products incorporating such articles also are contemplated herein. Windows, photovoltaic devices, displays, etc., are example applications that may benefit from the technology disclosed herein. In general, the techniques disclosed herein may be used anywhere a TCC would be desirable.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which:

FIGS. 8A-8B and 9A-9B are graphs plotting diffusion data, with FIGS. 8A-8B plotting % concentration vs. depth and FIGS. 9A-9B plotting area (cps eV) vs. depth;

DETAILED DESCRIPTION OF EXAMPLE EMBODIMENTS OF THE INVENTION

Figure 1:
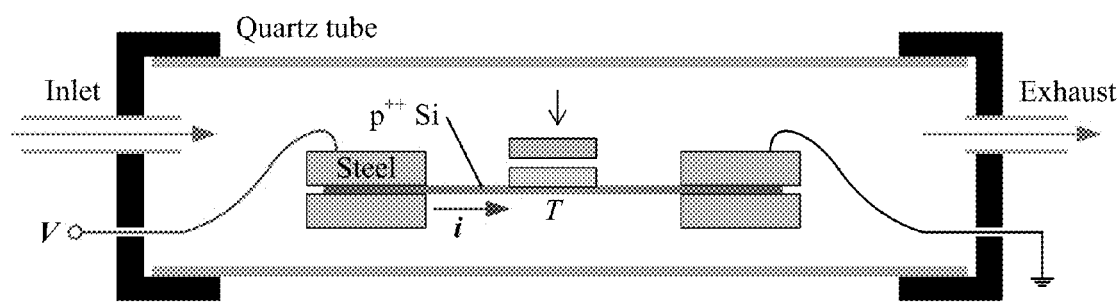
FIG. 1 is a schematic view of the set-up used to validate the discovery disclosed in the instant disclosure.

Certain example embodiments involve methods for large area graphene precipitation onto glass, and associated articles/devices. More particularly, certain example embodiments relate to the direct deposition of graphene at the smooth interface of a thin Ni-inclusive (e.g., Ni metal, a-Ni, a-Ni:P, c-Ni, nanocrystalline Ni, etc.) film and glass substrate via precipitation at temperatures below the glass transition temperature Tg. The sequence of gas phase-induced carbon dissolution at the gas side of the Ni followed by diffusion through the film bulk and subsequent equilibrium segregation at the carbon-over-saturated or carbon-super-saturated support-side of the nickel film has been studied by DSC, electron energy loss spectroscopy (EELS), in situ Raman spectroscopy, and x-ray photoelectron spectroscopy (XPS). Depending on the precursor gas flow rate, exposure time, and temperature, for example, at least three distinct equilibrium states occur at the Ni/glass interface, namely:

A: a high-temperature dilute solid-solution phase of carbon in nickel,

B: a condensed graphitic monolayer (MLG) and few layer (FLG) precipitate separated from A by a sharp transition with temperature, and C: a multilayer heteroepitaxial graphite precipitate.

The Gibbs free energy of graphene precipitation from a dilute Ni—C solid solution through the Ni crystals is found to be about −0.42 eV. This value is about 0.08 eV higher than that of graphite from the same solid solution. Therefore, state B persists in equilibrium about 100K above the observed equilibrium temperature for dissolving graphite into the nickel crystal. It is believed that this phenomenon can be attributed (within about 0.05 eV or so) to a lowering of entropy in the transition of A→B→C. The observed equilibrium A-B transition is believed to be the first equilibrium surface phase transition detected in segregation studies. Of course, it will appreciated that other pathways through the Ni bulk may exist. For instance, it has been discovered that the C may diffuse through the Ni at grain boundaries on its way to the substrate, requiring less energy and therefore allowing lower temperatures to be used in a potentially faster process, as the diffusion constant through the grain boundaries is lower.

The catalyst film is pre-stressed (compressively) by the exposure with He gas at about 1-10 mTorr (preferably). He atoms diffuse (substation as well as interstitial) into the Ni at the high temperatures of exposure and produce a swelling or strain of the thin catalyst film.

Based on the magnitude of the strain induced by carbon precipitation, graphene formation takes place outside the Ni host matrix and at the substrate interface. The strain energy goes to zero when graphene nuclei sheets are formed and its lattice detaches from the host Ni-matrix. Upon precipitation, the in-built net compressive stress in the Ni delaminates the catalyst film, and graphene adheres to the substrate. Patterning of the metallic thin film allows selective growth of graphene onto glass and Si, for example.

The example techniques set forth herein are contrastable with the current catalytic CVD growth, in that they occur at lower temperatures, with faster rates, and/or are diffusion-limited and, as such, takes place with a positive rate of rise of temperature instead of quenching. The onset of graphene formation is linked to the gas-side process conditions via a quasi-equilibrium constant (or zero-precipitation threshold), above which graphene forms at the interface. Within the context of a simple kinetics model based on a Langmuir isotherm, extracted from experimental data is both the activation energy of dissolution of carbon in nickel, as well as a time constant $\tau_G$ for the onset of graphene precipitation to be in the order of tens of seconds or several minutes for a catalyst thickness in the order of 1 micron. $\tau_G$ thus is orders of magnitude lower than the growth time-scale of conventional CVD techniques. On the precipitation time scale $\tau_G$, the diffusion length of carbon in nickel is much larger than that of Ni and dopant (e.g., P) atoms into the substrate.

Referring once again to the carbon diffusion flux through the catalyst, it is believed that the factors that contribute for such a spatial gradient in carbon concentration through the nickel film are or include:

The existence of a gradient in the activity of carbon in the gas phase to the support side of the Ni film. $\nabla\mu<0$. This translates into a gradient in the chemical potential of C, across film thickness where, for example, $\mu_{C_2H_2} > \mu_{a-C} > \mu_C^{Ni} > \mu_G > \mu_{group}$. Depending on process conditions, for example, diffusion of carbon may take place irreversibly from the gas-exposed side to the supporting side.

The nickel thin film surface is intentionally amorphized by enrichment with Ni. Dissolution or solubility of C in amorphous Ni is greater than in the crystalline phase. This enables the C absorption process from the gas-exposed side at lower temperatures than c-Ni and maintains a concentration gradient across the film.

During both the heating and cooling sequences there exists a gradient in temperature between support and gas sides of the catalyst film, temperature $T(z=0) > T(z=h)$. This condition also contributes to an interfacial stress that amounts to a given shear strain in the Ni support side. It is believed that there may be in existence a strain-induced reduction in solubility of C in the Ni at the support side, as compared to the gas side of the Ni thin film.

The initial step in the process is the dissociative adsorption of $C_2H_2$ at the surface of the catalyst. This surface process is then followed by a bulk absorption process, namely, the dissolution of C into Ni. The kinetics of the process is characterized by an adsorption rate R (molecules $m^{-2}$ $s^{-1}$) of molecular carbon. This can be expressed as a product of sticking probability S and the flux $\Gamma$ of hydrocarbon species. S is a cumulative probability function ($0 \leq S \leq 1$), characterized by an activation energy $E_{ads}$ and a site function $f(\theta)$, which quantifies the fraction of empty surface sites. S also depends on crystal planes and may be influenced by surface reconstruction.

$$R_{ads} = S \times F_{C_2H_2} = f(\theta) \times \exp\left(-\frac{E_{ads}}{kT}\right) \times \frac{P_{C_2H_2}}{(2\pi mkT)^{1/2}} \quad (1)$$

A certain fraction of the adsorbed $C_2H_2$ is rearranged at the surface to give an amorphous carbon phase a-C. Two mechanisms are responsible for the depletion of this film. First, this reaction is reversible and, by keeping the supply of hydrogen in contact with the surface film, a-C can be etched by atomic H, and the above equation can be cast to account for the reversible process, (which in some ways is typical of chemisorption reactions). Second, carbon dissolves into the sub-surface of the nickel bulk. For a given set of (P, T) conditions, over time an equilibrium thickness of a-C develops characterized by dissociation constant k.

At the temperatures involved, dissociative adsorption takes place on the surface of the nickel catalyst. The formation of an amorphous carbon phase is favored at the surface, because $k \geq 1$. The amorphous carbon then forms a solid state feedstock for the dissolution of C in nickel, forming a spatially graded solid solution in lieu of Ni carbides, which is not stable at the temperatures involved. It is assumed that a solid solution of C in Ni starts to form just below the surface z=0. Experimental validation was performed by high resolution XPS and EELS.

The reversible dissolution of carbon just below the a-C into the Ni may involve energy that is characterized by a positive free energy of dissolution $G_{sol}$ per mole and a equilibrium constant $k_{sol}$ that determines the direction. Because the process of dissociative adsorption and dissolution act in series, an expression for the equilibrium concentration of C into the Ni sub-surface can be derived at the interface of the a-C and Ni (e.g., at $z \geq 0$). Increasing both the ratio of partial pressures of hydrocarbon gas to hydrogen, as well as temperature, promote carbon deposition on the surface. Yet there exists a set of equilibrium process condition of partial gas pressures ratio condition when no net deposition of a-C forms at the surface, because formation of a-C is balanced by the rate of hydrogen etching and dissolution in Ni. This condition is encoded in an equilibrium constant that is termed the zero precipitation threshold $k_{GPT}$ and is equal to the ratio of partial pressures of $H_2$ to $C_2H_2$ at which no carbon is formed on either or both sides of the nickel film. $k_{GPT}$ is equal to the exponent of the difference in chemical potentials of the hydrocarbon ($C_2H_2$) and its dissociative products (hydrogen and a-C:H).

$$k = \lim_{z \to 0} \frac{P_{H_2}^{1/2}[C]_c^{aC}(z)}{P_{C_2H_2}^{1/2}} = \exp\left(\frac{(\mu_{C_2H_2} - \mu_{H_2} - 2\mu_c^{aC})}{RT}\right) \times \frac{Vc}{\kappa V_{Ni}} \quad (4)$$

$$k_{sol} = \lim_{z \to 0} \frac{[C]_c^{Ni}(z)}{[C_a](z)} = \exp\left(-\frac{G_{sol}}{RT}\right) \quad (5)$$

$$[C]_C^{Ni}(\lim_{z \to 0}) = \left(\frac{P_{C_2H_2}}{P_{H_2}}\right)_{eq}^{1/2} \times k_{GPT} \exp\left(\frac{-G_{sol}}{RT}\right) \times \frac{Vc}{\kappa V_{Ni}} \quad (6)$$

$$J = -D_C^{Ni}\left(\frac{C_C^{Ni}(z) - C_C^{aC}(0)}{\delta}\right) \quad (7)$$

The value of the equilibrium constant k is determined by the relative partial pressures of the gas-phase components and the Henrian law constant for the solution of carbon in nickel. From expression (4), it becomes clear that the solubility of carbon in nickel depends on the affinity for carbon formation of the gas phase. For example, the higher the affinity for carbon formation (high $P_{C_2H_2}/P_{H_2}$ ratio), the higher the solubility of carbon in nickel. The equilibrium solubility, $k_{sol}$ of carbon in nickel also increases with temperature. This is a consequence of the fact that the affinity of carbon in the gas phase (chemical potential of $C_2H_2$ dissolved graphite in Ni) is higher than that of the dissociation products.

At the gas side and in the cross-section of the Ni film, the C solubility is determined by the thermodynamic properties of the amorphous carbon and differs from the graphite solubility. The solubility measurements of carbon in nickel in contact with a mixture of methane and hydrogen, performed and reported by others validates the above reasoning. It has been observed that the carbon content at saturation was 35% higher than for a mixture in equilibrium with graphite. Because the concentration of carbon dissolved in nickel at the gas side of the nickel film can exceed the solubility at the support side, a concentration gradient over the nickel becomes possible, and therefore, a driving force for the carbon diffusion through the nickel film is created.

The driving force for the bulk diffusion of carbon through the metallic Ni is principally related to a gradient in the activity of various forms of carbon in contact with the Ni. Because the activity of carbon in the gas phase precursor (e.g., acetylene) is much higher than that of the products a-C and graphite, there is a difference in carbon solubility at the gas/metal interface from that at the metal/carbon interface. This helps explain the tendency for carbon to diffuse in the bulk to the support side interface. The concentration of carbon at the support side then reaches a value that, upon cooling, produces a super-saturated solution giving rise to C precipitation.

Using strain energy minimization, it can be argued that the carbon will precipitate into the shape of flat discs rather any other shape, because the faces of the sheets are free to expand and, in an anisotropic material, this lowering of energy will be particularly effective if the sheets are formed in a plane in which the lattice of the precipitate is easily stretched. In the particular case of graphitic precipitate in a-Ni (using the ratio of the molar volumes of graphite to nickel), the reduction in strain energy is in the order of less than half. It seems, then, that the strain energy can be effectively released by allowing the carbon precipitate to detach from the matrix film. By allowing the precipitate lattice to be partially discontinuous with that of the matrix, further growth of the precipitate is possible. There need not be a one-to-one registry between the points of the lattice of the precipitate and the lattice points of the matrix originally occupying the same space. The conservation of carbon atoms may involve the total number of carbon in the precipitate being equal to the number of missing carbon in the matrix, as the interchange of atoms still takes place via diffusion. This fact implies that the precipitate re-crystallizes in such a manner that shear strain vanishes and (potentially only) a uniform biaxial compression remains. The walls of a disc-shaped precipitate bulge outward owing to increasing number of atoms being sunken into its volume. The inclusion then re-crystallizes so that atoms are removed from the compressed center and fed to the region near the rim. That this crystallization of carbon should occur at such low temperatures is made possible by the strain energy released when an originally strained region acts as a seed for re-crystallization.

Carbon diffusion alone does not necessarily explain the formation of graphene at Ni/Glass interface. Adsorption and diffusion of carbon atoms in nickel were studied by density-functional theory calculations to understand the growth mechanism of graphene in its initial stage. Combined with the results for surface and subsurface diffusions, the diffusion behaviors around the edges between low-index nickel surfaces reveal that the growth is related to the diffusion barriers across these edge regions of nickel nanoparticles, in addition to the growth temperature. These results can be explained in terms of the reaction mechanisms that are kinetically or thermodynamically controlled depending on the temperature, etc.

FIG. 1 is a schematic view of the set-up used to validate the discovery disclosed in the instant disclosure. FIG. 1 is a cold-wall CVD apparatus, where localized heat is coupled to the substrate rather than the chamber as a whole. In the FIG. 1 example, heating is performed with resistive techniques (e.g., such that a current is passed through the Ni). It will, however, be appreciated that other heating approaches may be used in connection with different example embodiments. For instance, tungsten or other halogen lamps, infrared (e.g., short-wave infrared or SWIR) elements, inductive heaters, microwave irradiators, lasers, and/or the like may be used in certain example embodiments. The focusing of heat (e.g., through resistive and/or other means) may be advantageous in terms of providing direct energy to the Ni as opposed to the chamber as a whole, which would be less efficient. Gas flows through the chamber, and although one chamber is shown, it will be appreciated that multiple chambers and/or a multi-zone or multi-stage chamber may be used in different example embodiments (e.g., with different gas(es) potentially being provided to the different chambers, zones, and/or stages). It will be appreciated that the gas flow may be finely controlled, e.g., using gas flow controllers, multiple ports, etc., so that a desired accuracy and timing may be achieved. In addition, although a quartz tube is shown, other chambers may be used in different example embodiments.

Figure 2A:
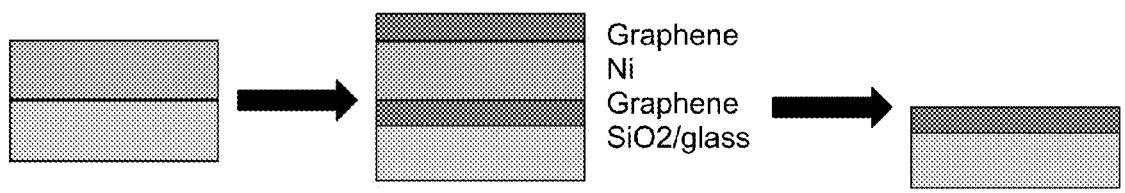
FIG. 2A schematically demonstrates the graphene growth process and removal of Ni that leaves graphene on a glass, Si, and/or other substrate, in connection with an example coated article, in accordance with certain example embodiments.
Figure 2B:
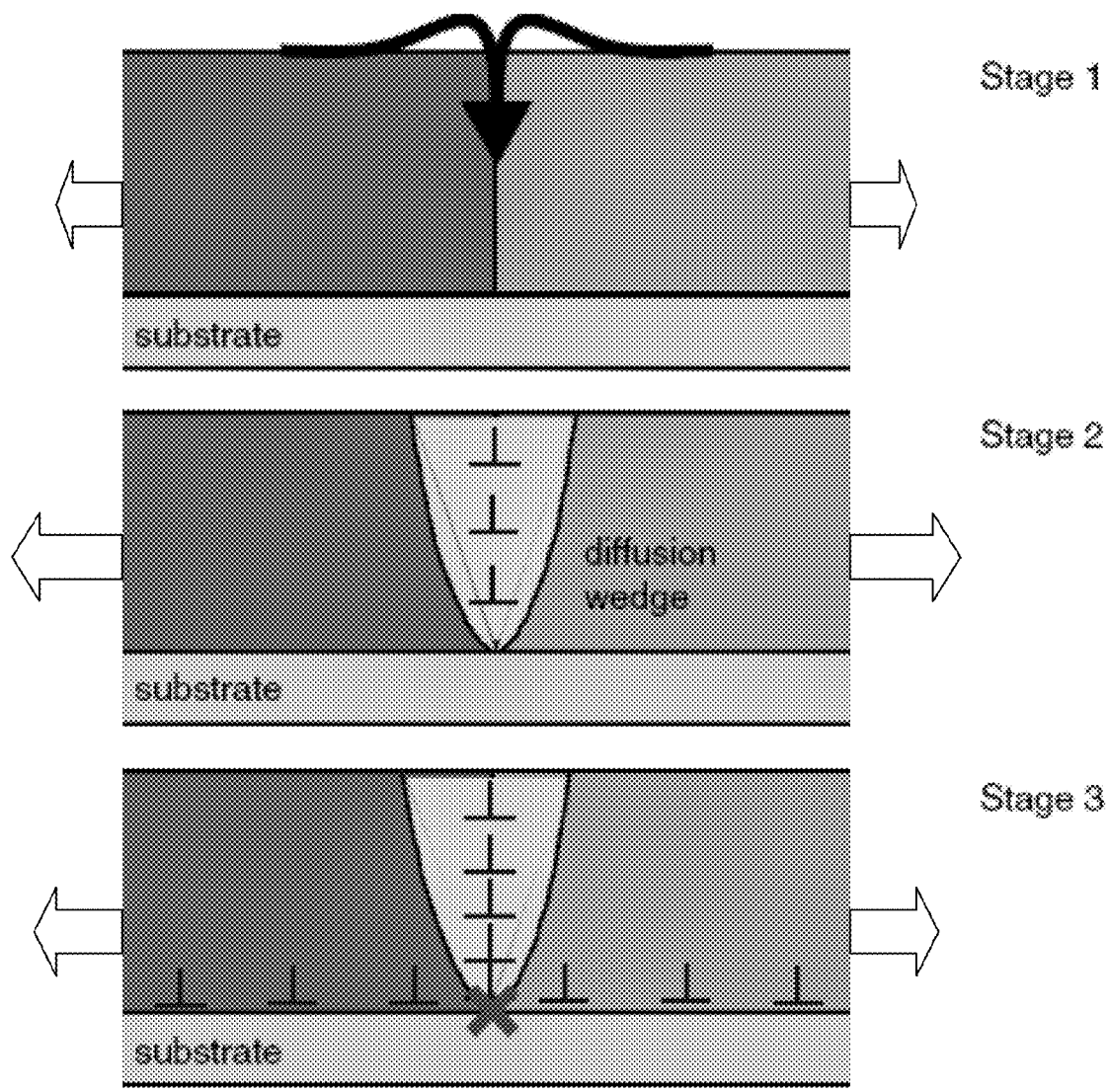
FIG. 2B is a schematic view of how a "diffusion wedge" may form, creating the stress that in essence displaces the Ni and allows C growth in accordance with certain example embodiments.

FIG. 2A schematically demonstrates the graphene growth process and removal of Ni that leaves graphene on a glass, Si, and/or other substrate, in connection with an example coated article, in accordance with certain example embodiments. As shown in FIG. 2A, graphene forms both above and below the Ni catalyst layer, with the upper graphene tending to form first. Moving left to right, FIG. 2A shows the initial growth of nickel on the substrate, then the intermediate product with both upper and lower graphene layers being formed on the nickel and between the nickel and substrate, respectively, and ultimately a final coated article where delamination has been controlled so that only the lower graphene is provided on the substrate. It is noted that the three schematic views in FIG. 2A are snapshots in time. FIG. 2B is a schematic view of how a "diffusion wedge" may form, creating the stress that in essence displaces the Ni and allows C growth in accordance with certain example embodiments. In this sense, FIG. 2B shows what happens between the left and center images in FIG. 2A. In the first stage of FIG. 2B, carbon enters the Ni bulk between grains at the arrow (and possibly also into the crystal grain itself at a lower rate than at the grain boundaries, although this is not shown for clarity). Prior and/or current exposure to He and heat predisposes the Ni to defects, creating dislocation and/or twinning sites. The carbon diffuses through the Ni and exists at the cross marks in stage 2. This is believed to be the "preferred route" that the C takes. The carbon does not necessarily stay trapped in the Ni bulk (e.g., at or in the grain boundaries), however. That is, as the process continues, carbon travels through the depth of the Ni and propagates outwardly on the surface of the glass between the Ni bulk and the substrate, e.g., as shown in stage 3. It is, however, noted that it might be desirable to provide an intermediate product that includes, for example, graphene growth on top of the Ni and C within the bulk of the Ni (e.g., at or in the grain boundaries), e.g., if heating is stopped before a graphene layer is fully formed on the substrate's surface below the Ni. This intermediate product may be shipped to a potential fabricator, who may restart the heating to fully form the graphene layer. In this way, the upper graphene layer and the Ni may in essence protect the as-yet formed graphene underlayer and substrate, with the lower graphene layer being formed by the fabricator at a desired time that is compatible with and/or otherwise appropriate for the overall manufacturing process.

Figure 3A:
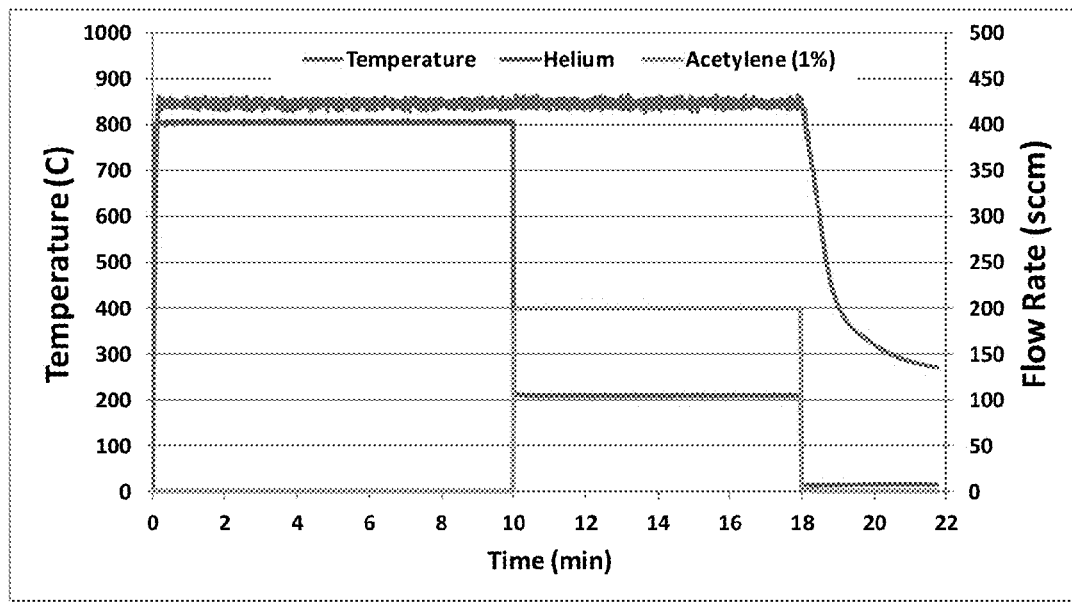
FIG. 3a is a graph showing the temporal sequence of flow rates for He and $C_2H_2$, as well as the temperature of the Si substrate on which graphene was grown in accordance with certain example embodiments.
Figure 3B:
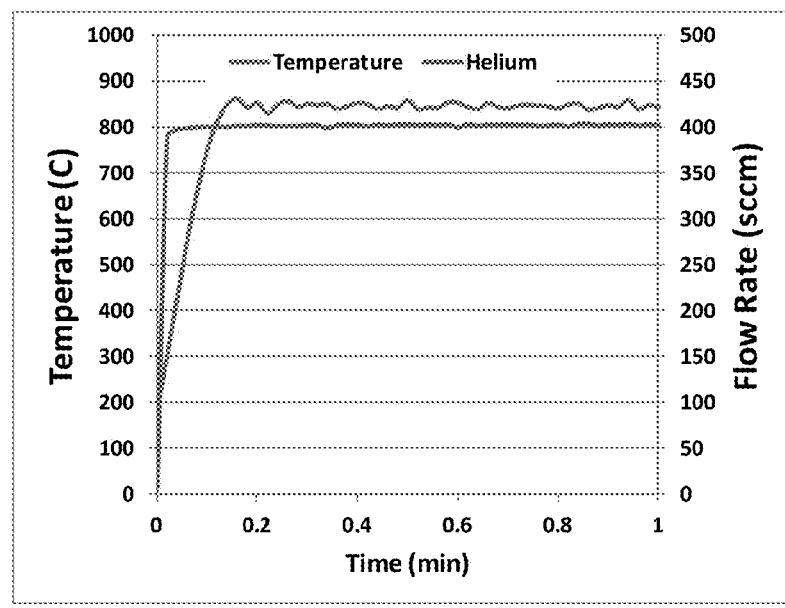
FIG. 3b is an enlarged view of a portion of the FIG. 3a graph.
Figure 4A:
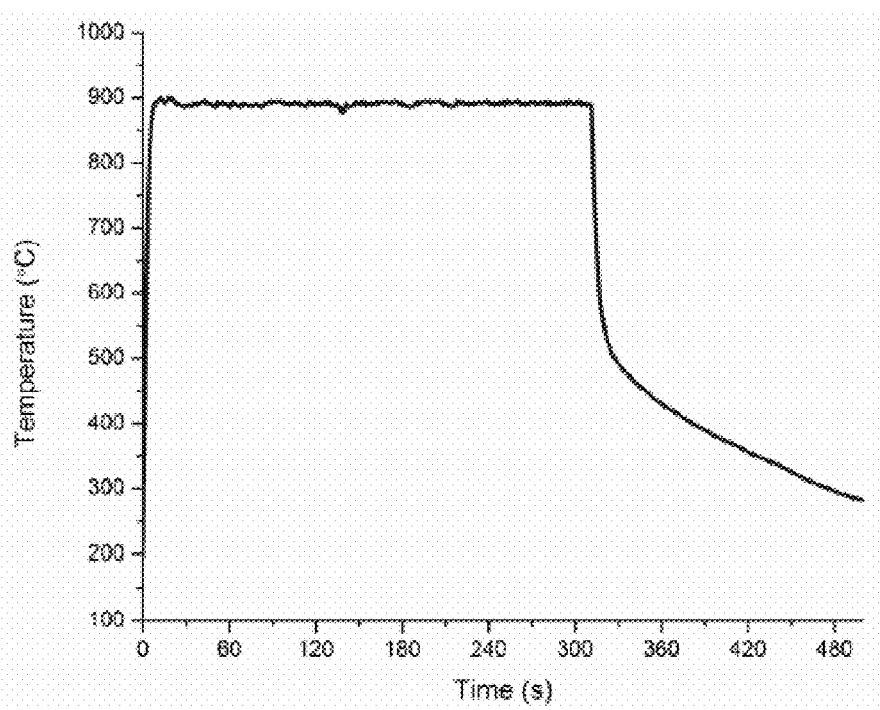
FIGS. 4a-4b plot temperature and flow rate vs. time for H, He, and C2H2, for another profile that may be used in connection with certain example embodiments.
Figure 4B:
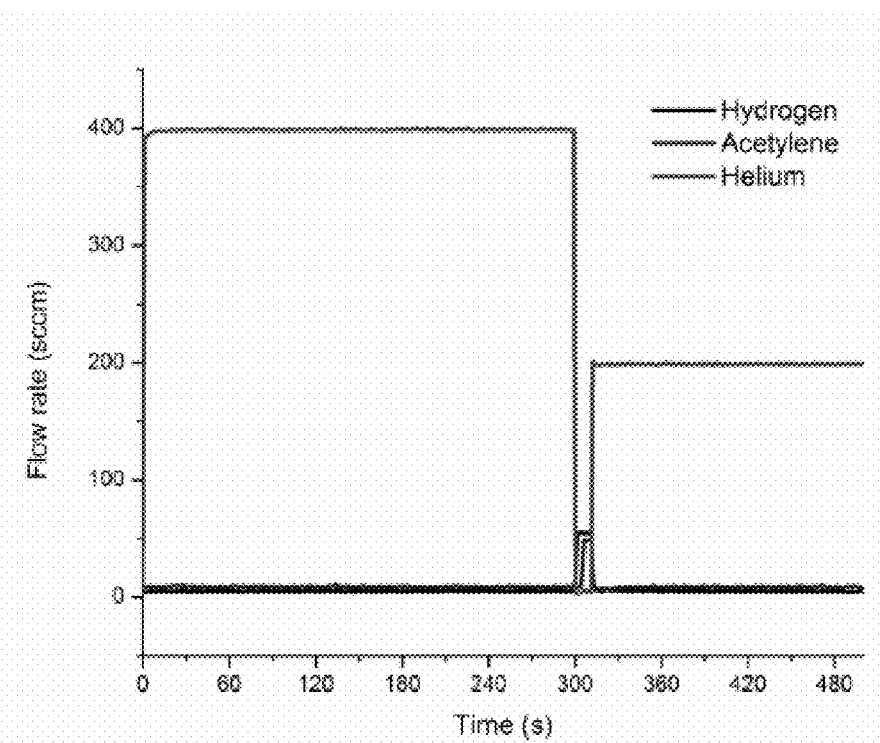

FIG. 3a is a graph showing the temporal sequence of flow rates for He and $C_2H_2$, as well as the temperature of the Si substrate on which graphene was grown in accordance with certain example embodiments, and FIG. 3b is an enlarged view of a portion of the FIG. 3a graph. It is noted that the graphs shown in FIGS. 3a and 3b correspond to a rapid, high temperature process. In this regard, the FIG. 3b enlargement of the FIG. 3a graph is taken during the initial very rapid temperature increase. FIGS. 4a-4b plot temperature and flow rate vs. time for H, He, and C2H2, for another profile that may be used in connection with certain example embodiments. FIGS. 4a-4b also correspond to a rapid, high temperature process.

Figure 5A:
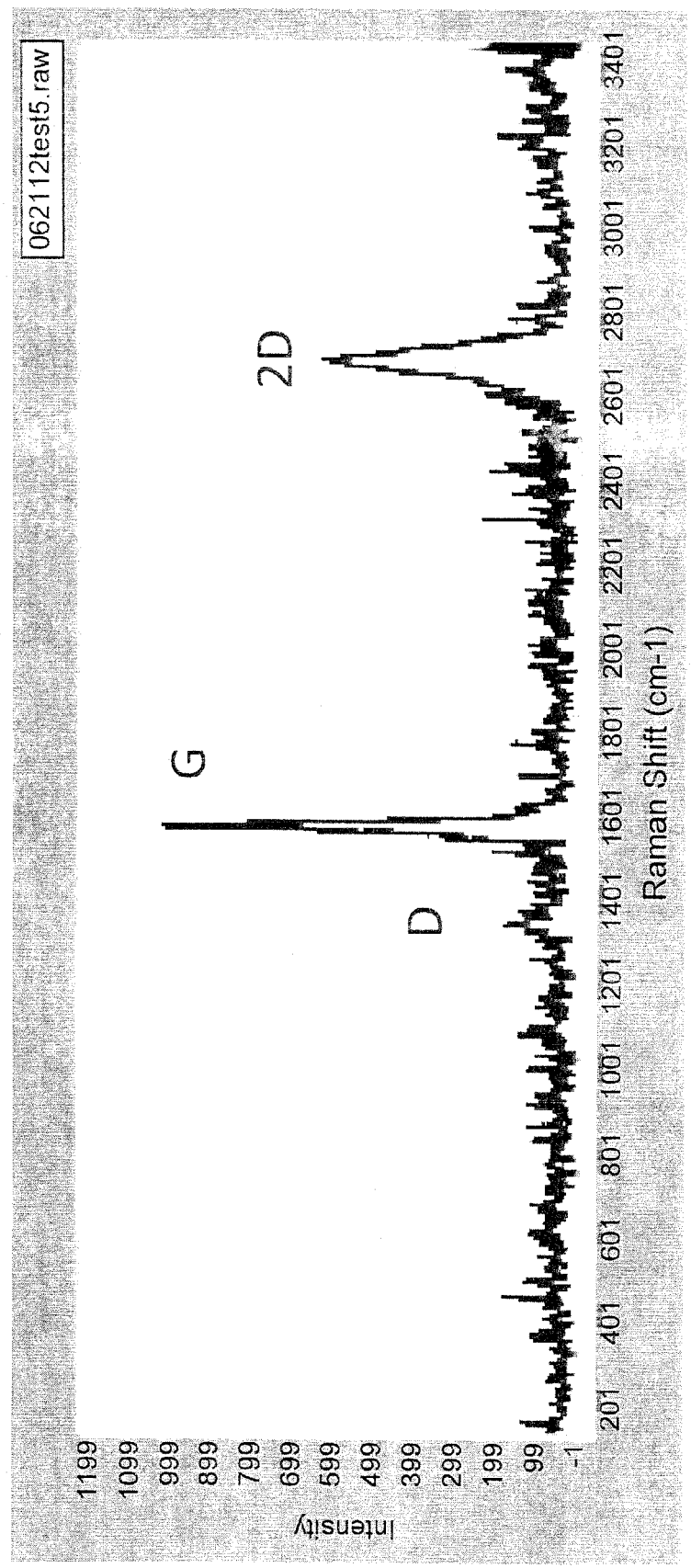
FIGS. 5A and 5B show Raman spectra as function of anneal gas used.
Figure 5B:
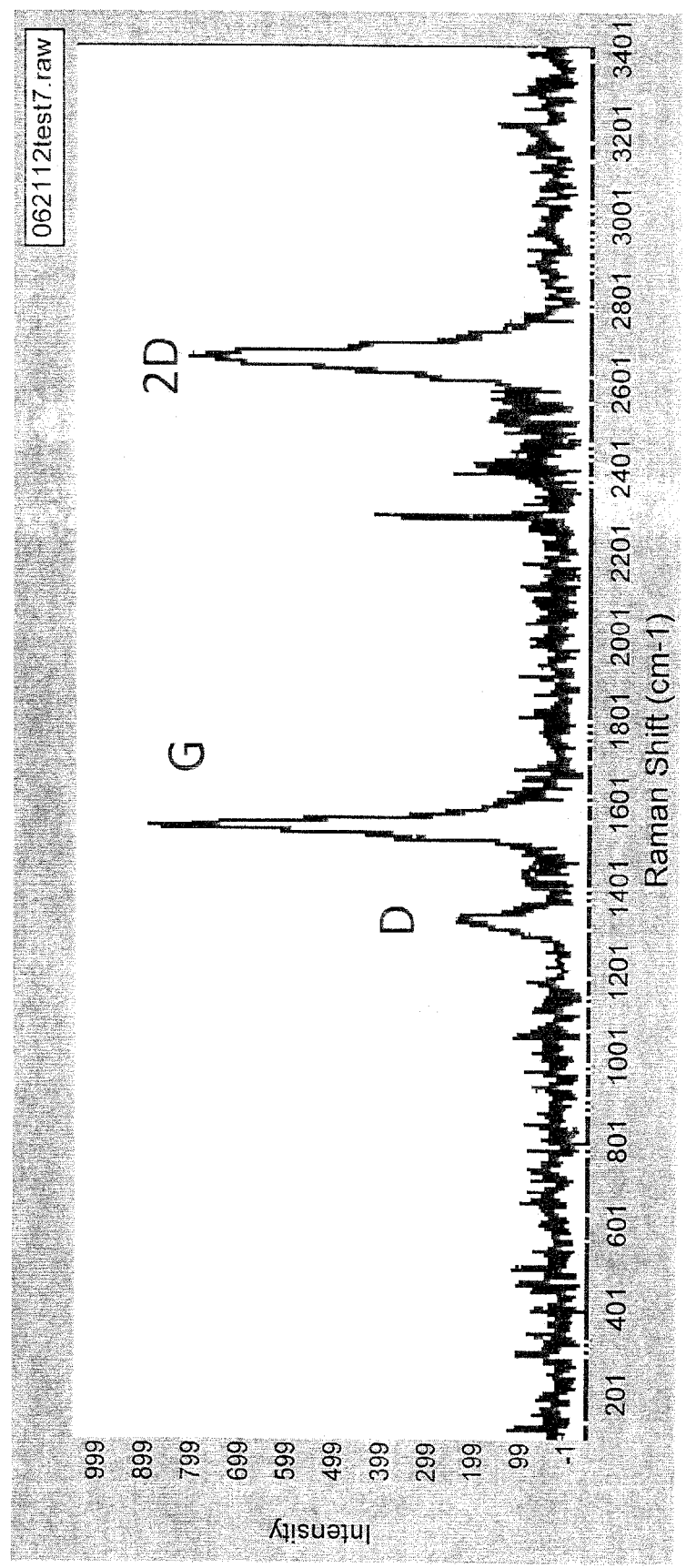
Figure 6A:
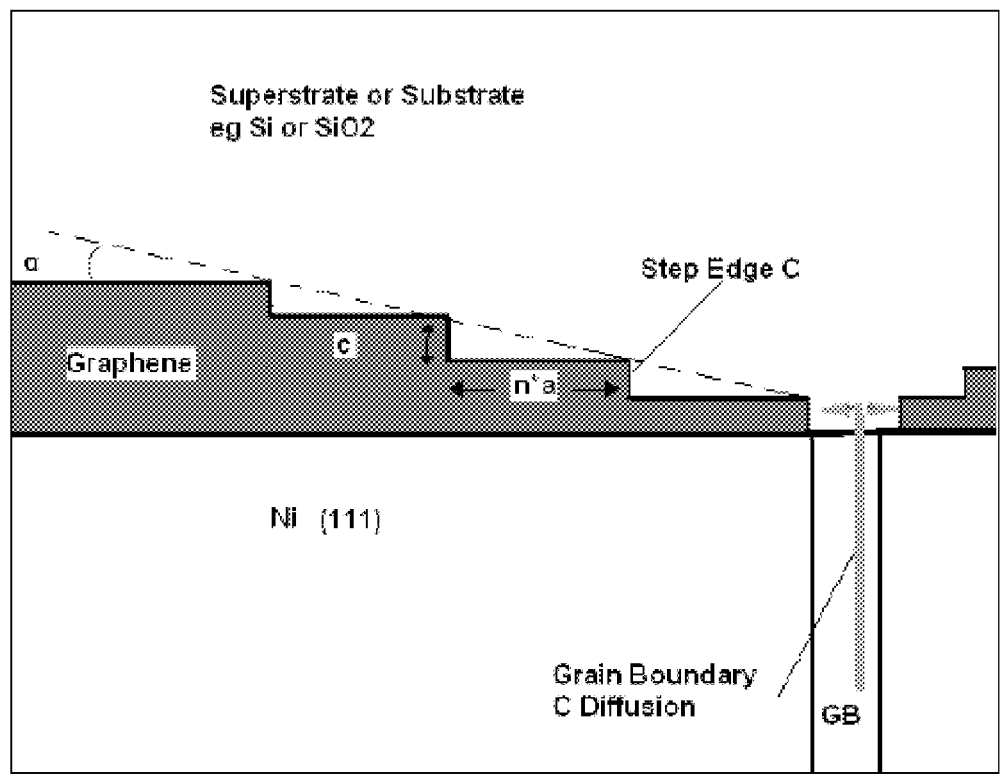
FIG. 6A schematically shows interfacial graphene island growth on Ni(111), fed by grain-boundary (GB) diffusion into C, in accordance with certain example embodiments.
Figure 6B:
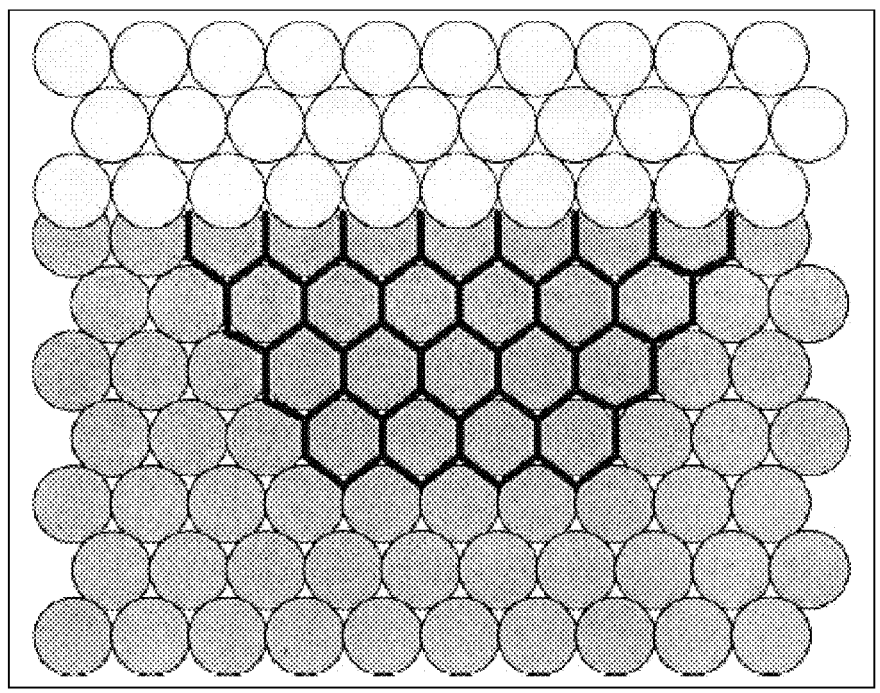
FIG. 6B illustrates how minimization of the sum of interface and step-edge energies determines the critical hexagonal island size at a given growth temperature, in accordance with certain example embodiments.
Figure 7:
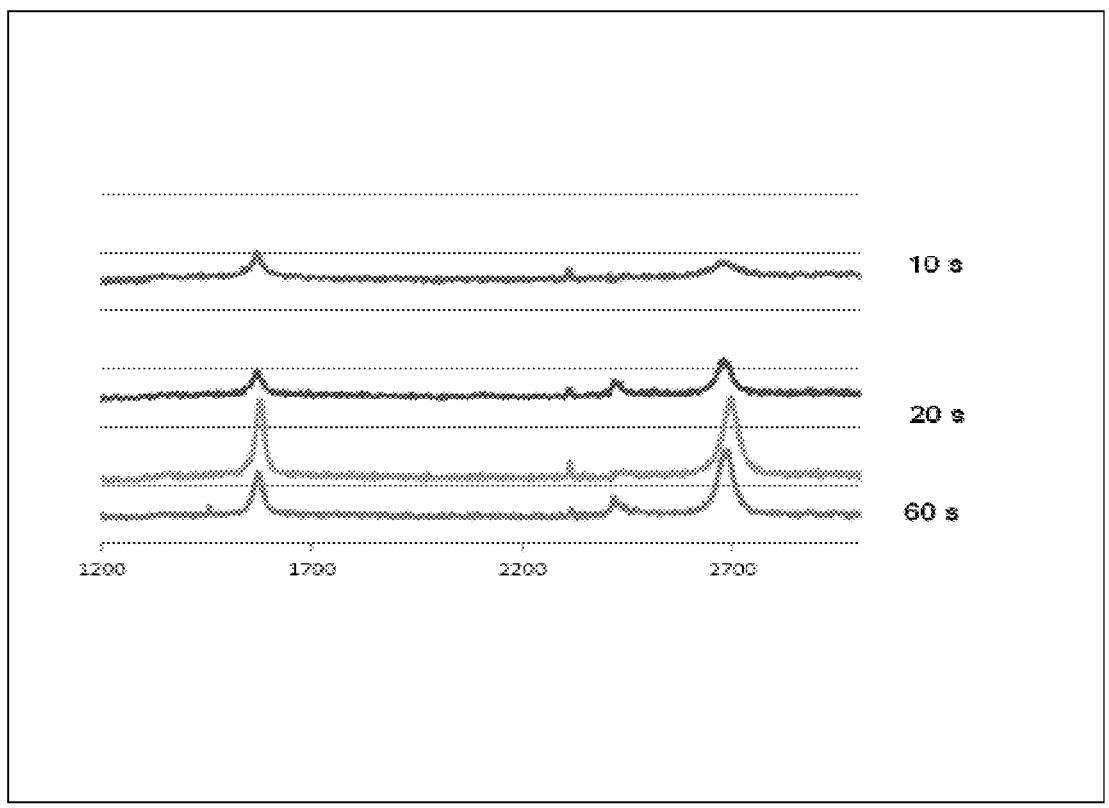
FIG. 7 shows the evolution of in situ Raman Peaks as a function of time and, as Id/IG tends to zero and I2G/IG approaches 1, island coalescence into continuous graphene is observed.

FIG. 5 shows Raman spectra as function of anneal gas used. The quality of the precipitated graphene depends largely on the amount of stress induced in the film in the anneal section of the process. The one lower D peak is indicative of fewer edge mode defects and thus suggests fewer islands being formed or, in other words, a more continuous graphene layer being formed. The 2D/G ratio is more indicative of the number of layers. For instance, He gas and Ar gives higher 2D/G ratio than does hydrogen. FIG. 6A (discussed in greater detail) below shows a zone edge disorder mode which is characterized in the Raman signal as a D peak, and FIG. 6B is a top view of the edge demonstrating how the graphene grows on the nickel. There is a close lattice match between the (111) nickel and the graphene growth as will be appreciated from FIGS. 6A-6B. Note that FIG. 7 shows the evolution of in situ Raman Peaks as a function of time.

Condition of Illustrative Zero-Precipitation Concept

The thermodynamics of the process of graphene precipitation at the support side of the Ni film can be explained in connection with the condition of zero-precipitation concept noted above. In this process, there is no direct contact between the gas phase and the final product, graphene. The thermodynamics of the process is captured from experiments by determining, for several temperatures, these conditions for which there is neither carbon deposition, nor gasification. This condition is usually referred to as the equilibrium for this reversible surface reaction. The instant disclosure refers to this condition as the Graphene Precipitation Threshold (GPT) and assigns a threshold constant to it for the particular reaction, as a number of steps (e.g., adsorption, dissociation, dissolution, and precipitation) are involved in the global mechanism for graphene formation that are different from the normal elementary surface reaction steps that happen during hydrocarbon dissociative reactions at the surface of metals. Because it is nonreversible, the diffusion step has a behavior that is clearly different from that of a normal elementary surface reaction step. Under conditions away from the threshold, the diffusion of carbon through nickel takes place in one direction: from the gas side to the support side of the nickel film catalyst, or the opposite. At the threshold, the rates of the surface reaction, the diffusion, and the precipitation that operate in series, become zero. At the support side of the catalyst film, the equilibrium between graphene carbon and carbon dissolved in nickel is given as:

$$\mu_C(z=r) = \mu_G = \mu_C^{Ni,0} + RT \log\left(\frac{[C]_C^{Ni}}{[C]_C^G}\right) \quad (8)$$

The equilibrium concentration of carbon dissolved in nickel at the support side of the nickel film is the solubility of amorphous carbon in nickel solubility, determined by the thermodynamic properties of amorphous carbon. Because the rate of diffusion also becomes zero at the GP threshold, the concentration of carbon dissolved in nickel and its chemical potential are uniform throughout the entire Ni thickness cross-section h and equal to the solubility of amorphous carbon in nickel. Here, it is assumed that the nickel is isotropic and amorphous.

$$[C]_C^{Ni}(z=0) = [C]_C^{Ni}(z=h) \quad (9)$$

$$\mu_{C,r} = \mu_{C,f} \quad (10)$$

At equilibrium, the chemical potential of carbon dissolved in nickel, just below the a-C, and that of surface carbon are equal, so that:

$$\mu_{C,f} = \mu_{a-C} \quad (11)$$

Finally, the solid phase dissolution of C in Ni is connected to the gas phase is in equilibrium with the surface carbon. In the case of acetelyne dissociation:

$$\frac{1}{2}C_2H_{2(g)} \xrightleftharpoons{k} C_{(aC)} + \frac{1}{2}H_{2(g)} \quad (12)$$

Because at equilibrium, the chemical potential of carbon in all the consecutive steps has to be equal, the following relationships are valid, from equations (10) and (11):

$$\mu_{C,f} = \mu_{C,r} = \mu_{a-C} \quad (13)$$

The following can then be derived:

$$k_{gp} = \frac{P_{H_2}^{1/2}}{P_{C_2H_2}^{1/2}} = \exp\left(-\frac{(-\mu_{C_2H_2} + \mu_{H_2} + 2\mu_c^{aC})}{RT}\right) \quad (14)$$

Therefore, the value of the threshold constant $K_{gp}$ and the gas-phase composition at the graphene precipitation threshold are determined by the thermodynamic properties of amorphous carbon in contact with the Ni surface. The threshold constant can be experimentally determined by measuring the partial pressures of acetylene and hydrogen for which the rate of carbon formation is zero. Raman is a useful tool to study this threshold. As this threshold is deviated from by, for instance, increasing the ratio of acetylene to hydrogen partial pressures, both graphene and amorphous carbon should form at the two interfaces.

A similar type of phenomenon, with the same type of driving force, was observed by others, who studied the interaction of highly dispersed nickel with amorphous carbon substrates between 700 and 1000 K and observed that carbon atoms dissolved in nickel and precipitated again as graphite. In other words, a conversion of amorphous carbon into graphitic carbon took place. This catalyzed conversion would proceed by a solution-precipitation mechanism, whereas the driving force is thought to be the difference in Gibbs free enthalpy between the initial and final forms of carbon. This causes probably different solubilities, so that a concentration gradient leading to carbon transport develops. These workers did not, however, consider the effect of strain in inducing precipitation.

As discussed herein, both the effect of a gradient in chemical potential, as well as interfacial strain (e.g., related to thermal mismatch in coefficient of thermal expansion or CTE), are considered to be drivers for a gradient in solubility of carbon across a Ni thin film. The catalyst acts as a membrane, and a global driving force for graphene formation is the difference in chemical potential between the gas phase and graphene. This causes different C solubilities at the gas side and the support side of the nickel and a concentration gradient ultimately leading to diffusion of carbon across the film. The GPT condition can be interpreted as the conditions for which the gas phase carbon solubility equals the solubility of graphene in nickel. Based on pure thermodynamic reasoning, graphene precipitation at the support side is intertwined with the formation of an a-C phase at the gas side. Nickel converts a-C to graphene and graphite. In certain implementations, no graphene precipitation at the interface would take place without the formation of a-C on the gas side of the nickel film. Thus, it will be appreciated that the thermodynamics and kinetics, and thus the graphene formation, can be affected by the partial pressures of the gasses, temperature, and any impurities. The precise control of the sequence of the gas flow controllers and/or the like therefore can be tuned to control graphene formation.

Example Steady-State Precipitation of Graphene at Nickel/Glass Interface

For gas phase conditions leading to carbon formation at the gas side of the catalyst, there will be a net positive rate of carbon diffusion. Because the rates of the consecutive steps are equal at steady state, a certain concentration gradient develops, which is determined by the relative rates of the surface reaction, dissolution, and carbon diffusion through the nickel film. It is thereby assumed that carbon diffusion takes place through an amorphous carbon deposit of equilibrium thickness δ on a catalyst slab with thickness z=h. The carbon concentration at the interface is then:

$$[C]_C^{Ni}(\lim_{z \to h}) = [C]_C^{Ni}(\lim_{z \to 0})\left(A(z)\exp\left(\frac{-G_{sol}}{RT}\right) - B(z)\right) \quad (15)$$

where $$B(z) = \frac{D_C^{aC}}{D_C^{Ni}} \times \frac{z}{\delta} \quad (16)$$

$$A(z) = B(z) + 1 \quad (17)$$

Figure 8A:
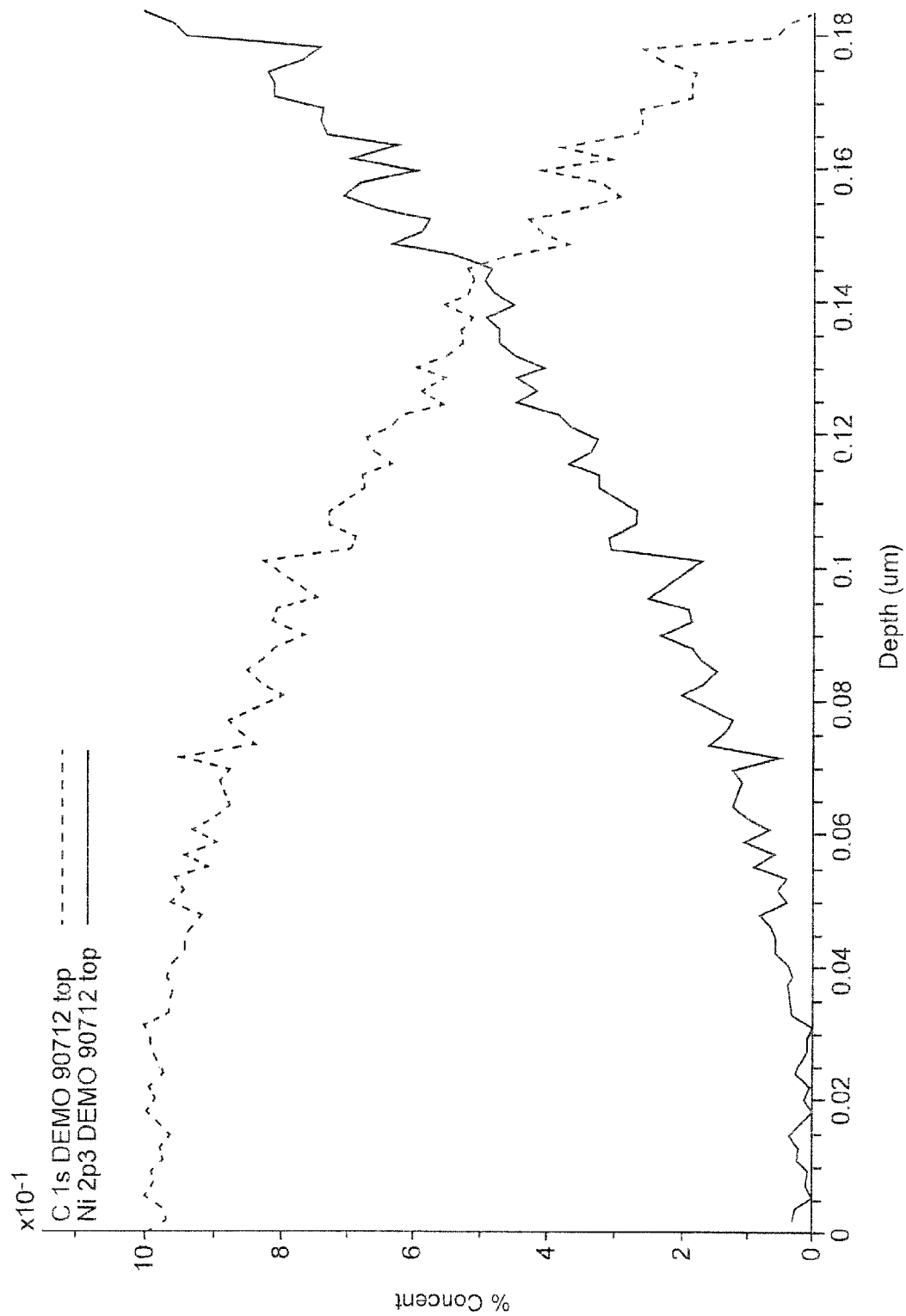
Figure 8B:
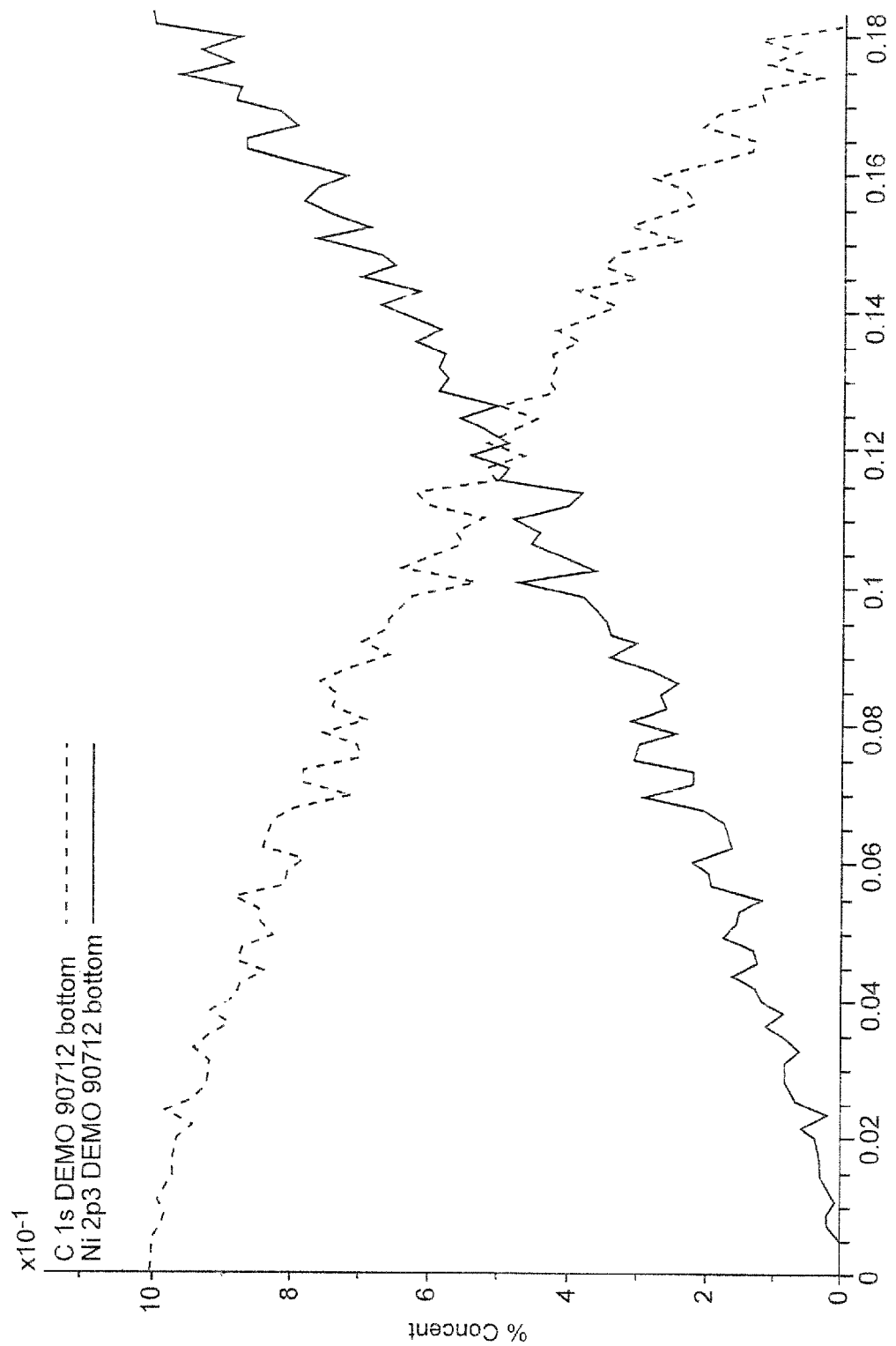
Figure 9A:
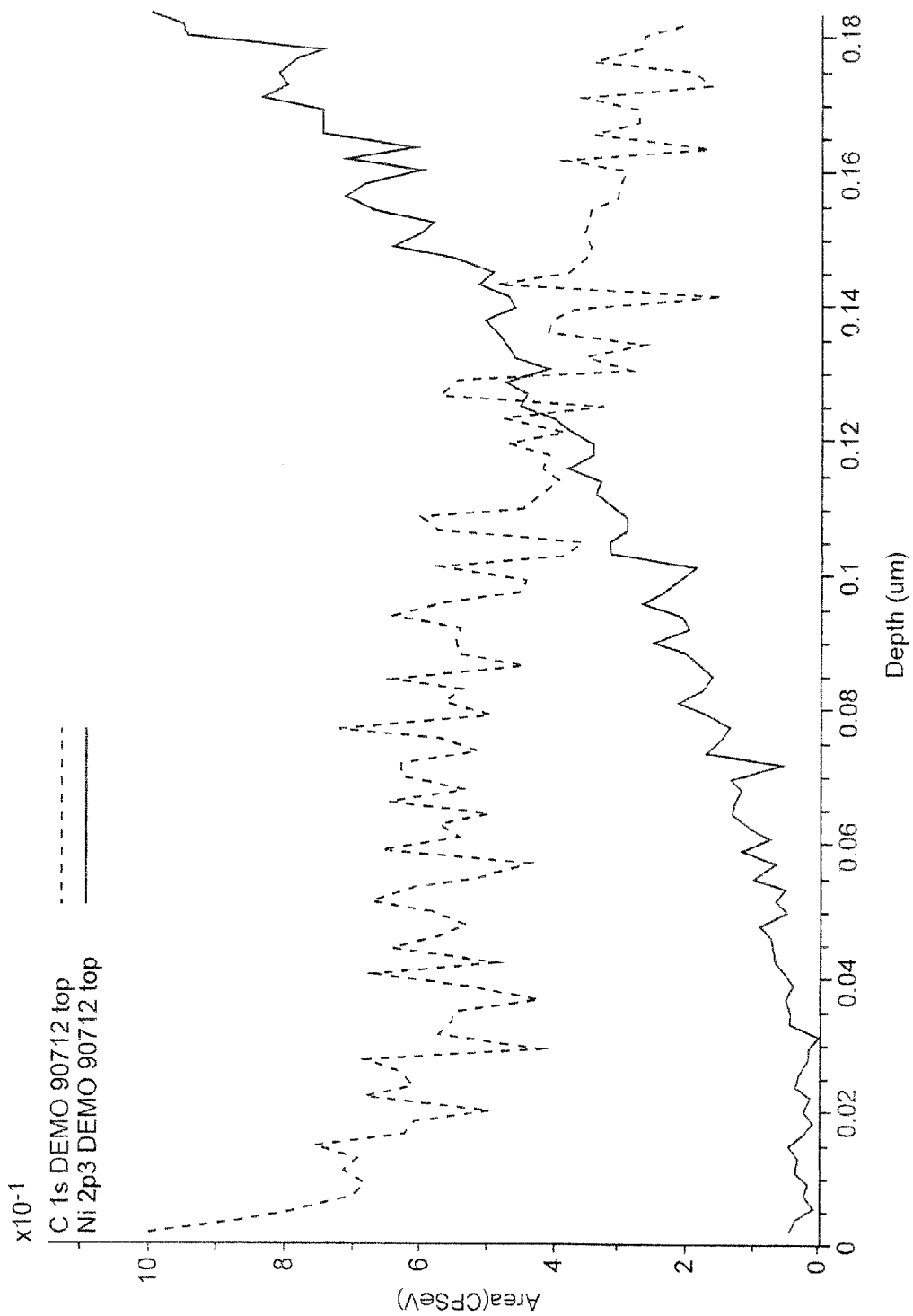

A number of possible situations arises, depending upon the values of the diffusivity of carbon in a-C and nickel. A certain concentration gradient exists over the a-C film because of the segregation behavior. It is assumed that the diffusion through the a-C film is very fast, so that there is an equilibrium between surface carbon and carbon dissolved in nickel just below the selvedge. From equation (16), for very low values of $$\frac{D_c^{a-C}}{D_c^{Ni}},$$

the concentration of carbon in nickel is almost uniform. However, for a more realistic case where $$\frac{D_c^{a-C}}{D_c^{Ni}} \gg 1,$$

the concentration gradient cannot be neglected, so that the concentration of carbon at the gas side of the particle increases substantially compared to the support side. This is possible because the solubility of carbon in nickel is higher at the gas side of the particle. This will also cause the equilibrium surface coverage of carbon to increase, resulting in a higher rate of gasification of surface carbon and a lower net rate of carbon precipitation. Although the diffusion is clearly not the only rate-determining step, it influences the rate of carbon formation, because of its influence on the surface coverage of carbon. With a further decrease of the diffusivity, a maximum concentration gradient finally develops when the concentration at the gas side of the particle equals the gas-phase carbon solubility, so that the carbon diffusion can be said to be the only rate-determining step of the process in some cases. When there is an affinity for gasification, the net rate of carbon formation is negative, and the concentration gradient is reversed. See FIGS. 8A-8B for concentration profile data, and see FIGS. 9A-9B for area analyses. It is noted that the modulations or localized peaks/peaklets in FIGS. 8A-8B show where carbon remains present at and/or in the grain boundaries of the nickel. FIGS. 8A-8B thus show the carbon diffusion profile within the nickel bulk from the top and bottom of a graphene/nickel/graphene stack removed from the substrate, as well as the periodicity of the carbon in same. FIGS. 9A-9B show corresponding area density data. The concentration at the support side of the catalyst is the solubility of graphite in nickel. Depending on the gasification conditions and the diffusivities, different profiles are obtained. The maximum concentration gradient is reached when the concentration of carbon dissolved in nickel at the gas side of the thin catalyst equals zero. This explains the mechanism for the current CVD deposition of graphene. At the GPT threshold, which separates the regions where there is an affinity for carbon formation and for gasification, the concentration of carbon dissolved in nickel is uniform and equal to the solubility of graphitic carbon.

Example Nucleation of Graphene Sheets

There is a situation that is encountered when a mixture with an affinity for carbon formation is contacted with a catalyst on which no carbon is present at the support side. A uniform concentration of carbon exists in nickel, equal to the gas-phase carbon solubility in nickel and higher than the saturation concentration of graphene. Nucleation of graphene can then take place, provided that the super-saturation is sufficiently high. Because of the very high concentration of carbon in nickel during nucleation and the segregation behavior, the surface coverage of carbon can be very high, so that the net rate of the surface reactions is zero, although the mixture shows an affinity for carbon formation. After nucleation, the concentration at the support side of the film drops to the saturation concentration of graphitic carbon. Information concerning the nucleation of graphitic carbon, deposited by the acetylene, can be obtained from an analysis of the intensity ratio of Raman $I_{2D}/I_G$ lines versus time curves, and from experiments in which various carbon formation conditions were applied sequentially on the same catalyst sample. A typical weight versus time curve for the $C_2H_2$ dissociation has two zones: one with an increasing rate of carbon formation, and one with a constant rate. The zone with the decreasing rate, due to gradual deactivation of the catalyst has not been observed in the $C_2H_2$ cracking, except at PCH4 D1:5 bar and in the absence of hydrogen. A real induction period, during which the rate is zero, was only observed under conditions with a very low affinity for carbon formation. The period of increasing rate is ascribed to the nucleation time of graphene islands. It is likely that there is a large difference in the nucleation time of the graphene islands. Some islands nucleate rapidly and probably reach a final growth rate, while other filaments are still nucleating. This may in some instances give rise to nanotubes and/or create conditions that are favorable for nanotube formation, even though the temperature is low, as a result of thermodynamic forces. Once there is no further nucleation of new islands, a constant rate of carbon formation is reached. Valuable information can be obtained by sequentially applying two different carbon formation conditions on the same catalyst sample, followed by a gasification with hydrogen under the same conditions. A condition with a low affinity for carbon formation (high pH2) was interrupted for a short time by a condition with a high affinity (low pH2). The rate of carbon formation under the conditions with a low affinity strongly increases after a short exposure of the sample to conditions with a high affinity for carbon formation. The subsequent rate of gasification (on a used catalyst) is much higher compared to the case where only the conditions with a low affinity are applied on a fresh catalyst sample and equals the rate of gasification that is observed if only the conditions with a high affinity are applied on a fresh catalyst sample. Furthermore, a new period of increasing rate of carbon formation is observed for the conditions with a high affinity for carbon formation, very similar to the period of increasing rate that is observed when an experiment is started on a fresh catalyst sample, although a constant rate of carbon formation was already reached under the conditions with a low affinity for carbon formation.

With the proper scale, it can be shown that this new period of increasing rate of carbon formation is longer and starts from a lower rate when the difference in affinity between the two conditions is larger. These phenomena are explained by the higher number density of growing islands present under conditions with a high affinity for carbon formation. It is probable that for certain graphitic nuclei, a high supersaturation is required to nucleate, so that at conditions with a low affinity for carbon formation, only a small number of graphene islands nucleates. The higher number of islands that nucleated during the conditions with a high affinity for carbon formation is able to grow further during the subsequent conditions with a low affinity, giving rise to an increased rate of carbon formation, or they can be gasified during the subsequent gasification, giving rise to an increased rate of gasification. This also explains the observation of the new period of increasing rate when conditions with a low affinity for carbon formation are followed by conditions with a high affinity. This dependence of the number of growing islands on the affinity for carbon formation must be taken into account when a kinetic modeling is performed of carbon filament formation. Not understanding this phenomenon can lead to a biasing of the experimental results and the kinetic modeling. It may for example be comparable to performing rate measurements on catalysts with a different metal surface area, and combining the experimental results in the kinetic modeling.

Energetics of Example Graphene Islands Formation

The interface between solid phases may be classified generally as coherent (there is perfect registry of the lattices); coherent with strain (due to imperfect lattice matching), where the strain energy increases with the size of the growing particle, and there is a transition to a semi-coherent interface; semi-coherent interface (the introduction of dislocations reduces the strain energy, but they themselves contribute to the energy of the system), or incoherent (there is no matching of the interface). In general, the interfacial free energy will be minimized with better matching of the two phases. Incoherent interfaces have high energy and are relatively mobile because of the greater freedom of atomic motion.

The stresses present in the parent matrix as the precipitate grows strongly influences the shape of the precipitate. By modeling the precipitate as an ellipsoid of revolution, it has been shown how the strain energy is related to the shape. Growth as discs or plates is clearly preferred. A precipitate particle will likely have some coherent and some incoherent interfaces with the matrix. The greater mobility of the incoherent interfaces leads to faster growth in these directions. This anisotropic growth leads to plate and disc morphologies. The bounding coherent interfaces will be parallel to crystallographic planes in the matrix.

Solid solution precipitation/exsolution involves quenching an alloy to a supersaturated state (where the amount of dissolved solute is greater than the equilibrium amount predicted by the phase diagram). A heating schedule can then be applied to control the nature of the precipitation.

It is believed that at the beginning of the nucleation, a few carbon atoms precipitate onto the surface of carbon-saturated support side of the catalyst. They may combine into small structures with carbon atoms arranged in hexagons, which transform into a graphene sheet bonded with its edges to the metal surface. This form of lamellar nucleus is favorable because of the minimization of strain and elimination of dangling bonds in the carbon cluster. The nucleus grows with addition of precipitating carbon atoms to the edges of the nucleus.

After formation of the nucleus, the island can grow according to several scenarios. In the first scenario, the nucleus continues to grow, which results in the formation of graphitic sheets covering a significant part of the metal/glass interface. This growth, and the forthcoming exfoliation of the graphitic sheet induced, produces a variety of graphitic sheets that are oriented at an angle or parallel to the interface. In the second scenario, new nuclei form under the primary one. The central part of this multilayered nucleus begins to separate from the surface as soon as it reaches a critical size that determines the diameter of the deposit. In the third scenario, several nuclei precipitate on the surface of the same metal particle and they interact to form larger islands. If the nucleation frequency is high enough, the size of a single island tends towards a minimal value that corresponds to the critical radius of the nucleus.

As indicated above, FIG. 6A schematically shows interfacial graphene island growth on Ni(111), fed by grain-boundary (GB) diffusion into C. As suggested by FIG. 6B, minimization of the sum of interface and step-edge energies determines the critical hexagonal island size at a given growth temperature.

This growth model scenario makes certain predictions that can be validated by in situ Raman. The model predicts a certain critical radius of a given island of graphene growth as well as their number/density as a function of the experimental conditions and surface energies.

Example Mechanism of Graphene Formation on Nickel/Glass Interface

Graphene growth on soda lime silica based glass coated with pure Ni and a Ni alloy film was investigated in a reduced pressure acetylene atmosphere. Interestingly, results differed between the rapid-CVD and traditional tube-CVD systems. In the tube-CVD system, the Ni alloy film diffuses into the glass at high temperatures during the heating step. As a result, the graphene quality using this approach is generally low. Using the rapid-CVD system, no diffusion of the alloy film was observed. Graphene on the top of the film remained low in quality. However, higher quality graphene was formed between the glass and the alloy film. After etching of the alloy film from the glass, few-layered graphene remained on the transparent substrate. Alternatively, after graphene growth, the top layer metal could be removed by etching, or it may be functional in subsequent fabrication of a device on the glass.

The relation between the surface coverage of carbon and the bulk concentration of interstitially dissolved carbon in nickel, just below the top graphene, can be described and/or formalized by a segregation isotherm.

Several types are possible, and the Langmuir isotherm may be used in certain example embodiments for process control. It has been shown that the segregation of carbon dissolved in nickel to the (100) surface can be described up to high coverages by the Langmuir isotherm, and it also has been shown by TEM/SAED that the (100) faces are the most abundant at the metal/gas interface during carbon filament formation on Ni. With this approach, carbon atoms, segregating from the solution to the surface, have to compete with gas phase atoms for the same surface sites. This is illustrated by a selection of results for the gasification by hydrogen of filamentous carbon, deposited under standard conditions by the methane cracking, at different partial pressures of hydrogen. The rate of gasification shows a maximum as a function of the partial pressure of hydrogen, because of the decrease of the surface coverage of carbon. If carbon would segregate from the bulk to separate sites, its coverage would not be expected to be influenced by the presence of hydrogen. It also has been assumed by some that there exists an overcoat with high concentration of carbon, which can be called a surface carbide at low temperatures below 350 degrees C. The diffusion of carbon through the nickel particle is ascribed to the diffusion of interstitially dissolved carbon in nickel.

The model with sub-stoichiometric intermediate carbides seems unrealistic for nickel, as carbides are known to decompose above 350 degrees C. and could not be identified unambiguously during steady state carbon island formation. These intermediate carbides generally cannot be present when there is no affinity for carbon formation, namely, during the gasification of filamentous carbon. A carbon filament precipitates at the support side of the nickel particle. Instead, it has been shown that it is formed by the continuous formation of carbon layers perpendicular to the metal/carbon interface and slipping of carbon layers.

Thermodynamics of Example Graphene Precipitation Under Interfacial Strain

Graphene precipitates rather than graphite or nickel carbide under the appropriate conditions. That is, a Ni—C system in the regime of low C (or low Ni content) at a sufficiently high temperature (T≈Thyp), forms an ideal solid solution. Under this reasonable assumption, activity of each end-member is equal to its mole fraction. The equilibrium condition between the ideal solid solution and the ex-solution is thus expressed as the following partial mass action laws $\Omega_{i,s} = \chi_{i,s}$, where $\chi_i$ is the end-member mole fraction, and $\Omega_i$ is the saturation degree of the pure phase corresponding to each end-member.

Figure 10:
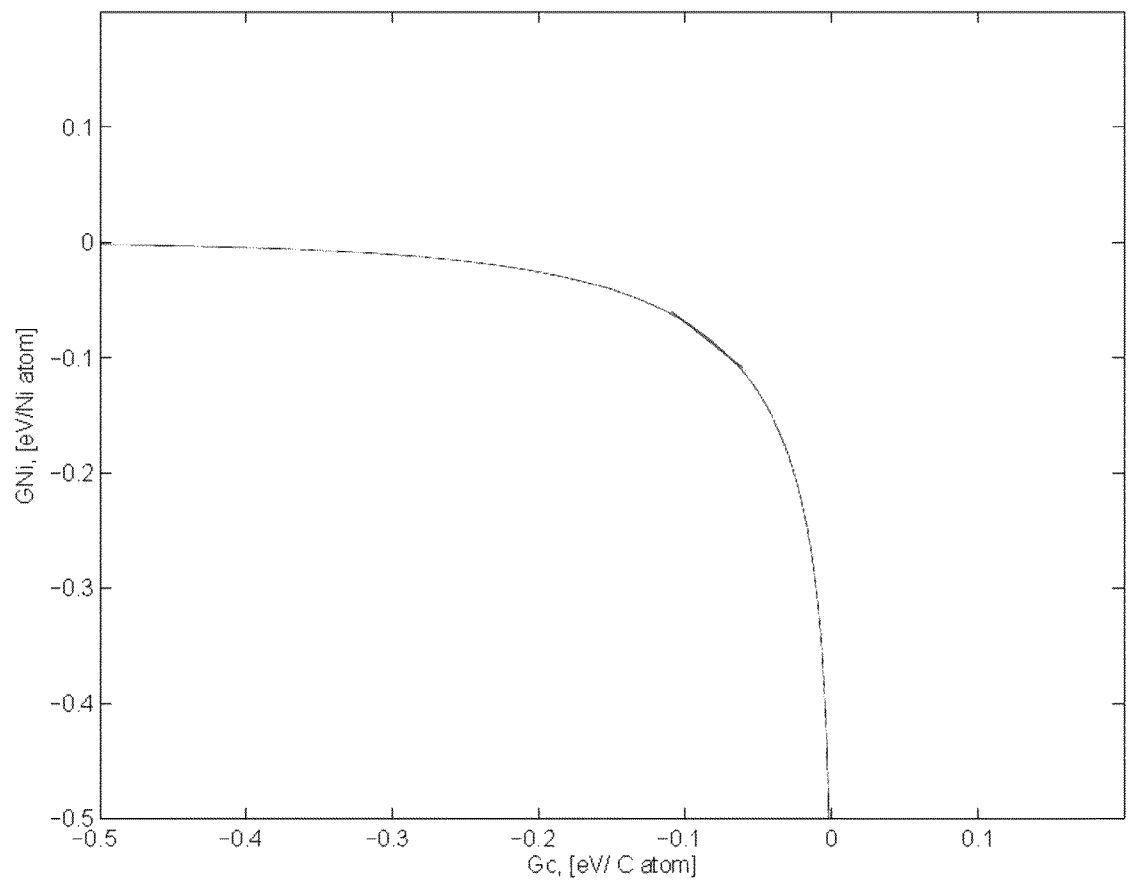
FIG. 10 is a graph showing the energy of precipitation per atom of C vs. energy of dissociation of Ni from a solid-solution of C in Ni.

This saturation degree is the ratio of the activity product of the end members (including Graphite and Ni), and the equilibrium constant of the dissociation reaction of solid solution into the ex-solution. The equilibrium between a saturated solid-solution system and its precipitate or ex-solution end-members can thus be represented by a curve consisting of compositional points, whose coordinates are $\Delta G_{C/ss}$ and $\Delta G_{Ni/ss}$, the individual Gibbs free energies of dissociation (per atom) of the solid solution (ss) to an ex-solution of end-members. See FIG. 10. At any given point the tangent to the curve demarcates the region of precipitation and solution. For a binary solid solution, these overall Gibbs free energies are defined as:

$$\Delta G_{C,ss} = kT \log(\chi_c) \quad (18)$$

$$\Delta G_{Ni/ss} = kT \log(1 - \chi_c) \quad (19)$$

$$\Delta G_{Csol}^{ss} = -\Delta G_{C,ss} + \Delta G_{Ni/ss} = -(E_{C-C} + E_{Ni-Ni} - 2E_{C-Ni}) \quad (20)$$

A consequence of the above reasoning is an expression for the concentration of C (atoms/unit volume) in a Ni—C solid solution (NiC)ss. This can be expressed as:

$$[C]_C^{Ni/Css} = \frac{\chi_c}{1 - \chi_c} \frac{N_A}{V_{M,Ni}} \quad (21)$$

Equivalently combining various equations above gives an expression for the solubility of carbon in a saturated Ni—C solid solution system:

$$[C]_C^{(NiC)ss} = \frac{N_A \exp\left(\frac{-\Delta G_{sol}}{kT}\right)}{V_{M,Ni}} \quad (22)$$

Assume, for example, that at the point of precipitation from a saturated solution, the concentration of carbon atoms in the Ni matrix is [C], then the flux of atoms crossing per unit area and unit time is $\Gamma$ [C], where $\Gamma$ is a proportionality constant, which depends on the effective diffusion constant of C in Ni. $\Gamma$ [D(T)] is therefore an activated pre-exponential factor. The concentration (ratio of filled to total available lattice points) in the precipitate is 1. If it is assumed that the heat of solution of the C (with respect to graphite) in Ni is $\Delta G$, then in the solution, the concentration is given by $$\exp\left(\frac{-\Delta G_{sol}}{kT}\right)$$

and the flux is $\Gamma$ $$\exp\left(\frac{-\Delta G_{sol}}{kT}\right).$$

As the Ni—C/glass system is cooled, the large mismatch in expansion coefficient between the Ni and glass induces an interfacial strain, which increases the enthalpy of solution of C in Ni. This in turn causes the solid solution at the interface to be super-saturated. This event initiates the formation of an ex-solution. If the precipitation requires a strain energy Ws per atom of C, then the outward flux from such a surface is given by $$\Gamma \exp-\left(\frac{\Delta G_{sol} + \Delta Ws}{kT}\right).$$

Therefore the net flux (Jin−Jout=Jp) $J_p$ of C atoms precipitated from an incoming saturated solution at the interface at the support side (z=h) is given by:

$$J_{p,h} = \Gamma \exp\left(\frac{-\Delta G_{sol}}{kT}\right) \times \left(\Omega_{c,s} - \exp\left(\frac{-\Delta W_s}{kT}\right)\right) \quad (23)$$

where $\Omega_{i,s}$ is the degree of over-saturation state of C solute in the unconstrained Ni—C matrix. From the above equation, it becomes clear that dissolution, diffusion, as well a precipitation are temperature activated processes. By determining the concentration of C at the delaminated Ni surface as a function of temperature Tq just before quenching allows the extraction of the heat of solution.

For simplicity, it is assumed that a cylindrical island C precipitate of volume V containing≈N×R² atoms of C, the total Gibbs-free energy of formation is given as the sum of energy of precipitation $-G_{sol}$, strain energy $W_s$ as well as surface energies and perimeter energies. The precipitation of a solid phase from a liquid matrix is governed by a balance between the thermodynamic driving force and the energy penalty for creating new solid-liquid surface interfaces. This determines the size and shape of the precipitates. The precipitation of a solid phase from a solid parent phase is very similar.

$$\Delta G = \frac{V_c}{N_A}(-\Delta G_{sol} + \mu\delta^2 NR^2 + (\sigma_{g-G} + \sigma_{G-Ni})R^2 + \sigma*R) \quad (24)$$

where $\mu$ is the shear modulus of the graphitic precipitate and $\delta$ is the lattice mismatch between precipitate and matrix.

From the above, $\Delta S$ can be expressed as a function of R and N; in other words, the respective amount of strain energy involved in precipitating an atom along the girth versus along the thickness of the island. Using a minimization procedure of the above quantity provides a relationship between the radius and thickness of the precipitate. It can be shown that lamella structures with N/R<<is favored during precipitation. Because G has the entropy term, at high temperatures, the –TS term in the Gibb's free energy stabilizes the solid solution further after precipitation, which then causes a phase change providing the extra energy for the island to grow.

Example Density Functional Model of C in Ni Above Curie Temperature

Density functional theory in CASTEP and VASP was used to study the onset of graphene island growth on a large Ni(111) surface in order to determine the step-edge energy and eventually the critical island size. A graphene layer on Ni(111) lies commensurate to the surface. The bulk lattice constant of graphite is 2.46 A; thus, by forming the layer on Ni, a slight expansion may be needed to match the 2.48 A lattice constant Ni(111) substrate. Experimental structure determination on the (graphene overlayer)/Ni(111) system using extended energy-loss fine-structure spectroscopy yielded a model with two types of carbon at threefold hollow sites: one located at an fcc site, and one at an hcp site. The same model is used herein for the interface. A structural model with one carbon atom located at the on-top site of the outermost Ni atoms and another carbon atom at the fcc hollow site gave the best fit. See FIG. 6B. The stabilization of graphene on Ni(111) was calculated using the two mentioned models. A four-layer slab was used where the two upper layers of Ni and the carbon atoms were allowed to fully relax.

To obtain an estimate for the step-edge energy of the graphene step-edge of the island, DFT calculations were performed on the structure. Half the carbon atoms of the structure had the coordination of the infinite graphene overlayer with three neighboring carbon atoms, and the other half of the carbon atoms were under-coordinated edge atoms in the zigzag configuration. The coverage of carbon was four atoms (two bulk-like, two edge-like) to three Ni atoms in the lateral unit cell (2C: 1Ni for the graphene overlayer). For this calculation, a four-layer slab with the two topmost Ni layers and the carbon atoms fully relaxed was chosen. The step-edge energy was calculated as:

$$E_{step} = \frac{E_{C,Ni} - E_{Ni} - 4E_G}{2} \quad (25)$$

where E(C, Ni) is the total energy of the graphene edge calculation, E(Ni) is the total energy of the clean Ni surface, and $E_{graphene}$ is the energy of a carbon atom from the calculation on a graphene-covered surface. In the calculation setup, there were two carbon edge atoms in the supercell and for the edge energy per C atom, and it then was found that $E_{step}$=1.8 eV/C atom.

A previous DFT study calculated the edge energy for a carbon nanotube and found values of 2.2 and 2.99 eV per carbon edge atom, depending on the termination of the nanotube. In these calculations on nanotubes, there is of course no interaction between the unpaired electrons at the edge and a substrate. This leads to the much higher edge energies. When the graphene layer is at the Ni surface, the unpaired electrons of the edge carbon atoms attempt to establish bonds with the underlying Ni neighbors. In the present calculations, for the relaxed geometry of the carbon string, deviations from the planar graphene hexagons were shown. The C edge atoms are 0.28 A closer to the surface than the C atoms that are surrounded by three C neighbors. This stabilizes the edge, and the edge energy per C atom in the graphene overlayer is lower than the values for the carbon nanotube. For carbon, the most stable form is therefore the graphene layer on Ni(111), which is 0.33 eV more stable than that adsorbed at the step and the least stable atomic carbon on Ni(111).

The stability of a graphene island on Ni(111)/Si interface was determined by two contributions to the total energy, namely, the expenditure of creating the step-edge energy, and the energy gain of forming the surface and bulk graphene inter-layer. When the graphene island formation sets in, the number of C edge atoms is relatively high compared to the number of atoms in the bulk of the graphene island. This means that in the beginning the cluster is unstable. At a certain critical cluster size, the cost of forming the edge is balanced by the gain of forming the island, and for clusters larger than the critical cluster size, the stability increases with the number of atoms in the island. The critical radius is estimated herein by minimizing the difference in free surface energy with respect to area S of such an island (radius r).

$$\delta F = F_1 - F_0 = \left((\gamma_{Ni-G} + \gamma_{G-Si} - \gamma_{Ni-Si}) + \frac{E_{step}}{ra_0}\right)dS \quad (26)$$

Using experimental values from Lander as well as a being equal to 0.246 nm, the critical radius was found to be 6 nm. In fact, from in situ Raman studies of the D/G peak ratio (see FIG. 7), one can estimate the size of such islands as 5.86 nm at 10 s in growth time. The islands coalesce into a continuous film at time $T_G \approx 1$ min for the growth conditions described above in the "Example Mechanism of Graphene Formation on Nickel/Glass Interface" section.

The following also was noted:
  Adsorption energy is negative, 5-6 eV/atom range. Individual carbon atoms interact strongly with the Ni surface.
  Carbon tends to maximize its number of Ni neighbors.
  Feels best at kinks, step edges or semi octahedral (100) surface sites.
  They should lead to bulk carbide formation, but they are perhaps not stable at the temperatures involved (which in this case was 750 degrees C.), as can be seen from a generated reference phase diagram.
  Size effects give rise to limited solubility of C in bulk Ni. In fact, molar volume very similar.

Positive energy of solution was +0.5 eV/atom.
Close to surface, the size effect can be relaxed.
There is a larger C concentration in the subsurface.
sp² carbon interacts weakly with the Ni surface.
Adhesion of the graphene layer on Ni(111) is very near naught.

Illustrative Driving Force for Carbon Diffusion Through Nickel

As noted above, at the heart of the driving force is believed to be the difference in solubility of carbon at the gas/metal and the metal/glass interface. A thermodynamic basis now will be presented for this difference in solubility. The same reasoning is applied to gas mixtures with different composition in contact with iron or nickel, and which are considered to be in equilibrium respectively with graphene and a-C. This is illustrated here for a mixture of acetylene and hydrogen in contact with nickel:

(27)

Increments in Gibbs energy is given below for when this quantity is minimized as the system reaches equilibrium. The expression for the equilibrium constant for this reaction is at the gas side of the nickel catalyst.

$$\Delta G = SdT + VdP + \sum_{ij}\left(\mu_i + \gamma_i \frac{Vm}{r}\right)dn_i \quad (28)$$

At equilibrium (dT, dP=0), the above equation when applied to the chemical reaction at the gas side of the Nickel can be rewritten as:

$$\Delta G = \mu_C^{oNi} + \mu_{H_2}^o - \mu_{C_2H_2}^o + \frac{1}{2}RT\log\left(\frac{P_{H_2}}{P_{C_2H_2}}\right) \quad (29)$$

The chemical potential of C dissolved in nickel in a diluted form is:

$$\mu_C^{Ni} = \mu_{co}^{Gr} + RT\log(\kappa\chi_C^{Ni}) = \mu_C^{oNi} + RT\log[C]_C^{Ni} \quad (30)$$

From the above equation, the driving force for conversion of the dissolved carbon in nickel to graphite at equilibrium can be derived:

$$\Delta\mu^o = \mu_C^{o,Ni} - \mu_C^{o,Gr} = RT\log\left(\kappa\frac{V_{m,Ni}}{V_{m,C}}\right) \quad (31)$$

It is then possible to derive a statistical distribution for graphene islands just prior to percolation.

Figure 11:
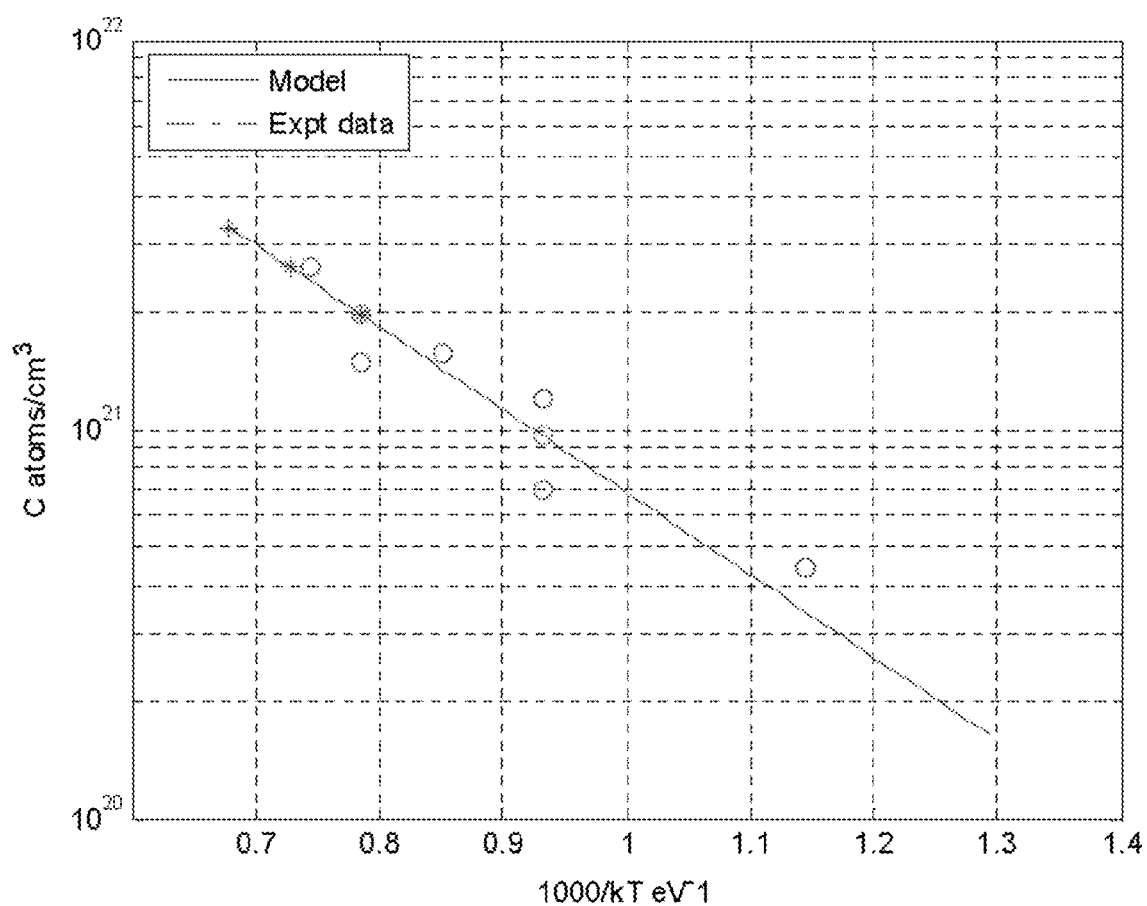
FIG. 11 is an Arrhenius plot of actual XPS-derived and theoretical fits of concentration of C atoms in a super-saturated solid-solution of a-Ni/c-Ni—C at the interface vs. the reciprocal of quench Temperature T, and the temperature is greater than or equal to the Curie point $T_c$.
Figure 12:
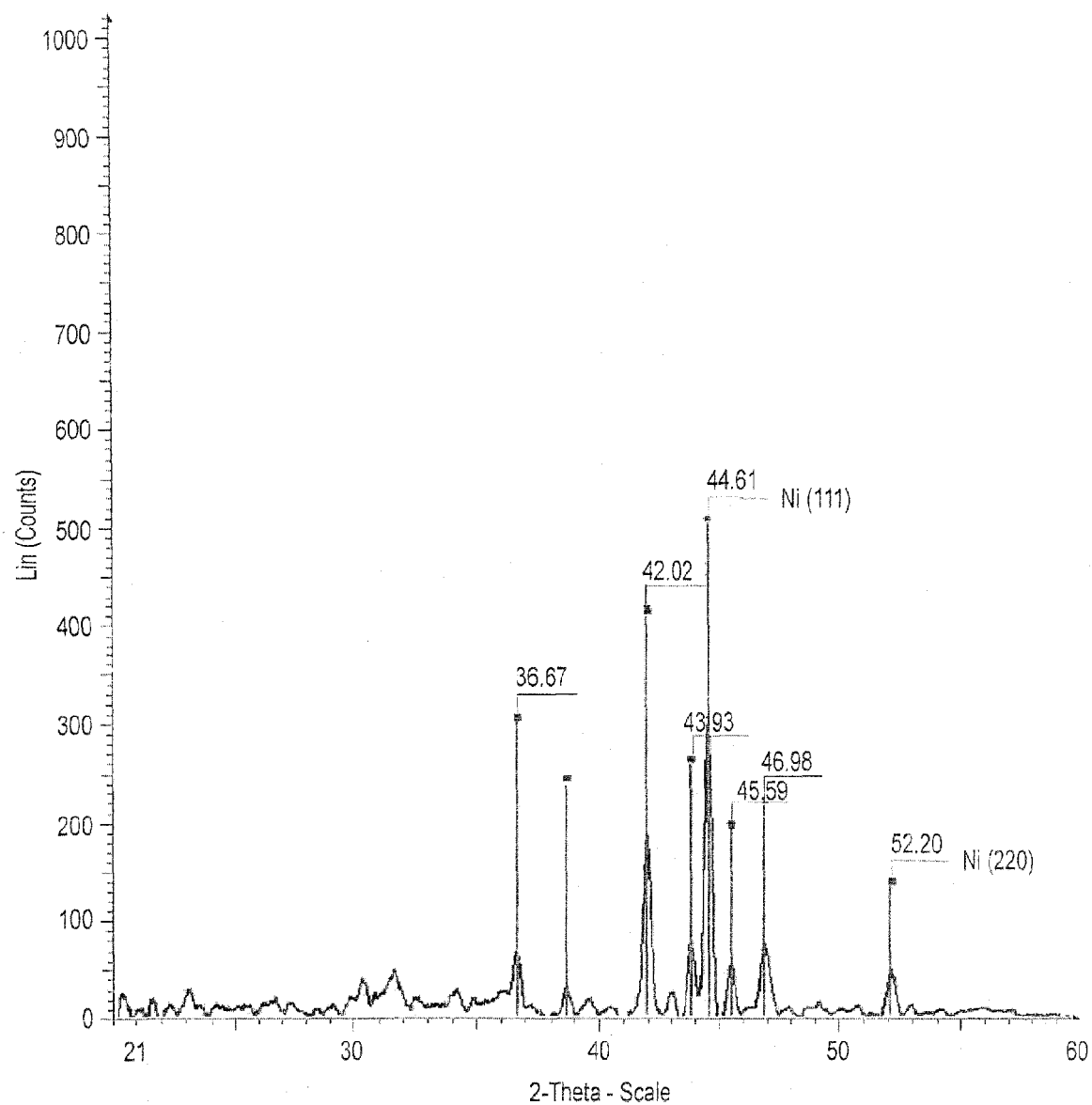
FIG. 12 shows XRD data for Ni on a Si wafer following heat treatment at 650 degrees C. in connection with a sample made in accordance with the example techniques described herein.

FIG. 11 is an Arrhenius plot of actual XPS-derived and theoretical fits of concentration of C atoms in a supersaturated solid-solution of a-Ni/c-Ni—C at the interface vs. the reciprocal of quench Temperature T. The temperature is greater than or equal to the Curie point $T_c$. FIG. 12 shows actual XRD data for Ni on a Si wafer following heat treatment at 650 degrees C. in connection with a sample made in accordance with the example techniques described herein.

Kinetics of Example Graphene Precipitation

While thermodynamics allow process control parameters to be understood, the reaction is initiated in a manner that the kinetics allows to occur quite quickly, especially in the presence of the Ni catalyst. For this technique to be effective, the diffusion length of carbon in Ni may be greater than the diffusion length of nickel into the substrate. Under process conditions (Pc, PH, T) away from the ZP point, a surface layer of a-C readily forms via dissociative adsorption of hydrocarbons on the surface of the Ni. A thin layer of a-C carbon is formed on the surface of the nickel catalyst. The hydrocarbon gas permeates through this layer at the pressure and temperatures involved. This process can be modeled as a permeation of hydrocarbon gas through the a-C in tandem with the nickel thin film catalyst. Permeation includes two steps, namely, dissolution and diffusion. First, the gas dissolves and then diffuses. In this case, there are two layers in series: a-C, and Ni. When the C gas arrives at the interface of the Ni/glass, it precipitates into graphene or graphite if the temperatures are low enough (the most stable form of C) so that the C solution in Ni becomes oversaturated. It is assumed that a dissolution phenomenon that obeys Henry's dissolution is occurring. It is further assumed that the gas dissociates upon contact. Thus:

$$[C]C_2H_2 = S \times P^n \quad (32)$$

where [C] is the concentration (moles of the gas/m3 of film barrier), P is the partial pressure of the gas (Pa) that is in contact with surface, and S is the net solubility constant at the temperature.

After dissolving, the gas diffuses into the metal film towards the support side. Fick's law can be used to evaluate the net incoming flux Γ and is given by:

$$\Gamma(P, T) = \frac{D_{net}(T) \times S}{\delta} P_{C_2H_2}^{1/2} \quad (33)$$

The net effective diffusion constant D is the series diffusion constant and the product $D_{net} \times S$ is the permeation constant. The catalyst film thickness is given by δ. Because true equilibrium is reached after a long period of time (e.g., long enough for Ni to start diffusing into the substrate), the transient case that leads quasi-equilibrium is considered under the proper boundary conditions with the interface at z=0.

$$\frac{\partial C}{\partial t} = D\frac{\partial^2 C}{\partial z^2} \quad (34)$$

$$C(0 < z < \delta, t = 0) = 0,$$

$$C(z = \delta, t \geq 0) = C_a = P_{C_2H_2}^{1/2} \times S_0\exp\left(\frac{\Delta G_{sol}}{RT}\right) \quad (35)$$

$$C(0, t > 0) = 0,$$

By combining the above, the flux ($\Gamma_{int}$) of carbon atoms being precipitated at the interface of Ni/glass is given as a function of time:

$$\Gamma(t, T) = C_a\left[\frac{D(T)t}{d} - d/6\right] \quad (36)$$

From this, a metric τ is derived and is a time constant for which the above relation holds true when:

$$\tau \approx \frac{d^2}{6D} \tag{37}$$

The above equations allow to for the determination of D if F can be tracked by in situ Raman analysis as each graphene layer precipitates as a function of time. By plotting the intensity of the Raman signal (e.g., the broadness of the 2-D peak) as a function of time, one can deduce from the gradient the value of D and the intercept of the concentration of carbon at the surface of the nickel. If one performs this at various temperatures, one can also deduce the solubility of C in nickel and hence derive a value of $G_{sol}$.

Dynamic Interfacial Stress for Example Graphene Growth

In this section, the example C-diffusion growth model provided above is extended to include the evolution of stress in the film growing at the Ni/substrate interface. See FIG. 11 for a graph plotting experimental data and fitted model data. Consistent with the original assumption that mobility of C is much larger than Ni, C atoms diffuses through the Ni and form isolated graphene islands prior to their coalescing into a continuous film. The high mobility of C atoms implies that such islands have a very low aspect ratio, and FGL isolated islands may form prior to coalescence. The in-plane diffusion constant of the C atoms is also high enough to allow for two competing growth processes, namely, (i) nucleation, growth, and coalescence of 2D terraced islands vs. (ii) direct capture of diffusing C atoms at the step edges so as to stitch a continuous GL film. It is assumed in certain example embodiments that C atoms diffuse from the interface of the bottom Ni/graphene island to the island boundary and all the way down the graphene/glass interface, and the Ni at the glass/Ni interface is pinned, allowing growth of the interfacial graphene to be modeled.

While the islands are being formed, there exists a tensile stress component $\sigma_i$ that is assumed to be a constant at a given spatial density of island of average size R. The case just prior to when the step edge growth overcomes island formation to close the island is modeled. Two mechanisms for compressive stress generation prior to island coalescence are invoked. One is a mechanism for compressive stress induced by surface stresses acting on individual graphene islands, and the other is a mechanism for compressive stress induced by C atoms inserting themselves at the grain boundaries between interacting islands. This model assumes fast diffusion of carbon along the island boundaries so that the stress is uniformly distributed throughout the film thickness. The net bi-axial stress ($\sigma_{net}$) in a film of thickness z growing at a rate of $\dot{z}$ can then be written as:

$$\sigma(z(t)) = \sigma_{net} - \sigma_{com} = \sigma_i - \sigma_0 N_{ge} \frac{a}{z} \tag{38}$$

where the L is the average size of the terraced island, and where $\sigma_o$ is the compressive stress induced in inserting an extra layer of C atoms within an inter-island edge (at interatomic distance a):

$$\sigma_0 = (E\alpha)\frac{a}{L} \tag{39}$$

The driving force for C diffusion into the channel between the graphene island edges is the difference in chemical potential between the center of the island and the edge boundary, which (from the equations above) can be expressed as:

$$\Delta\mu = \mu_{is} = \mu_{ie} + \sigma V_m \tag{40}$$

$$\frac{n_{ge}}{n_{is}} = \frac{N_{ge}}{N_{is}} = \exp\left(\frac{-\Delta\mu}{RT}\right) \tag{41}$$

The origin of this difference in chemical potential can be traced back to the chemical gradient that is introduced in the previous section between the gas side to the support side of the Ni film. σ is the stress that exists across the zone edge boundary and Vm is the molar volume of graphite. The rate of atomic flow from the island surface into the island boundary then follows as:

$$\frac{\partial N_{ge}}{\partial t} = N_{is}\nu\exp\left(\frac{-\Delta\mu}{RT}\right) \tag{42}$$

where ν is C atomic transition rate from island interface to zone-edge boundary, and R and T keep their usual meanings as the molar constant and thermodynamic temperature, respectively.

At a given density $n_{is}$ corresponding a given rate of arrival of C atoms at the support side of the catalyst film, one can compute $N_{ge}$, or the number of atoms reaching the boundary regions, which then allows the stress in the film to be determined. Making the reasonable assumption that μ<<RT and combining equations (38) and (41), the rate of change of stress in the film can be expressed in an ODE that has solutions in two limiting cases. From the previous section dealing with the activation energy for graphene segregation, one can arrive at an estimate of the value of δμ, which then allows for an independent verification of the stress or if the latter stress is known then an estimate of δμ is possible.

$$\frac{d\sigma}{dt} = -\frac{\sigma_0 a}{z}\nu\frac{(\delta\mu + \sigma V_m)}{RT} + (\sigma_i - \sigma)\frac{\dot{z}}{z} \tag{43}$$

Case 1: Steady State Film Stress

The steady-state stress is obtained by setting the left term in equation (43) to zero. Net film stress is then given by:

$$\sigma_{ss} = \frac{\sigma_i - \sigma c a/\tau_s \dot{z}}{1 + a/\tau_s \dot{z}} \tag{44}$$

where a time constant $$\tau_s = \frac{RT}{EV_m}\frac{L}{a\alpha\nu N_{is}}$$

can be defined for this state to be achieved. It is noted that value of the steady stress can take an upper bound tensile or lower bound compressive value, depending for example on whether the film growth rate $\dot{z} \gg \alpha/\tau_s$, whereby $\sigma \to \sigma_i$ and $\dot{z} \ll \alpha/\tau_s$ whereby $\sigma \to -\sigma_c = \delta\mu/V_m$.

Case 2: Zero Growth Rate Stress

When the growth rate tends to zero, e.g., when the feedstock precursor gas is turned off or temperature is reduced to below the threshold for catalytic decomposition on the gas side of the catalyst film, one can solve equation (44) to give:

$$\sigma(t) = \sigma_f - (\sigma_i - \sigma_f)\exp(-t/\tau_{zg}) \tag{45}$$

Thus, when growth is interrupted, stress decays exponentially to a value of with a time constant $T_{zg} = (z/a) \times \tau_s$ where z is the film thickness which can be determined by Raman 2-D peak and $\tau_s$ is defined above.

Under this condition, $\Delta\mu$ the main driver for this reaction, as well as the rate of film growth $\dot{z}$ also, tends to zero. It is noted that by turning the gas on and off at a given temperature, the net stress in the graphene will modulate between a upper bound tensile to a lower bound compressive as the islands start to coalesce. This prediction of the model can be captured by the Raman since there will be a shift due to softening or stiffening of the Raman phonon. G or 2-D peak shifts can be monitored.

The change of lattice constant during island growth does not induce a stress as long as the island can move on the substrate. A basic assumption of the early stage compressive stress generation is that the island is firmly attached to the substrate when it is beyond the certain critical size (Rcr). In this sense, the lattice constant of the island is locked down from that point and does not change on further growth. However, the equilibrium lattice constant will keep changing, approaching that of the bulk material during growth. Therefore, the difference of lattice constant between the equilibrium and the actual value will create an internal stress in the island, and the stress can be estimated by fixing the temperature of, for example, 600 degrees C., and monitoring the Raman shift of either G-peak or 2-D peak while controlling the relative partial pressures of $C_2H_2$ to sequentially favoring graphene precipitation and graphene etching from the gas side of the Ni film catalyst.

Case 3: Extrinsic Sources of Stress—Lattice Mismatch and Creep

In the above model, the grain boundary "zipping up" does not happen at once. After the initial coalescence, the grain boundary formation may proceed layer by layer when it is energetically favorable. If the distance between two layers is too far, the layers may grow laterally during deposition until the attracting force is large enough to pull together. This mechanism produces less tensile stress than the traditional zipping up processes, which often overestimate the tensile stress.

Figure 13:
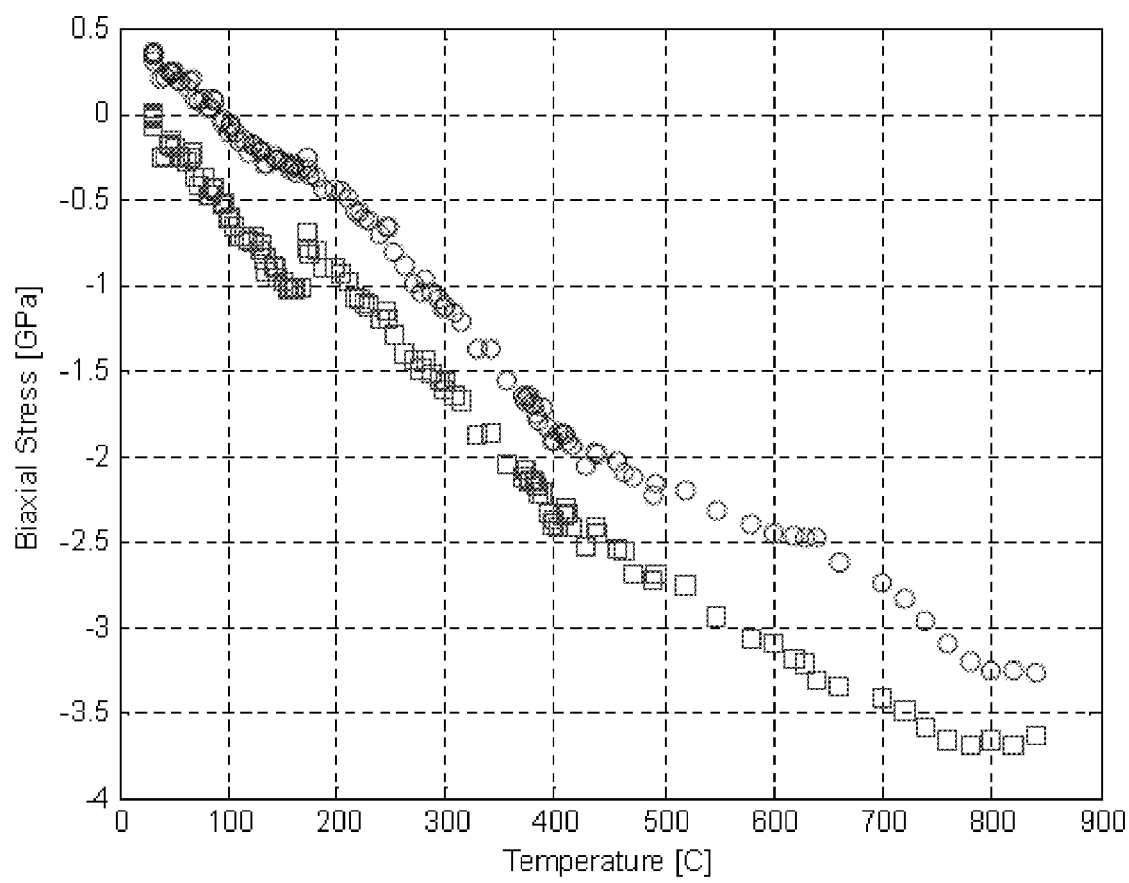
FIG. 13 plots biaxial stress against temperature for a sample made in accordance with certain example embodiments.

Example Stress-Induced Softening and Stiffening of Raman Modes at Fixed Growth Temperature It is well known that softening of the Raman modes happens as temperature is increased. See FIG. 13, which plots biaxial stress against temperature for a sample made in accordance with certain example embodiments. It is proposed herein that the red-shift of the Graphene films due to temperature be baseline for a standard film grown in the reactor. This baseline can be used to track the red or blue shift due to stress changes.

An Example Continuum Interfacial Stress Model

Thermal Stress Evolution: Heat Ramp-Up

Tensile stress in the as-deposited nickel catalyst film may originate from excess volume. From the electron and XRD data, the films are amorphous in the thickness range of 100 nm to 1 micron. The constraint imposed by the strong bonding between film and substrate implies that neither sliding nor inter-diffusion can occur at the film/substrate interface. As the Ni film is thermally annealed, the bi-axial stress emerges from these two main constraints. The first component originates from the extrinsic stress due to thermal mismatch between Ni and the substrate (Si or glass). Since the expansion coefficient of Ni is higher than the substrate, a strain develops and a compressive stress is induced during heating. This stress is superimposed on the original tensile stress. It is noted that the stress may revert back towards tensile upon cooling. From the thermo-elastic data between room temperature to 500 degrees C., the thermal mismatch stress accounts for most of the compressive stress. As temperature increases, the magnitude of the rate of change of film stress with respect to temperature decreases. This decrease is attributed to the phase change in the film which turns from amorphous to nanocrystalline as evidenced in both the TEM as well as XRD data. In order to account for the second source of stress, one turns to the heat-induced changes in the micro-structure of the film (from amorphous to nanocrystalline) with a predominantly (111) texture. By including the effects of grain boundary self diffusion and thermally activated dislocation motion, the average film stress is reduced by a factor which depends on the ratio of grain size to film thickness. With full grain boundary relaxation and no further diffusion, the average stress follows a thermoelastic line with a reduced slope of:

$$\frac{d\sigma}{dT} = -(1-\theta)\Delta\alpha M \tag{46}$$

where $$\theta = \frac{d}{t_f}\tanh\left(\frac{d}{t_f}\right) \tag{47}$$

Figure 14:
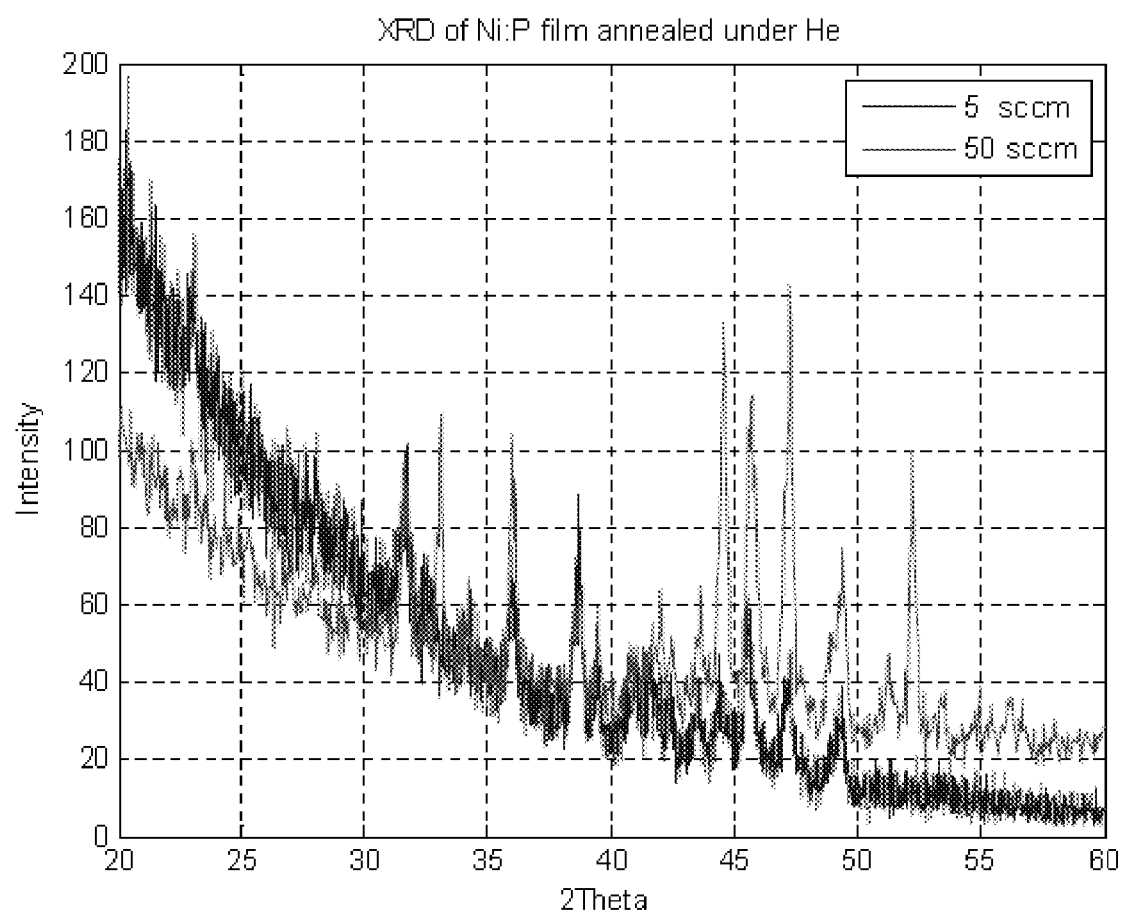
FIG. 14 is an image showing the results of an XRD scan of Ni annealed at 700 degrees C. under different He flow rates.
Figure 15:
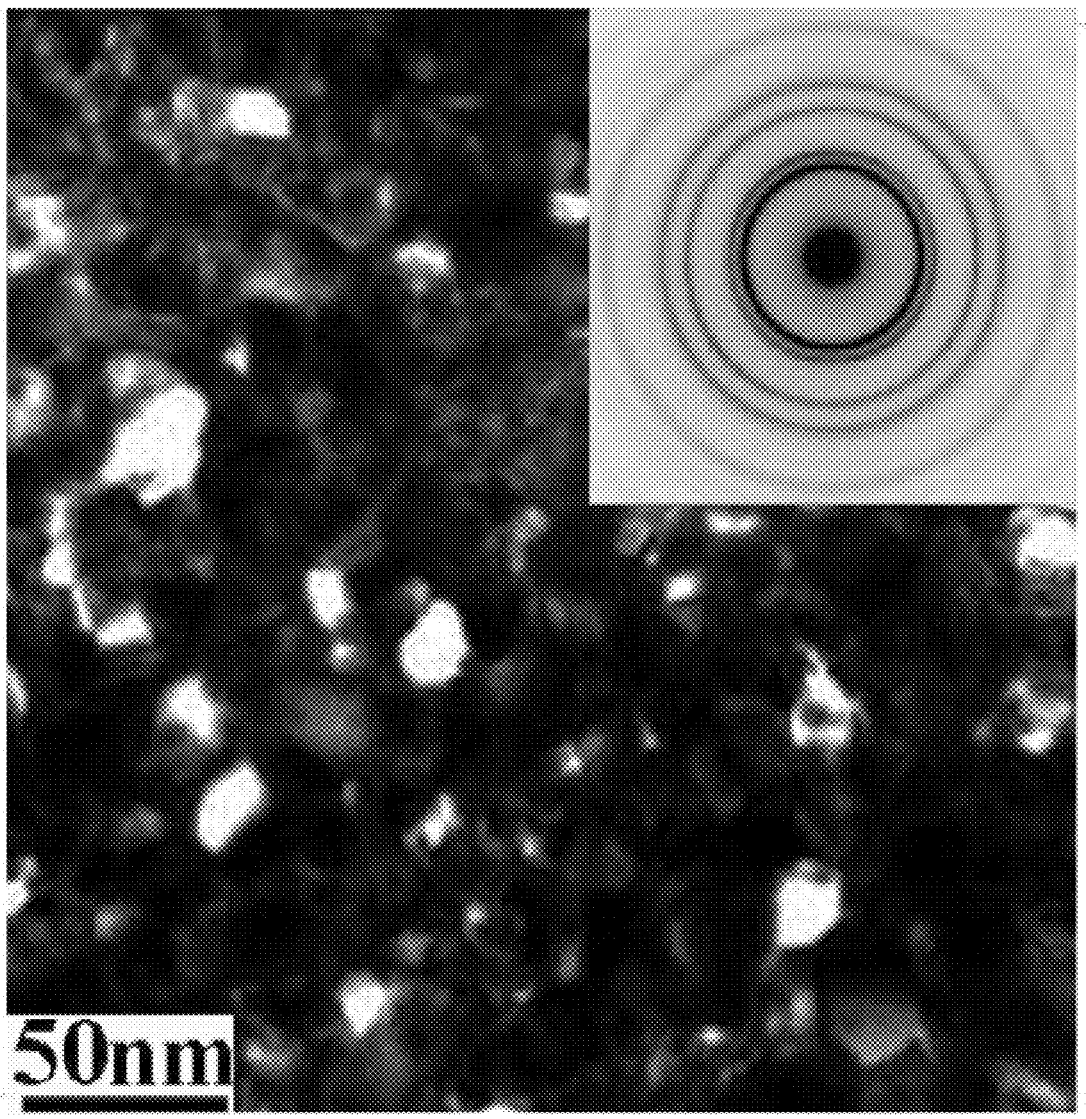
FIG. 15 includes photomicrographic images that help demonstrate certain principles of the disclosure.

FIG. 14 is an image showing the results of an XRD scan of Ni annealed at 700 degrees C. under different He flow rates. See also the FIG. 15 micrographs.

By including the effects of grain boundary diffusion and thermally activated dislocation motion, the average film stress depends on the ratio of grain size to film thickness. With full grain boundary relaxation and no further diffusion, the average stress follows a thermoelastic line with a reduced slope of:

$$\frac{d\sigma}{dt} = -(1-\theta)\Delta\alpha M \tag{48}$$

During annealing the films are sequentially exposed to (i) He ion implantation by linear ion beam and then (ii) hydrocarbon gas. Above temperatures $T_m/4$, migrating He atoms are trapped as precipitate or clusters inside the metal films. Helium is highly mobile as an interstitial; however, they may be highly unstable and may be trapped by vacancies in the Ni structure. Such vacancies can trap as many He as possible, but when the number exceeds more than about 5, a Ni atom may be expelled as a self-interstitial rather than a helium atom.

$$\text{He}_n(V) \stackrel{ksol}{\longleftrightarrow} \text{He}_{(n-1)}(V) + \text{He}_{int} \tag{49}$$

The effect of He on the film stress manifests itself during cooling where the He precipitates out of the metal lattice. One can thus calculate the amount of strain due to inclusion of He interstitials into the Ni film. As the interstitials agglomerate, He nanoscopic inclusion bubbles will swell by a factor $S_w$ given by:

$$S_w = \frac{[\text{He}]}{[\text{Ni}]} \bigg/ \frac{[\text{He}]}{[V]} \tag{50}$$

He segregation therefore produces a lattice dilation which to a first order is given by:

$$\varepsilon_v = 3\frac{da}{a_0} = (p - 2\gamma/r)\frac{S_w}{(1-S_w)}\frac{1}{Y} \tag{51}$$

Helium inclusions therefore increases the tensile component in the Ni film, which then tends to over-shoot the initial stress prior to heating. Eventually, e.g., as the film cools down, a net tensile stress develops. The interface between the film and the substrate expands relative to the gas side surface of the Ni. As nickel is heated, it crystallizes and as grain size increases, treatment to He contribute to overall dislocation density in the metal film. Dislocations distort the crystalline lattice around them. These distortions around a dislocation in a crystal can be dilatational (the distance between planes is more than what it should be) or compressive (the distance between planes is less than what it should be). Such distortions (strains) cost the system energy.

Evolution of Stress During C Diffusion

At high anneal temperatures (e.g., above 700 degrees C.), C atoms in the gas feedstock dissolve and diffuse very rapidly through the entire nc-Ni film catalyst. C diffuses through Ni film via both the grain boundaries and grains (via interstitial sites as well as vacancies). On a local scale, the grain boundaries act as sinks for C atoms where, as the C/Ni ratio increases, segregation and precipitation does take place when the Ni—C solid solution becomes oversaturated. Initially, as diffusing C enters the nc-Ni structure, a net positive volumetric change translates into a net compressive stress that is additive to the external thermal stress. But these stresses are annealed out over a time scale that is much shorter than the time for graphene formation. As with lattice diffusion, grain boundary diffusion is described in terms of an Arrhenius expression with an activation energy Ea (1.62 e V/C in bulk Ni vs 0.77 eV/C at GB), between favorable segregation sites. However, a biaxial stress in a thin film can influence both the diffusion coefficient, as well as the diffusion driving force that is connected to the chemical potential gradient. In certain example embodiments, the film stress modifies the boundary conditions of the diffusion problem. Film stress also affects the efficiency of both sources and sinks for C interstitials (e.g., grain boundaries and interfaces). As the concentration of dissolved interstitials increases through the depth of the film, equation (48) above is modified to take into account the stress increase due to C incorporation into the Ni film. Eventually, at some threshold value, work must be done by the film's stress. One outcome of this work is the onset of C precipitation (at $T=T_{prec}$), which is surmised occurs when the super-saturated solid solution is in quasi-equilibrium with segregated C at the grain boundary:

$$\frac{d\sigma}{dT} = -\Delta\alpha M + \frac{\Delta G_{sol}}{T\Delta V} \tag{52}$$

At $T=T_{prec}$, the gradient in the stress-temperature curve tend to zero and since $-\Delta G_{sol}=\Delta G_{prec}$ (heat of precipitation per C atom and the net creation of volume being the molar volume of graphite, an expression for heat of precipitation from the stress-temperature curve is then given as:

$$\Delta G_{prec} = -\Delta\alpha M V_{M,C} T_{prec} \tag{53}$$

From the experimental values, one extracts a value of −0.2 eV/atom for the heat of precipitation at the grain boundary. This value is, within experimental errors, on the same order of magnitude as the value derived from solubility studies of C in Ni. The large negative value of heat of segregation may result in high solute enrichment at the boundary regions, which would eventually increase $E_a$ and slow diffusion of C through "plugging" of the grain boundary. At the onset of C precipitation at grain boundaries, the value of $E_a$ would increase to a level that slows down the rate of C penetration into the film. Additionally, there exists a dependence of diffusion constant on stress is given by:

$$\frac{\partial(\ln D)}{\partial \sigma} = -\frac{\Omega}{RT} \tag{54}$$

Prior to exposure to $C_2H_2$, it is surmised that the main source of excess volume in the Ni catalyst film is grain boundaries and vacancies. In order to account for the second source of stress, one may turn to the heat induced-changes in the micro-structure of the film (from amorphous to nanocrystalline) with a predominantly (111) texture, as it is exposed to permeating C atoms. Experiments by others have revealed that diffusion of C interstitials along Ni grain boundaries was four orders of magnitude faster than lattice diffusion. A combination of depth profiling XPS as well as atomic probe field-ion microscopy to carbon concentration of segregated C is used.

Stress Induced by C Infiltration and Segregation

It is possible to theoretically calculate the stress change, generated in the Ni film during carbon incorporation, and then compare with experimentally measured values. In the case when C dissolves interstitially into an entirely single phase region of Ni, the stress that originates from the molar volume change was theoretically calculated by considering the volume strain, $\varepsilon_{vol}$ (the volumetric change per unit volume). The stress $\sigma_{inters}^C$ is given by $M\varepsilon_{vol}^N$, where M is the biaxial modulus of the nickel film and under the assumptions that the film is single crystalline, the stress is uniformly distributed across the film, and the film has the isotropic elasticity, based upon a hexagonal symmetry with edges dx, dx=dy, dz.

$$\varepsilon_{vol} = (1+\varepsilon_x)(1+\varepsilon_y)(1+\varepsilon_z)-1 \tag{55}$$

where $\varepsilon_x$, $\varepsilon_y$, and $\varepsilon_z$ are the strains in the direction of the x, y, and z axis, respectively. For the small strains, the products of the strains are neglected and, as a result:

$$\varepsilon_{vol} = (\varepsilon_x + \varepsilon_y + \varepsilon_z) \tag{56}$$

Below the elastic limit, the biaxial stress in the film can be calculated from Hookes law, given as:

$$\sigma(T) = -M\epsilon_{vol}/3\chi(T) \qquad (57)$$

from the values of atomic radii for C (0.14 nm) and Ni (0.248 nm) and the lattice constant of fcc Ni which is 0.352 nm and x is equilibrium molar fraction of C soluble in Ni at a given temperature T=850 degrees C., $\epsilon \approx 0.35$ corresponding to a stress of −0.8 GPa (compressive).

However as shown herein, C diffusion results in an accumulation of C in the Ni, which results in segregation yielding a two-phase material (predominantly Ni (111) and nano-graphitic regions in as high as a 1:1 ratio in the center of the film but graded in the z direction), the stress that originates from such a mismatch of the lattice parameters for the two semi-coherent phases is now theoretically calculated by considering the misfit strain. If the inclusion of the nC phase is precipitated in the matrix of the (111) Ni phase, the misfit is then given as:

$$\varepsilon_m = \frac{d_c - d_{111,Ni}}{d_{111}} \qquad (58)$$

Under the assumptions that (i) the plate shape of the inclusion is generated in the matrix, (ii) the elastic stress is exerted on the film, (iii) the film is single crystal, (iv) the stress is uniformly distributed across the film, (v) the film has the isotropic elasticity, and (vi) the principal misfit strains, i.e., x misfit, y misfit, and z misfit, only contribute to the total misfit strain, the mean stress per unit volume of the is then given by:

$$\sigma(z) = -2k\frac{v+1}{1-2v}G\varepsilon_m\chi_c(z) \qquad (59)$$

where k is the ratio of the elastic moduli of the two phases (nanographite and Ni), G is the bulk modulus, and the average strain is $\epsilon_m$. This stress is computed to be −3.13 GPa when xi=1. $\chi_c$ represents the concentration of C in the film. It is noted that this compressive stress will vary as a function of depth in the Ni film, as there is a gradient in the distribution of C. Thus, film at the surface will be under relatively higher compressive stress than at the interface where the boundary condition of adhesion is maintained.

Nevertheless, it is noted that there is the slight discrepancy in the values of measured experimentally and calculated theoretically in each region. One of the probable reasons for this slight discrepancy is the experimental error, which originates from refraction of the laser beam by the film in the measurement of strain. In addition, such assumptions as polycrystallinity of the film, non-uniform stress distribution in the film, various shapes of the inclusion, incoherent mismatch between two phases and inhomogeneity of the elastic constants between two phases, the effect of which was disregarded in the theoretical calculation, also may be sources for the difference between the theoretical and the experimental values. The above assumes coherency between Ni(111) phase and the C nano-regions; however, the mismatch will give rise to the formation of dislocations, which will then try to anneal out the stress over time as T increases.

Thermo-Elastic to Plastic Regime

While C diffusion throughout the entire hot nickel thin film is in the order of seconds and bimodal phase segregation is in order of one minute, the formation of graphene at the interface may however require a longer time scale (e.g., of several minutes), as well as input of heat to the system, despite the fact that $\Delta G_{prep}$ is a sizeable negative number. A kinetics model on a possible mechanism of graphene formation at the Ni/substrate interface below is proposed, and it may help explain the time scale for its formation. This model makes a prediction that can be experimentally validated. The Ni matrix is spatially graded C distribution perpendicular to the plane of the film, and the gradient of this distribution decreases with time. In the carbon rich region near the surface (supersaturated solution of C in Ni) where conditions for phase separation are ripe, nano-graphitic regions are formed from a spinodal decomposition. The mismatch in the expansion coefficient together with the lattice mismatch (e.g., of over 18% between graphite and Ni (111)) then causes the formation of dislocations. The nano-graphitic carbon acts as a source of carbon interstitials that then interact strongly with the dislocations. It is reasonably assumed that n-C has a coefficient of thermal expansion not dissimilar to graphite at $10^{-6}$ K$^{-1}$ at ambient temperature. Ni is at least one order of magnitude higher. At growth temperatures, the intrinsic lattice mismatch between the Ni host matrix and the n-C precipitates is significantly amplified by mismatch in coefficient of thermal expansions. If the coherency strain within the Ni matrix prior to C precipitation is $\epsilon_{coh}$ and then, with newly formed n-C, dislocations should make up for the remainder of the total misfit m (e.g., at least 18).

$$\varepsilon_d(T) = m\left(1 - \frac{\varepsilon_{coh}}{m}\right) \qquad (60)$$

which would result in prismatic punching of dislocations at the interface between the nano-graphitic C islands and Ni leading to work hardening of the matrix.

This hardening work in turn gives rise to observed plastic region in the stress-temperature curve. The plastic behavior of the film past the precipitation temperature can now be modeled by thermally activated dislocation motion, as well as by grain boundary diffusional creep. It is conjectured that a dislocation creep mechanism explains the rapid drop in compressive stress beyond $T_{prec}$. A large tensile flow stress that is caused by dislocation processes being activated that extends well into the cooling cycle is observed. Possible sources of dislocations are grain boundaries that have been observed to emit parallel glide dislocations. The dislocations are absorbed by the interface between the metal film and the Si or glass substrate. As a consequence of the film constraint at the interface, at $T_{prec}$ a stress inhomogeneity develops through the depth of the film from pure compression in the carbon rich region towards tensile in the dislocations dominated region at the interface. Ongoing HRTEM study has shown evidence of the dislocation activity in the vicinity of the grain boundaries in the hot Ni film (which is conjectured to be the source) and has also indicated that the metal film and substrate (whether glass or Si) acts as a dislocation sink. Studies by the Applicant show dislocations that channel on inclined 111 planes through the metal film and deposit a dislocation segment that increases in line length as the threading dislocation through the film. Using Schmid's law to convert the biaxial thermal stress into shear stress required for glide, it becomes clear that only dislocations on inclined planes (111) plane parallel to the interface can glide, the shear stress causing dislocation motion has its origin in the stress variation.

Kinetics of Graphene Formation Via Dislocations

Having provided sufficient evidence of defects such as dislocations, twinnings, etc., in a C loaded Ni catalyst thin film, consideration is now given as to how C impurity atoms in a supersaturated solid solution segregate to the dislocations in order to restore equilibrium conditions. Point defects such as interstitial He introduced into the film prior to exposure to hydrocarbon will also tend to move towards the dislocations. An attempt is made to model the kinetics of segregation. While it is clear that the C impurity atoms migrate as a result of diffusion, the problem is complicated by the fact the dislocations themselves are also diffusing towards the interface while there exists an interaction potential between a dislocation and the C. The kinetics of the segregation then depend on the precise nature of this potential interaction, concentration gradients that develop during the process, etc. One can reasonably posit that once dislocation density, degree of C super-saturation and the interaction potential are well specified, then this problem is tractable, e.g., provided physically sound boundary conditions are used and deduce the rate of C accumulation with time at the interface.

The migration of C to dislocations will be controlled by diffusion and assisted by the exchange interaction energy $\Phi(r)$, which is the net influence of all relevant contributions because of the dislocations on a C atoms situated a distance r having a zone of influence $r_{dis}$ for a given dislocation. This interaction is interpreted as a sum of chemical interaction arising between C impurity and the stacking faults of extended dislocations.

$$J = -D\nabla C - \left(\frac{D}{kT}\right)C\nabla\Phi \tag{61}$$

$$\frac{\partial C}{\partial t} = -\nabla \cdot J = D\nabla \cdot (\nabla C + C\nabla\Phi) \tag{62}$$

Consideration is now given to the case when the above equation is valid in the vicinity of the interface and the case when concentration of C atoms C(r, t) satisfies the parabolic second-order partial differential equation above. While it is recognized that the picture for real dislocation configuration near and at the interface may be extremely complicated, it may be seen as necessary to first idealize the dislocation density function into a more geometrically and mathematically amenable form. t=0 is set at the point when dislocations have moved and accumulated at the interface with an idealized quasi-static dislocation density $\rho$ where the Burger vectors of dislocations are now straight and parallel to the interface. Each is then located at the centre of a cylinder radius $r_p$ satisfying the relation:

$$r_\rho = \sqrt{2}(\pi\rho)^{-1/2} \tag{63}$$

The dislocation density that is generated is dependent on the n-C surface area. The n-C have an advantage because of their small diameter d leading to a lower density of Griffith flaws. The dislocation density generation is likely to be higher, which in turn would result in increased strengthening Dislocation density is given as:

$$\rho = 10\varepsilon_d(T)\frac{\chi}{1-\chi}\frac{1}{bg} \tag{64}$$

where $\chi$ is the volume fraction of precipitated n-C (mean grain size g) in the Ni film and b is the Burger's vector magnitude.

The problem is then reduced to solving equation (62) in a manner that leads to physically realistic feature. Because the original partial differential equation is second-order, it requires definition of two spatial boundary conditions at:

$$C(r_p = \Gamma/d \text{ (as per section) or } C(r\to\infty) = C_o \tag{i}$$

$$C(r=0)=0 \text{ (perfect sink at the dislocation site)} \tag{ii}$$

Two physically sensible solutions to the above problem statement emerge:

Case 1: Pure Drift

Since carbon atoms in the solid solution is being replenished by constant supply from the feedstock hydrocarbon gas, one can make the reasonable assumption that competition for solute atoms between neighboring dislocations can be neglected. It therefore can be assumed that there is a constant replenishment of C at the interface. When flow due to the concentration gradient is ignored and the potential interaction $\phi$ has a purely radial form given by $$\Psi(r) = -\frac{\Psi_0}{r^2} \tag{65}$$

then the pure drift solution is obtained from the first-order equation:

$$\frac{\partial C}{\partial t} = \frac{D}{kT}\frac{\Psi_0}{r^3}\left(\frac{\partial C}{\partial r} - \frac{2C}{r}\right) \tag{66}$$

The above equation can be solved to show that ratio of concentration of carbon atoms arriving at the dislocation in a time t to the initial concentration is given by:

$$C(t)/C_0 = \pi\rho\left(6\pi r_p\Psi_0\frac{D}{kT}t\right)^{3/5} \tag{67}$$

Case 2: Drift and Diffusion

The full solution is now considered, where equilibrium is now reached between the C impurities and the dislocation under condition that the solid solubility is never exceeded at any point near the interface. The time for the concentration of C to reach that of C(o) which is at the surface of the catalyst is then calculated. With the further assumption that the concentration of C remains low in relation to the density of lattice sites available, the concentration is given by directly by MB statistics:

$$\frac{C(t)}{C(o)} = 1 - \frac{2}{\pi}\int_0^d \frac{\exp(-mr^2)}{r^2}dr \tag{68}$$

Kinetics of Growth in a F-D Distribution of Dislocations

As more C diffuses in and a solid solution of Ni—C forms, there typically is a size difference between the different types of atoms. Thus, in a crystalline lattice of a solid solution, there are also strains associated with the different components. The strain fields around the solutes/solvents and the dislocations in the crystal of a solid solution can interact leading to an overall reduction in the energy.

Imagine, for example, a dislocation in a crystal of a solid solution: If the larger atoms of the solution sit in the dilatational regions around a dislocation and the smaller ones near the compressive regions, then the elastic stresses can partly be relieved. This kind of migration of atoms to regions in a crystal where they can relieve the distortions in a lattice the most, leads a clustering of atoms around a dislocation. In order to minimize the interfacial energy, graphene is formed. This energy can be calculated.

Under heat treatment, the dislocations diffuses from the surface acts the precipitation of graphene takes place on a longer time scale and is brought about by the interaction of the C atoms with dislocations inside a fcc metal like Ni can be affected via interactions with the C interstitials. The dislocations may drag interstitials atoms as it moves or glides or form a region of orderly arranged interstitials.

Further Study of Example Helium-Anneal Pathways for Delamination

As indicated above, in situ, dry transfer of graphene onto a target substrate (e.g., a silicon wafer or dielectric $SiO_2$ substrate) may be achieved in connection with selective delamination through microstructural and stress engineering of a deposited Ni-inclusive thin film during CVD growth. As also indicated above, delamination of the Ni film may be promoted by stresses introduced while annealing in a helium-inclusive environment. For example, highly stressed films annealed at atmospheric pressure may undergo in situ delamination and transfer in situ upon graphene formation at elevated temperature. Low pressure CVD conditions have been found to provide less stressed films, whereas ex situ delamination of the Ni-inclusive thin film can achieved by simple pulling with Scotch tape or the like.

Thus, nickel-inclusive films annealed in a helium-inclusive atmosphere using a cold-wall rapid-CVD system may delaminate from the insulating support after the production of bottom-layer graphene at the $SiO_2$—Ni interface, with the bottom-layer graphene remaining on the $SiO_2$ after mechanical delamination of the Ni-inclusive film. Separating the graphene from the nickel-inclusive film may be facilitated by virtue of the weakened adhesions between materials. As explained above, helium trapping and accumulation in the grain boundaries may increase stress of the film. And because the bottom-layer graphene film seems to interact more strongly with the insulator surface during delamination, it may be left behind without any additional processing. The results reported on in this section indicate that the graphene is high quality (Raman $I_D/I_G$<0.2) and comprises micron-size crystals with greater than 90% coverage across a macro-scale as quantified by 2D Raman mapping and TEM with thicknesses ranging from mono-layer to multi-layer.

This section explores in greater detail various principles believed to influence how it is possible to engineer thin film stress and interlayer adhesion to achieve dry transfer of graphene material at a metal/dielectric interface.

In terms of substrate preparation for the samples described below, patterned samples were prepared using standard lithographic processes, before nickel deposition. The nickel was deposited on patterned and unpatterned wafers using an e-beam evaporator (Cooke SJ-20 Evaporator). The pressure chamber was lowered to approximately 20 mTorr prior to depositing 200 nm of nickel at 5 Å/s. The wafers were scribed and cracked into chips 1 cm by 1 cm in size. The chips with photoresist were placed in a beaker first with acetone and gently agitated for 4 minutes and then with IPA for 2 minutes.

Graphene growth for these samples was achieved using a cold-wall CVD system (modified SabreTube, Absolute Nano, as shown in FIG. 1). The custom cold-wall CVD system contained an electric furnace, a 1.5" quartz tube, and a vacuum rotary pump. Substrates were placed on an electrically conductive p-doped Si substrate and rapidly heated to 800-900 degrees C. Pressures during the process were measured at 2 Torr for low pressure experiments or at atmospheric pressure. Methane or acetylene was used as the carbon source for graphene growth. Samples were rapidly heated and annealed under a helium flow for 5 minutes. Growth gases (2:1 $H_2$:carbon source) were then introduced for 1-2 minutes. Samples were then rapidly cooled in inert conditions. Upon returning to room temperature, the Ni film of the samples subjected to low pressure conditions was then removed by Scotch tape.

When it came to characterizing the samples discussed in this section, Raman spectroscopy was obtained using a 532 nm system (WiTEC). Graphene microstructure was characterized by atomic force microscopy (Veeco Dimension Icon) and transmission electron microscopy (JEOL 2100 and JEOL 2010 FEG-TEM). Plan view and cross-sectional TEM specimens were prepared by conventional polishing followed by Argon ion milling. Alternatively, the graphene layers were transferred to lacey carbon TEM grids for plan view imaging. Ni films were analyzed by scanning electron microscopy (FEI Helios Nanolab 650 Dualbeam Focused Ion Beam Workstation and Zeiss Supra55VP FESEM).

Direct formation and transfer of graphene onto $SiO_2$ was achieved using Ni thin films with engineered stress that was controlled by the residual stress from the film deposition process, as well as the stress evolution during the CVD process. 200 nm thick Ni films were deposited by e-beam evaporation on 4" (100) Si wafers with 300 nm thick thermally grown $SiO_2$. Graphene growth was achieved using a cold-wall CVD system, where the substrate was a suspended platform of highly-doped silicon that was heated resistively. The graphene growth substrates were placed on the heated platform and reached the annealing and growth temperature of 800-900 degrees C. in 10 seconds. Experiments were performed both at low pressure (2 Torr) and atmospheric pressure. In each case, the pressure was kept constant throughout the process. The Ni films were rapidly heated and then annealed in a helium environment at a constant temperature for 5 minutes. Methane or acetylene was used as the carbon source for graphene growth with exposure times ranging from 20 seconds to 2 minutes. At atmospheric pressure, the Ni film delaminated during the growth step, leaving the graphene on the $SiO_2$ surface. The process was terminated by turning off the heater power, leading to rapid cooling of the substrate (e.g., at a rate of about 13 degrees C. per second).

Graphene formed on both the top and bottom of the Ni films under these conditions, as confirmed by Raman spectroscopy. It was found, however, that the adhesion of the Ni to the substrate, and the presence of graphene on the bottom of the Ni and/or remaining on the $SiO_2$ after delamination, depended on the CVD parameters. As a result, and as indicated above, direct transfer of the interfacial graphene layer (IGL) can be controlled either by in situ delamination of the Ni during the carbon exposure step at high temperature, or mechanical delamination of the Ni after cooling and removal of the substrate.

The stress-induced delamination of the weakened films often occurred during the growth phase of the CVD process at atmospheric pressure, depositing the IGL at a steady elevated temperature. Films that were annealed and exposed to the hydrocarbon precursor gas at low pressure remained adhered to the substrate, but could be easily and cleanly removed after cooling, using only Scotch tape. By contrast, analogous experiments using traditional hydrogen annealing conditions did not promote delamination of the Ni or printing of graphene.

AFM characterization of the transferred graphene showed distinct closed wrinkles with heights of about 1 nm and a periodicity of about 50 nm. Similar closed wrinkles were also observed in SEM images of the graphene grown on $Ni/SiO_2/Si$ substrate stack. These closed wrinkle structures mimic the microstructure of the Ni film, suggesting the formation of wrinkles around the Ni grains. The periodic structure of the wrinkles also suggests that the graphene grows outwardly from the Ni grains that are pinned against the $SiO_2$. It is believed that annealing causes local delamination, and that the outward carbon flow at the grain boundary forms graphene on the $SiO_2$. Thermal wrinkles commonly observed in graphene produced by earlier techniques were not readily seen in the graphene directly on the $SiO_2/Si$, although dense line wrinkles are observed on the top graphene layer grown on the delaminated Ni surface. Thermal wrinkling and/or folding of graphene oftentimes is caused by CTE mismatches with the metal catalyst, the polymer, the graphene itself, etc.; the mechanical processes used for lift-off and transfer, chemical degradation; etc. Certain example embodiments surprisingly and unexpectedly through the use of He avoid or significantly reduce the creation of thermal wrinkles in the bottom graphene after removal of the Ni-inclusive metal catalyst layer.

It is noted that graphene has negative thermal expansion of—$8 \times 10^{-6} K^{-1}$ and expands while cooling. On the other hand, both Ni and $SiO_2/Si$ show positive thermal expansion and shrink on cooling from the growth temperature. However, the thermal expansion coefficient of Ni is at least five times larger than the Si and develops higher compressive stress in graphene grown on Ni, leading to the thermal wrinkles. The observation of thermal wrinkling free graphene grown on $SiO_2/Si$ and its sensitivity towards thermally mismatched substrates opens up the possibility of tuning the electronic properties of CVD grown graphene via strain. Such results are readily contrastable with prior approaches of using chemical etching and transference with a polymer support layer, which tend to introduce wrinkles, tears, and doping of the graphene, while also leaving behind undesired polymer residues.

Figure 17:
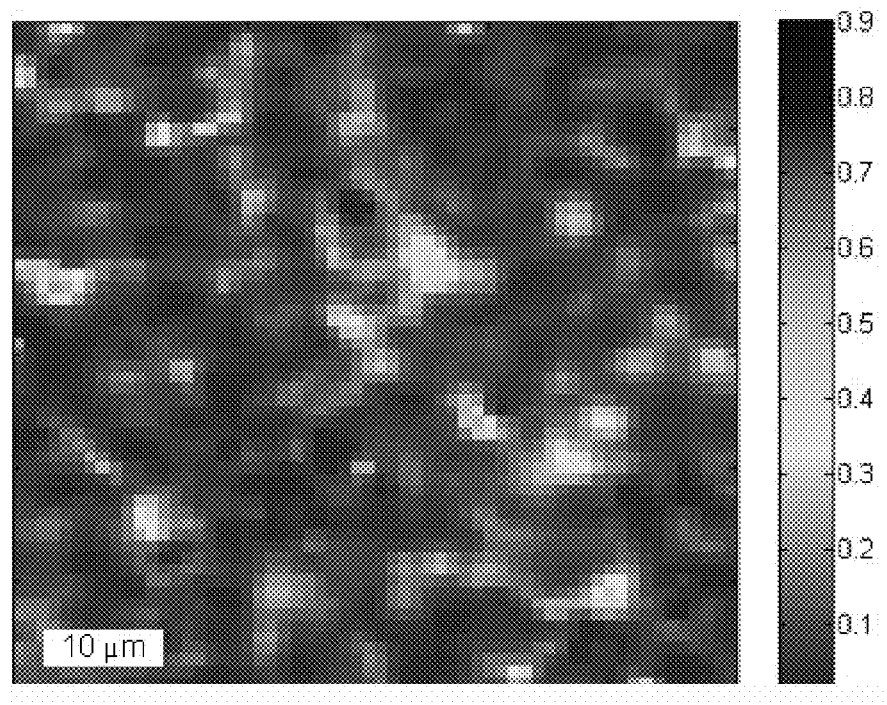
FIG. 17 shows confocal Raman spectroscopy data for a sample made in accordance with certain example embodiments.
Figure 18:
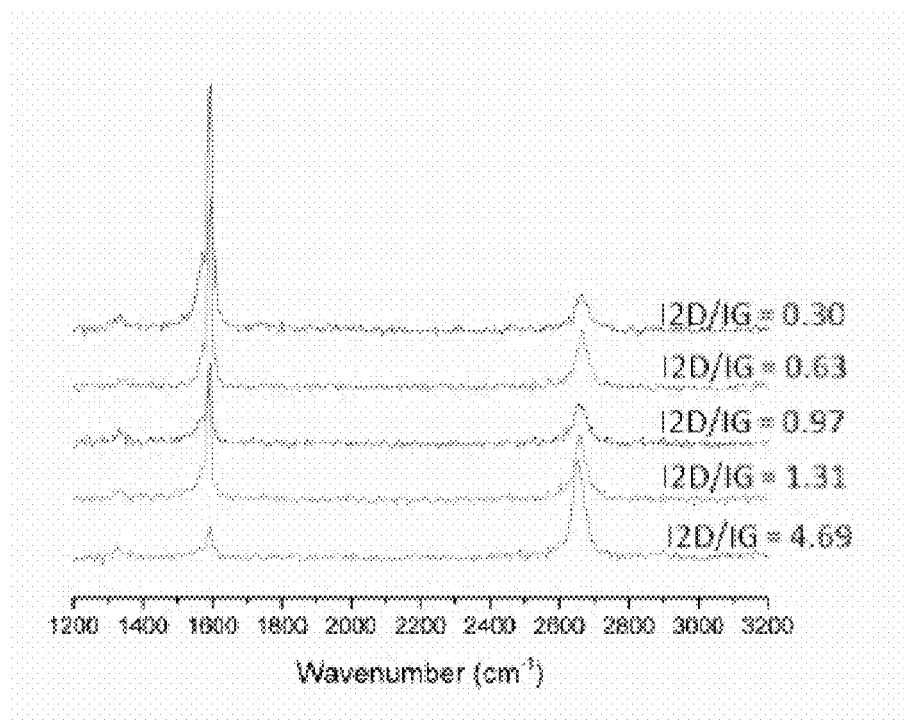
FIG. 18 shows Raman spectra data for transferred graphene grown in accordance with certain example embodiments.
Figure 19:
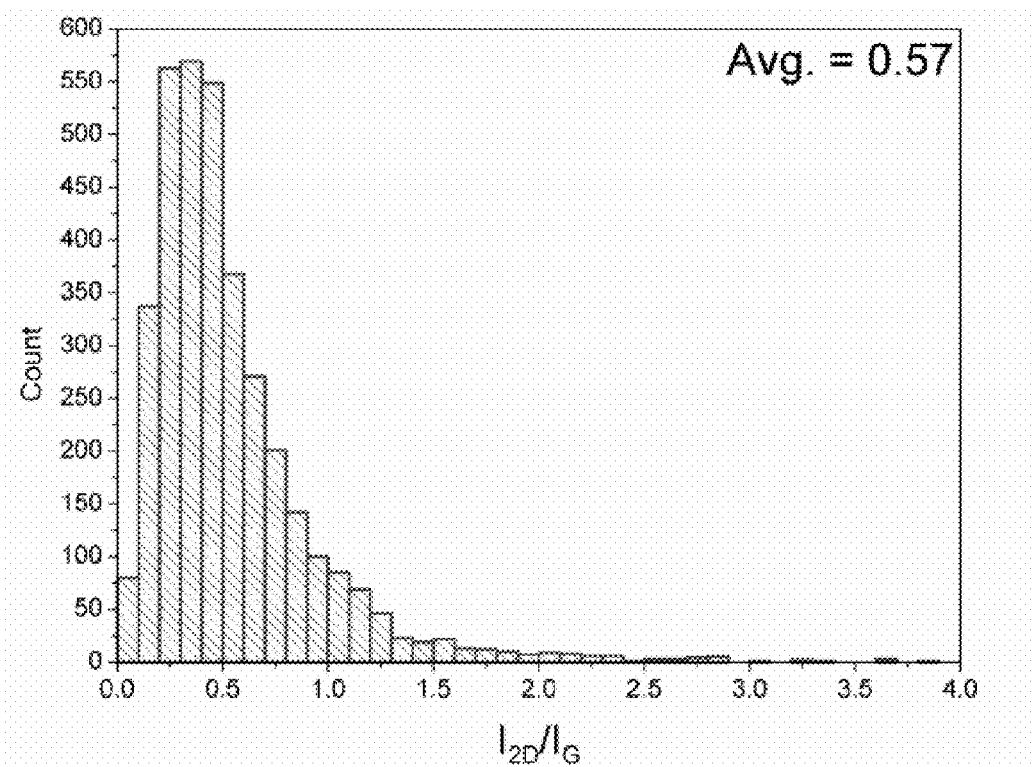
FIGS. 19 and 20 are histograms respectively showing the $I_{2D}/I_G$ and $I_D/I_G$ peak counts for graphene grown on SiO2 in accordance with certain example embodiments.
Figure 20:
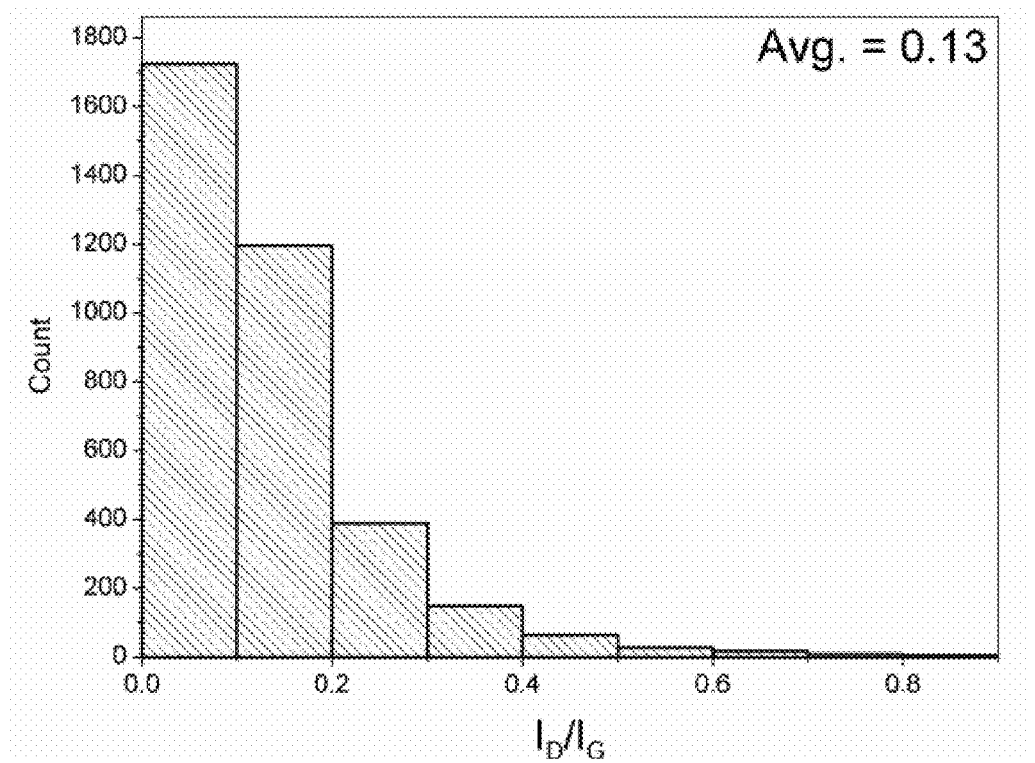

Coverage and quality of the transferred graphene was determined by confocal Raman spectroscopy. See FIG. 17 for a 2D Raman mapping, indicative of high coverage of high quality graphene across the entire substrate. The transferred graphene displayed the most recognized characteristic peaks, with the G band (at about 1590 cm$^{-1}$), the D band (at about 1338 cm$^{-1}$), and the 2-D band (at about 2660 cm$^{-1}$). See FIG. 18 in this regard. 2-D Raman mapping of the IGL showed an average 2-D/G integrated peak ratio ($I_{2D}/I_G$) of about 0.57, and an average D/G integrated peak ratio ($I_D/I_G$) of about 0.13. See FIGS. 19 and 20, respectively. Seventy percent of the mapped area displayed an $I_D/I_G$ ratio less than 0.2, indicating high quality and uniformity of the IGL. The full width at half maximum (FWHM) value of the G and 2-D peaks were found to be about ~26 cm$^{-1}$ and ~40 cm$^{-1}$, respectively. The narrow FWHM of the 2-D peak without the accompanying high $I_{2D}/I_G$ suggests a misaligned orientation between graphene layers. The observed splitting of the G peak is suggestive of strain in the graphene film. Additional overtone and combination mode features are observed including M (1750 cm$^{-1}$) and iTOLA (1950 cm$^{-1}$) combination modes, G*(2450 cm$^{-1}$), G+D (2950 cm$^{-1}$), and 2-D' (3240 cm$^{-1}$).

Figure 21:
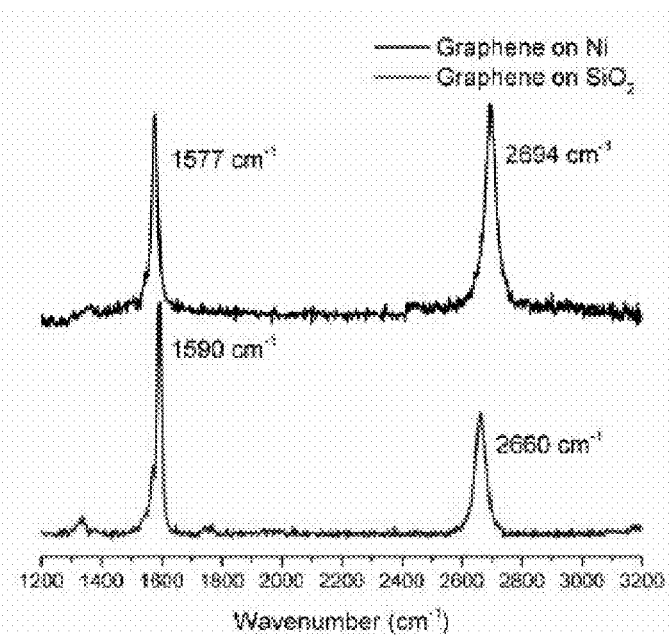
FIG. 21 is a graph of Raman data (spectra and peak position) comparing the top and bottom graphene layers made in accordance with certain example embodiments.

The graphene grown on the exposed side (gas-side) of the delaminated Ni film was characterized as a comparison, and FIG. 21 is a graph of Raman data (spectra and peak position) comparing the top and bottom graphene layers made in accordance with certain example embodiments. The splitting of the G peak was absent, suggesting relaxation of film stress on the graphene-Ni upon delamination. A significant blue shift of the 2-D peak location was observed, accompanied by a red shift of the split G peak. Distance-dependent graphene interactions with the substrate may be responsible for these results. For example, the small wrinkles on the transferred graphene, as shown by AFM, may provide a possible explanation for the observed shifts.

Growth of graphene at the Ni—$SiO_2$ interface was confirmed by cross-sectional TEM imaging. A TEM bright field image of the $Si/SiO_2/Ni$ film stack showed the thicknesses of $SiO_2$ (300 nm) and Ni layers (150 nm) In order to obtain the accurate thickness values and to resolve the interfacial graphene layers, the specimen was tilted to the [011] zone axis of the Si in cross-sectional geometry. A line scan analysis performed perpendicular to the $SiO_2$-graphene interface confirmed the graphene interlayer distance of 0.352 nm.

The thin, electron transparent nature of crystalline graphene was evident from a TEM plan view bright field image, showing the lacy carbon structure beneath the graphene layers. A selected area electron diffraction (SAED) pattern obtained from a graphene flake showed a typical six fold spot pattern with the zone axis of [0001] confirming the single crystalline nature of graphene. The overlapping bilayer or few layer graphene was evident from the frequently observed Moiré fringes shown in a plan view TEM dark field image. The lateral dimensions of graphene were much larger than the grain size of Ni, indicating that the growth of graphene was not impeded at the Ni grain boundaries.

Cross-sectional TEM was employed to confirm the growth of graphene on the Ni—$SiO_2$ interface. A TEM bright field image of the $Si/SiO_2/Ni$ film stack showed the thicknesses of $SiO_2$ (300 nm) and Ni layers (150 nm) The average film thickness of the deposited Ni film reduced from 200 nm to 150 nm, suggesting thin film densification during the post deposition annealing/growth. In order to obtain accurate thickness values and to resolve the interfacial graphene layers, the specimen was tilted to the [011] zone axis of the Si in cross-sectional geometry. Line scan analysis performed perpendicular to the $SiO_2$-graphene interface confirmed the graphene interlayer distance of 0.352 nm.

Figure 22:
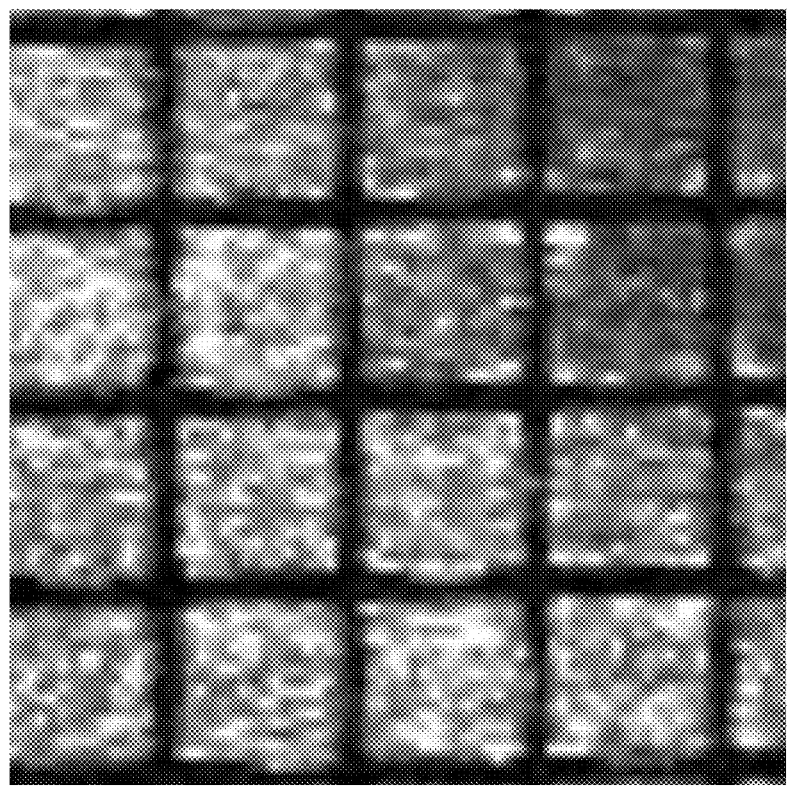
FIG. 22 is an image showing how fine patterning using conventional lithography techniques when graphene is grown in accordance with certain example embodiments.

Transfer of patterned IGL was achieved after analogous delamination of micro-sized Ni features were created using standard lithographic techniques. See FIG. 22. Arrays of precisely positioned IGL of high quality and coverage were confirmed by 2D Raman spectroscopy. The ease of producing scalable and customizable graphene features on desired substrates could potentially be used in a wide variety of device types and applications, e.g., as explained in greater detail below. It will be appreciated that certain example embodiments may involve direct patterning of device and/or other layers, e.g., such that "transfer-free patterning" of graphene becomes possible. It also will be appreciated that certain example embodiments may involve direct patterning of device and/or other layers, e.g., without having to rely on chemical etching (which may degrade materials of potential importance) and/or high temp evaporation processes (which could destroy some substrates, etc.)

It is hypothesized that increasing stress within the nickel film and weakened adhesions causes the progression of the delamination phenomena and transference of graphene to the $SiO_2$—Ni interface. Although numerous stress-inducing pathways may help achieve this result, this study suggests that a helium-inclusive annealing step, rather than a commonly used hydrogen environment, is critical to the stress development that is believed to enable graphene deposition on the $SiO_2$. The delamination occurs for different carbon-containing growth gases (acetylene or methane), and seems to work for a surprisingly and unexpectedly broad window of growth times and gas flow volumes.

The microstructure of the Ni thin film was investigated to understand the effect of annealing conditions on the growth of the Ni and its stress development. Although the microstructure of the Ni film is relevant for understanding the growth of graphene, the related stress engineering also is believed to be critical for promoting the selective delamination of the Ni film enabling the direct growth of graphene on the dielectric substrate. SEM images were obtained for 200 nm thick Ni thin films, before and after annealing at 875 degrees C., with different gas pressures. The untreated Ni film showed nearly equiaxed grains of 30 nm size that underwent slight increases in grain size (to about 45 nm) after annealing in an environment with $H_2$ gas at a pressure of 2 Torr. On the other hand, He annealing showed a larger impact on the microstructure of the Ni thin film. Although the Ni films annealed in an environment with He at a pressure of 2 Torr resulted in larger isolated particles, significant grain growth and densification was observed when Ni films were annealed in He at atmospheric pressure. The average grain size of the Ni film was around 350 nm and showed a dense microstructure with large Ni grains separated from grain boundaries. In addition, SEM images of Ni grains showed porous structures, which are believed to have arisen from the trapped He atom precipitation and bubble formation during the annealing at atmospheric pressure.

To test the hypothesis that the stress within the Ni film caused the delamination and created conditions amendable for graphene formation at the Ni—$SiO_2$ surface, annealing experiments at a growth temperature of 875 degrees C. for various time periods were carried out. Stress development within the nickel film at different stages are very complex but may be broken into the following five categories: stresses due to e-beam evaporation of nickel onto $SiO_2$, stresses due to thermal expansion mismatch between the Ni and the substrate, stresses from helium exposure and accumulation during annealing, microstructural stress arising due to post deposition annealing induced grain growth, and stresses due to the presence of carbon atoms within the Ni lattice during the carbon diffusion process. It is noted that diffusion of carbon into the Ni film also changes the interfacial adhesion energies (e.g., as graphene penetrates the Ni—SiO2 interface), which may influence the Ni-substrate adhesion. See the discussion above for more detail on many of these mechanisms.

In order for delamination to occur, the energy release rate of the system should be greater than the adhesion energy at the Ni—$SiO_2$ interface. The interfacial adhesion energy of Ni to $SiO_2$ is approximately double that of Ni to graphene. It is hypothesized that the Ni film used in the transfer process under increased stress crosses an energy release rate upon formation of graphene, where delamination becomes favorable. To understand the direct transfer IGL to the dielectric $SiO_2$ substrate, various stress development mechanisms, and delamination of Ni film, were investigated in detail.

Stress evolution during nucleation, grain growth, texture development, and plastic flow in thin films received much attention, as they can significantly affect film microstructure and mechanical behavior. There is a general understanding of thin film stress during the growth. For example, thin films grown by islands following the Volmer-Weber mechanism show non-linear stress evolution with alternating compressive and tensile stress dominance at different growth stages. Often, compressive stress is generated during the early stages of nucleation before coalescence, and stress becomes tensile upon the formation of grain boundaries. Further growth into a continuous thin film either relaxes the tensile stress or helps develop compressive stress. Similarly, post-deposition grain growth and microstructural reorientation during annealing also results in continuous stress evolution.

Figure 23:
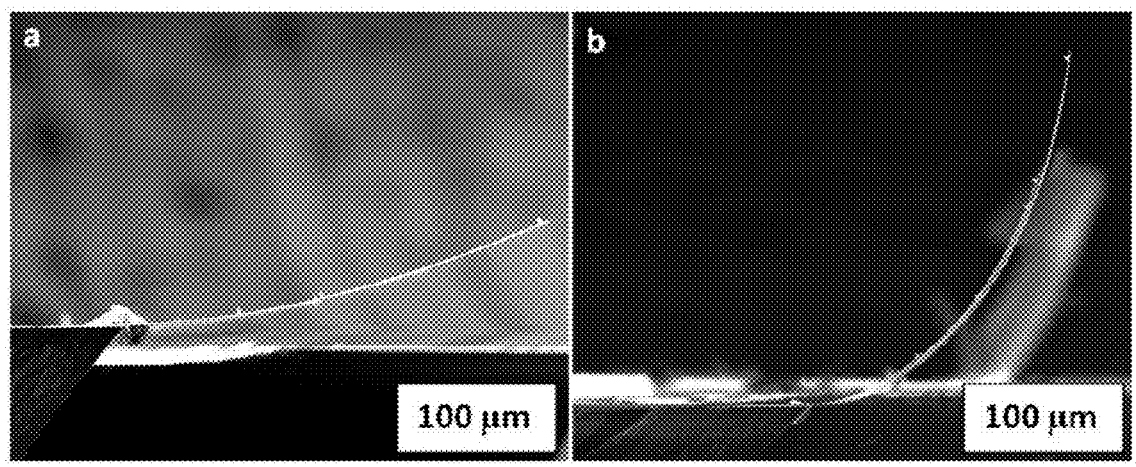
FIG. 23 shows example cantilever images used in studying the stress mechanisms involved in certain example embodiments.

The residual stress of the as-grown Ni thin film was measured herein using cantilever deflection measurement and showed tensile stress values exceeding 2 GPa. E-beam evaporation of Ni onto $Si/SiO_2$ wafers resulted in tensile stresses forming within the deposited films. Average film stresses due to e-beam evaporation were measured by coating about 1 µm thick SiN cantilevers with 200 nm thick nickel films. After coating, the cantilever beams curved upward and their radii of curvature, as well as their exact thicknesses, were used to estimate values of the residual tensile stresses within the films. See FIG. 23 for example cantilever-related images. The high tensile stress (2.08 GPa) observed from the cantilever deflection measurement agrees with the tensile stress estimated considering Ni grain coalescence with an average grain size of 30 nm. Typically, face-centered cubic (fcc) metal films with high melting (type-I) points develop tensile stresses on the order of a few GPa during coalescence, e.g., by replacing the free surfaces with grain boundaries, and this normally is the case for Ni films deposited via E-beam evaporation. However, thermal stress estimation based on the thermal expansion mismatch during heating showed that the initial tensile stress within the Ni film created by E-beam evaporation were largely relaxed during the heating process and developed high compressive stress at the growth temperature of 875 degrees C.

Further evidence of stress-driven transfer is indicated by a splitting of the G-peak of the transferred graphene and observation of closed, periodic wrinkles on the size scale of the Ni grains. This suggests that the graphene film is grown and transferred under stress, and the graphene transfer to the $SiO_2$ becomes preferred due to weakened graphene-Ni adhesion upon coarsening of the film.

It is noted that improved delamination and transfer was observed upon replacing the helium flow with a 95:5 $He/O_2$ flow, e.g., which increase system moisture. This may suggest that water intercalation at the graphene and Ni interface may assist in the transfer of graphene to $SiO_2$. The moisture levels found at atmospheric conditions may contribute to the consistent and repeated in situ delamination.

It may in some cases be possible to further improve upon the quality and/or uniformity of the graphene, e.g., by reaching a larger parameter space Improvements such as engineering larger grain sizes, decoupling of the delamination step from the growth step, increasing growth temperature, managing carbon precipitation, and/or the like, may for example provide greater control over graphene structure and the number of layers deposited.

Example Applications, Extensions, Etc.

Although certain example embodiments have been described in connection with a high temperature and rapid heating process, other approaches may be used in different example embodiments. For instance, the temperature may be lowered significantly if the time is increased. More particularly, it surprisingly and unexpectedly has been found that temperatures as low as about 350 degrees C. can be used to form graphene-inclusive layers, provided that the anneal time is increased. Example temperatures are preferably below Tg (i.e., below about 580 degrees C.), and preferably are at least 350 degrees C., and potentially around 400 degrees C. or 500 degrees C. in some cases. Anneal temperature is inversely related to time, and example anneal times may vary from 10 s-100 s of minutes (and may potentially be several hours, e.g., 1-3 hours), depending on the temperature selected. An example profile involves annealing at 400 degrees C. for about 2 hours, depending for instance on the loading of the carbon in the nickel. It is noted that the temperatures may be increased, potentially above Tg, if sodium blockers or the like are provided as underlayers when glass substrates are used. These temperature ranges advantageously may enable glass to be used as a substrate (e.g., soda lime silica glass, borosilicate glass, etc.), as well as other materials such as plastics and the like.

In certain example embodiments, Raman spectrum analysis may be used to gauge the progress of the graphene formation. More particularly, in certain example embodiments, Raman spectrum analysis may be used to in essence "look through" the substrate if the substrate is transparent and thus may provide end-point detection for when graphene is formed (e.g., based on the G, D, and/or 2D peaks characteristic of graphene).

In view of the foregoing, it will be appreciated that certain example embodiments enable the growth of graphene directly onto glass, e.g., in a manner that can be either blanketed or applied as a patterned film. The patterned growth may be achieved by patterning the Ni. Faithful patterns of the graphene are deposited ultimately onto the glass. The rapid thermal anneal CVD process described herein is believed to be scalable in at least the sense that the heating technique can be performed via resistive, inductive, and/or laser heating of the surface of the catalyst.

It will be appreciated that the example techniques set forth herein may be used on any suitable substrate including, for example, glass substrates, silicon wafers, etc. In some cases, graphene-inclusive films can be formed directly on the surface of a semiconductor layer or the like, e.g., to build field effect devices. In this vein, graphene-inclusive photovoltaic devices can be provided. If the sheet resistance is sufficiently low, the graphene can be used as a transparent conductive coating (TCC) in a photovoltaic device, display device, touch panel device, and/or the like.

In a similar vein, it is possible to use graphene-inclusive film in window applications (e.g., commercial monolithic, laminated, insulated glass (IG), vacuum insulated glass (VIG), and/or other units). For instance, in certain example embodiments, graphene-inclusive films can be provided over functional infrared (IR) reflecting and/or other layers. Low-emissivity (low-E) coatings, for example, typically include an IR reflecting layer (e.g., of or including Ag or the like) sandwiched between dielectric layers, and a graphene-inclusive thin film may help to protect the IR reflecting layer. The protection may be mechanical protection, protection from corrosion, etc.

Figure 16:
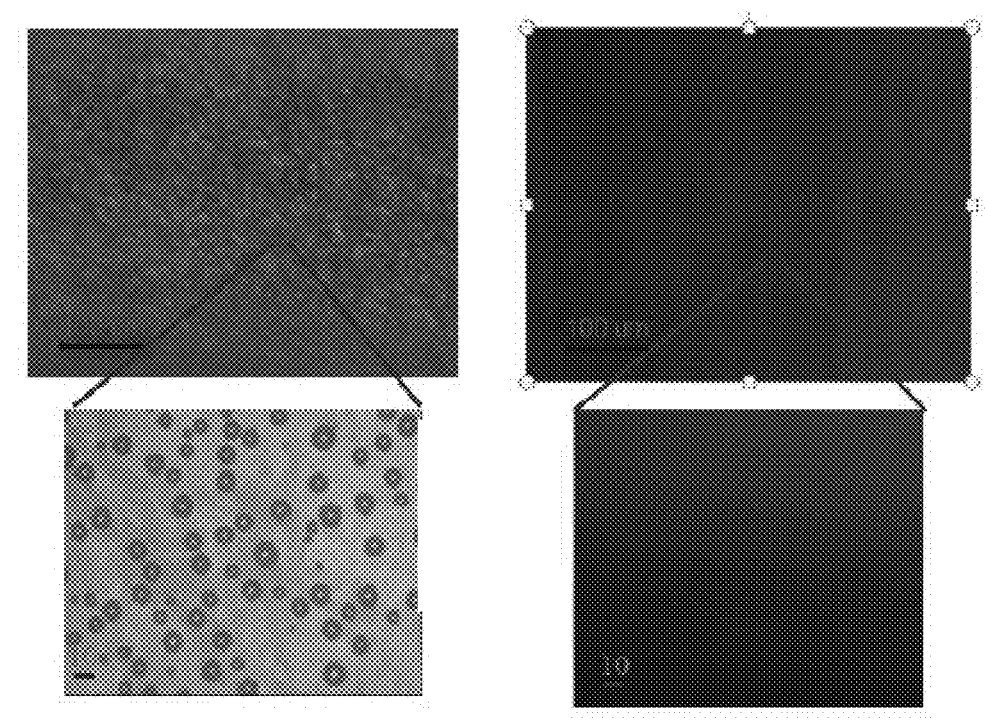
FIG. 16 shows surface micrographs of Ni/Ag/ZnO coatings (left) and Graphene/Ni/Ag/ZnO coatings (right) formed in accordance with certain example embodiments.

In this latter regard, it is noted that graphene may have some metal-protection properties. For example, graphene may help protect against moisture encroachment, etc., e.g., in high-humidity areas and thus provide corrosion resistance. It thus may be desirable to grow graphene directly on a metal or metallic coating, e.g., such as for example a low-emissivity or other coating. Indeed, graphene can be grown directly on a layer stack comprising Ni/Ag/ZnO. The graphene grows at the surface as well as the interface, and was found to be no more than 4 layers in some samples. Example low-E coatings are set forth in U.S. Pat. Nos. 7,998,320; 7,771,830; 7,198,851; 7,189,458; 7,056,588; and 6,887,575; and/or U.S. Publication Nos. 2012/0219821; 2012/0164420; and 2009/0115922, the entire contents of each of which are hereby incorporated by reference. In certain example embodiments, layers of or including NiCr may be replaced at least in part with graphene. For instance, a layer comprising Ni may be deposited and a layer of or including graphene may be formed thereon and/or thereunder using the example techniques set forth herein. Such layers may be provided on one or both sides of an IR reflecting layer such as, for example, a layer comprising Ag, and such layer(s) may be useful in protection against corrosion and in extending the life of the low-E coating. Advantageously, the incorporation of a graphene-based layer will not have much if any effect on the optics of the layer stack because it is so thin. FIG. 16 shows surface micrographs of Ni/Ag/ZnO coatings (left) and Graphene/Ni/Ag/ZnO coatings (right) formed in accordance with certain example embodiments. It can be seen that there is virtually no corrosion shown in connection with the graphene-inclusive sample, even after 10 days exposure to a high humidity simulator (e.g., 85% relative humidity, potentially at 85 degrees C.).

As indicated above, it might be desirable to provide an intermediate product that includes, for example, graphene growth on top of the Ni and C within the bulk of the Ni (e.g., at or in the grain boundaries), e.g., if heating is stopped before a graphene layer is fully formed on the substrate's surface below the Ni. A variant of this approach may involve implanting C in the Ni using, for example, a linear ion beam operating at a high power. For instance, an ion beam operating at 5,000-20,000 eV, more preferably 10,000-20,000 eV, may be used for implantation purposes. Example ion sources are disclosed, for example, in U.S. Pat. Nos. 7,872,422; 7,488,951; 7,030,390; 6,988,463; 6,987,364; 6,815,690; 6,812,648; 6,359,388; and Re. 38,358; the disclosures of each of which are hereby incorporated herein by reference. As above, this intermediate product may be shipped to a potential fabricator, who may start a fast or slow anneal to fully form the graphene layer between the Ni and the underling substrate.

A sample was successfully made. A 100 nm thick Ni-metal catalyst layer was disposed on a glass substrate. The Ni-metal catalyst layer was patterned into a 0.4 cm wide by 2.5 cm long rectangle. The glass substrate with the patterned Ni-metal catalyst layer was exposed to $C_2H_2$ gas for three minutes at 50 mTorr at a temperature of 700 degrees C. Interfacial graphene growth was accomplished at 400 degrees C. in an apparatus of the type shown in FIG. 1. Indium contacts were provided to measure resistivity, and this un-optimized process was found to provide a sheet resistance of 295 ohms/square. The process could be improved (e.g., by tuning exposure gasses, partial pressures, times, temperatures, etc.) to yield further reductions in sheet resistance. It also will be appreciated that the installation of a Raman spectrometer on the reactor could be used to improve sheet resistance, etc., e.g., by monitoring the graphene formation, etc.

It will be appreciated that although certain example embodiments have been described in relation to acetylene, other hydrocarbon gasses may be used together with or in place of acetylene in different example embodiments. It also will be appreciated that the example techniques disclosed herein may be expanded further in some cases, e.g., so that layers of material can be grown by simply changing the gas precursor. For instance, by changing the gas precursor to silanes (or germanes), silicene layers can be grown on the graphene. The sequence can be performed in a regular manner, e.g., so as to grow alternating layers of or including graphene-silicene-graphene-silicene, etc., so as to engineer new materials with desired, and potentially novel, properties.

Although certain example embodiments have been described as using He as a mechanism for introducing stress and facilitating the removal of metal catalyst layer, it will be appreciated that other stress/strain inducing mechanisms may be used in different example embodiments. For instance, other gasses may be used in place of or in addition to He gas. It is noted, however, that the combination of He gas with a Ni metal catalyst layer have been found to perform very well in this regard. It also is noted that the presence of water vapor may play a role in facilitating the debonding in certain example embodiments.

The substrates described herein may be heat treated (e.g., heat strengthened and/or thermally tempered), and/or chemically tempered, in certain example embodiments. The terms "heat treatment" and "heat treating" as used herein mean heating the article to a temperature sufficient to achieve thermal tempering and/or heat strengthening of the glass inclusive article. This definition includes, for example, heating a coated article in an oven or furnace at a temperature of at least about 550 degrees C., more preferably at least about 580 degrees C., more preferably at least about 600 degrees C., more preferably at least about 620 degrees C., and most preferably at least about 650 degrees C. for a sufficient period to allow tempering and/or heat strengthening. This may be for at least about two minutes, or up to about 10 minutes, in certain example embodiments.

Although an element, layer, layer system, coating, or the like, may be said to be "on" or "supported by" a substrate, layer, layer system, coating, or the like, other layers and/or materials may be provided therebetween.

In certain example embodiments, a method of making a coated article comprising a graphene-inclusive film on a substrate is provided. A metal-inclusive catalyst layer is disposed on the substrate. The substrate with the metal-inclusive catalyst layer thereon is heated. The substrate with the catalyst layer thereon is exposed to a carbon-inclusive precursor gas. The substrate with the catalyst layer thereon is annealed at a temperature of 350-600 degrees C. for a time period of 10 minutes to 3 hours. Graphene is formed and/or allowed to form both over and contacting the metal-inclusive catalyst layer, and between the substrate and the metal-inclusive catalyst layer, in making the coated article.

In addition to the features of the preceding paragraph, in certain example embodiments, the catalyst layer may comprise or consist essentially of Ni.

In addition to the features of either of the two preceding paragraphs, in certain example embodiments, the catalyst layer may comprise a-Ni, a-Ni:P, c-Ni, and/or the like.

In addition to the features of any of the three preceding paragraphs, in certain example embodiments, the substrate with the catalyst layer thereon may be exposed to at least a strain-inducing gas and/or the carbon-inclusive precursor gas, in one or more stages.

In addition to the features of the preceding paragraph, in certain example embodiments, a first stage may comprise providing at least helium gas at a first flow rate, and a second stage may comprise providing at least helium gas at a second flow rate and acetylene gas at a third flow rate, with the first and second stages being provided in that order.

In addition to the features of the preceding paragraph, in certain example embodiments, the first flow rate may be greater than the second and third flow rates, and the second flow rate may be lower than the third flow rate.

In addition to the features of either of the two preceding paragraphs, in certain example embodiments, no or virtually no acetylene may be provided in the first stage.

In addition to the features of any of the three preceding paragraphs, in certain example embodiments, a third stage may be provided following the second stage, with the third stage providing virtually no helium and/or acetylene.

In addition to the features of the preceding paragraph, in certain example embodiments, the temperature may be significantly reduced over the course of the third stage.

In addition to the features of the paragraph that appears six paragraphs prior to this paragraph, in certain example embodiments, a first stage may comprise providing at least the strain-inducing gas in order to induce strain in the catalyst layer, and a second stage may comprise providing at least the strain-inducing gas at a second flow rate and the carbon-inclusive precursor gas at a third flow rate, with the first and second stages being provided in that order.

In addition to the features of the preceding paragraph, in certain example embodiments, the first flow rate may be greater than the second and third flow rates, and the second flow rate may be lower than the third flow rate.

In addition to the features of either of the two preceding paragraphs, in certain example embodiments, no or virtually no carbon-inclusive precursor gas may be provided in the first stage.

In addition to the features of any of the three preceding paragraphs, in certain example embodiments, a third stage may be provided following the second stage, with the third stage providing virtually no strain-inducing gas and/or carbon-inclusive precursor gas, and with the temperature being significantly reduced during the third stage.

In addition to the features of any of the 13 preceding paragraphs, in certain example embodiments, the metal-inclusive catalyst layer may have a smoothness on the order of the smoothness of glass.

In addition to the features of any of the 14 preceding paragraphs, in certain example embodiments, the metal-inclusive catalyst layer may have a smoothness that is at least as smooth of its underlying substrate.

In addition to the features of any of the 15 preceding paragraphs, in certain example embodiments, the substrate may be a glass substrate.

In addition to the features of any of the 16 preceding paragraphs, in certain example embodiments, the annealing may be performed in the presence of He in order to induce strain in the metal-inclusive catalyst layer.

In addition to the features of any of the 17 preceding paragraphs, in certain example embodiments, the metal-inclusive catalyst layer and the graphene formed thereon may be separated from the underlying graphene and the substrate by inducing excess strain in the metal-inclusive catalyst layer.

In addition to the features of any of the 18 preceding paragraphs, in certain example embodiments, the substrate with the graphene thereon may be cooled and/or allowed to cool, and an adhesive-backed material may be applied to the uppermost graphene.

In addition to the features of the preceding paragraph, in certain example embodiments, the metal-inclusive catalyst layer and the graphene formed thereon may be separated from the underlying graphene and the substrate by removing the adhesive-backed material.

In certain example embodiments, a method of making a coated article comprising a graphene-inclusive film on a substrate is provided. A metal-inclusive catalyst layer is disposed on the substrate, with the metal-inclusive catalyst layer being substantially metallic and comprising Ni. The substrate with the metal-inclusive catalyst layer thereon is heated. The substrate with the catalyst layer thereon is exposed to a carbon-inclusive precursor gas. The substrate with the catalyst layer thereon is annealed at a temperature of 350-600 degrees C. for a time period of 10s or 100s of minutes. Graphene is formed and/or allowed to form both over and contacting the metal-inclusive catalyst layer, and between the substrate and the metal-inclusive catalyst layer. The substrate with the graphene thereon is cooled and/or allowed to cool. After the substrate with the graphene thereon has cooled, (a) the metal-inclusive catalyst layer and the graphene formed thereon are separated from the underlying graphene and the substrate by inducing excess strain in the metal-inclusive catalyst layer, and/or (b) an adhesive-backed material is applied to the uppermost graphene.

In addition to the features of the preceding paragraph, in certain example embodiments, an adhesive-backed material may be applied to the uppermost graphene and the metal-inclusive catalyst layer and the graphene formed thereon may be separated from the underlying graphene and the substrate by removing the adhesive-backed material.

In certain example embodiments, a method of making an electronic device and/or window is provided. A coated article is provided in accordance with the method of any of the 22 preceding paragraphs. The coated article may be built into the electronic device, which may be a display device, photovoltaic device, or touch screen device. Alternatively, or in addition, the coated article may be used as a window or a part of a window unit, etc.

In addition to the features of the preceding paragraph, in certain example embodiments, an infrared (IR) reflecting layer may be sandwiched between at least first and second dielectric layers and disposed on the substrate such that the catalyst layer is provided over at least the IR reflecting layer.

In addition to the features of the preceding paragraph, in certain example embodiments, the graphene-inclusive film may be formed over the IR reflecting layer and optionally may comprise Ag.

In certain example embodiments, a method of making a coated article comprising a graphene-inclusive film on a substrate is provided. A metal-inclusive catalyst layer is disposed on the substrate. The substrate with the catalyst layer thereon is exposed to a carbon-inclusive precursor gas. The substrate with the catalyst layer thereon is annealed at a temperature of 350-600 degrees C. for a time period of 10s or 100s of minutes. Graphene is formed and/or allowed to form both over and contacting the catalyst layer, and between the substrate and the catalyst layer. The catalyst layer and the graphene on the catalyst layer are mechanically delaminated from the substrate, so that the graphene formed between the substrate and the catalyst layer remains on the substrate following the mechanical delaminating, in making the coated article. The catalyst layer is engineered to have a stress that facilitates the mechanical delaminating.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a coated article comprising a graphene-inclusive film on a substrate, the method comprising:
    disposing a metal-inclusive catalyst layer on the substrate;
    heating the substrate with the metal-inclusive catalyst layer thereon;
    exposing the substrate with the catalyst layer thereon to a carbon-inclusive precursor gas;
    annealing the substrate with the catalyst layer thereon at a temperature of 350-600 degrees C. for a time period of 10 minutes to 3 hours; and
    forming graphene over and contacting the metal-inclusive catalyst layer, and between the substrate and the metal-inclusive catalyst layer, in making the coated article.

2. The method of claim 1, wherein the catalyst layer comprises Ni.

3. The method of claim 1, wherein the catalyst layer is substantially metallic and consists essentially of Ni.

4. The method of claim 1, wherein the catalyst layer comprises a-Ni:P.

5. The method of claim 1, wherein the catalyst layer comprises c-Ni.

6. The method of claim 1, wherein the substrate with the catalyst layer thereon is exposed to at least a strain-inducing gas, the carbon-inclusive precursor gas, or both, in one or more stages.

7. The method of claim 6, wherein a first stage comprises providing at least helium gas at a first flow rate, and a second stage comprises providing at least helium gas at a second flow rate and acetylene gas at a third flow rate, the first and second stages being provided in that order.

8. The method of claim 7, wherein the first flow rate is greater than the second and third flow rates, and the second flow rate is lower than the third flow rate.

9. The method of claim 7, wherein no or virtually no acetylene is provided in the first stage.

10. The method of claim 7, wherein a third stage is provided following the second stage, the third stage providing no helium and no acetylene.

11. The method of claim 10, wherein the temperature is significantly reduced over the course of the third stage.

12. The method of claim 6, wherein a first stage comprises providing at least the strain-inducing gas in order to induce strain in the catalyst layer, and a second stage comprises providing at least the strain-inducing gas at a second flow rate and the carbon-inclusive precursor gas at a third flow rate, the first and second stages being provided in that order.

13. The method of claim 12, wherein the first flow rate is greater than the second and third flow rates, and the second flow rate is lower than the third flow rate.

14. The method of claim 12, wherein no carbon-inclusive precursor gas is provided in the first stage.

15. The method of claim 12, wherein a third stage is provided following the second stage, the third stage providing no strain-inducing gas and no carbon-inclusive precursor gas, the temperature being significantly reduced during the third stage.

16. The method of claim 1, wherein the metal-inclusive catalyst layer has a smoothness on the order of the smoothness of glass.

17. The method of claim 1, wherein the metal-inclusive catalyst layer has a smoothness that is at least as smooth as the substrate.

18. The method of claim 17, wherein the substrate is a glass substrate.

19. The method of claim 1, wherein the annealing is performed in the presence of He in order to induce strain in the metal-inclusive catalyst layer.

20. The method of claim 1, further comprising separating the metal-inclusive catalyst layer and the graphene formed thereon from the underlying graphene and the substrate by inducing excess strain in the metal-inclusive catalyst layer.

21. The method of claim 1, further comprising:
cooling the substrate with the graphene thereon; and
applying an adhesive-backed material to the uppermost graphene.

22. The method of claim 21, further comprising separating the metal-inclusive catalyst layer and the graphene formed thereon from the underlying graphene and the substrate by removing the adhesive-backed material.

23. A method of making a coated article comprising a graphene-inclusive film on a substrate, the method comprising:
disposing a metal-inclusive catalyst layer on the substrate, the metal-inclusive catalyst layer being substantially metallic and comprising Ni;
heating the substrate with the metal-inclusive catalyst layer thereon;
exposing the substrate with the catalyst layer thereon to a carbon-inclusive precursor gas;
annealing the substrate with the catalyst layer thereon at a temperature of 350-600 degrees C. for a time period of 10s or 100s of minutes; and
forming graphene over and contacting the metal-inclusive catalyst layer, and between the substrate and the metal-inclusive catalyst layer;
cooling the substrate with the graphene thereon; and
after the substrate with the graphene thereon has cooled, (a) separating the metal-inclusive catalyst layer and the graphene formed thereon from the underlying graphene and the substrate by inducing excess strain in the metal-inclusive catalyst layer, (b) applying an adhesive-backed material to the uppermost graphene, or (c) both.

24. The method of claim 23, wherein an adhesive-backed material is applied to the uppermost graphene and further comprising separating the metal-inclusive catalyst layer and the graphene formed thereon from the underlying graphene and the substrate by removing the adhesive-backed material.

25. A method of making an electronic device, the method comprising:
providing a coated article in accordance with the method of claim 22; and
building the coated article into the device.

26. The method of claim 25, wherein the electronic device is a display device, photovoltaic device, or touch screen device.

27. A method of making a window, the method comprising:
providing a coated article in accordance with the method of claim 1.

28. The method of claim 27, wherein an infrared (IR) reflecting layer sandwiched between at least first and second dielectric layers is disposed on the substrate such that the catalyst layer is provided over at least the IR reflecting layer.

29. The method of claim 28, wherein the graphene-inclusive film is formed over the IR reflecting layer.

30. The method of claim 28, wherein the IR reflecting layer comprises Ag.

31. A method of making a coated article comprising a graphene-inclusive film on a substrate, the method comprising:
disposing a metal-inclusive catalyst layer on the substrate;
exposing the substrate with the catalyst layer thereon to a carbon-inclusive precursor gas;
annealing the substrate with the catalyst layer thereon at a temperature of 350-600 degrees C. for a time period of 10s or 100s of minutes; and
forming graphene over and contacting the catalyst layer, and between the substrate and the catalyst layer; and
mechanically delaminating from the substrate the catalyst layer and the graphene on the catalyst layer, so that the graphene formed between the substrate and the catalyst layer remains on the substrate following the mechanical delaminating, in making the coated article,
wherein the catalyst layer is engineered to have a stress that facilitates the mechanical delaminating.

* * * * *